United States Patent
Ishida et al.

(10) Patent No.: US 6,828,815 B2
(45) Date of Patent: Dec. 7, 2004

(54) METHOD AND APPARATUS FOR DEFECT ANALYSIS OF SEMICONDUCTOR INTEGRATED CIRCUIT

(75) Inventors: Masahiro Ishida, Tokyo (JP); Takahiro Yamaguchi, Tokyo (JP); Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/779,905

(22) Filed: Feb. 17, 2004

(65) Prior Publication Data

US 2004/0160240 A1 Aug. 19, 2004

Related U.S. Application Data

(62) Division of application No. 09/980,891, filed on Dec. 3, 2001, now Pat. No. 6,801,049, which is a continuation of application No. PCT/JP01/02910, filed on Apr. 4, 2001.

(30) Foreign Application Priority Data

Apr. 4, 2000  (JP) ........................................ 2000-101867

(51) Int. Cl.[7] .............................................. G01R 31/26
(52) U.S. Cl. ...................... 324/765; 324/763; 324/500
(58) Field of Search ............................. 324/765, 158.1, 324/522, 531, 759, 763, 764, 500, 509, 512, 508; 714/738; 371/27

(56) References Cited

U.S. PATENT DOCUMENTS 5,506,539 A * 4/1996 Kelly et al. .................. 327/379
5,790,565 A    8/1998 Sakaguchi
5,943,346 A * 8/1999 Sanada ........................ 714/738

FOREIGN PATENT DOCUMENTS

| DE | 196 09 085 A1 | 9/1996 |
| DE | 196 26 103 A1 | 1/1997 |
| JP | 8-201486 | 8/1996 |
| JP | 10-239394 | 9/1998 |

OTHER PUBLICATIONS

German Office Action dated Jan. 23, 2004 (7 pgs.).
Patent Abstracts of Japan, Publication No. 10239394A dated Sep. 11, 1998, 1 pg.
Patent Abstracts of Japan, Publication No. 08201486A dated Aug. 9, 1996, 1 pg.

* cited by examiner

*Primary Examiner*—David Zarneke
*Assistant Examiner*—Trung Q. Nguyen
(74) *Attorney, Agent, or Firm*—Osha & May L.L.P.

(57) ABSTRACT

A fault analysis method and apparatus which is able to improve the reliability of fault analysis of semiconductor integrated circuit. In case of supplying a test pattern sequence having a plurality of test patterns to the semiconductor IC, an analysis point whose electric potential changes according to the change of supplied test pattern is placed corresponding to the test pattern sequence. Then, a transient power supply current generated on the semiconductor IC according to the change of the test pattern is measured and determined whether the measured transient power supply current is abnormal or not. A defection point is presumed based on the test pattern sequence where the transient power supply current is abnormal, and the analysis point placed corresponding to the test pattern sequence.

3 Claims, 38 Drawing Sheets

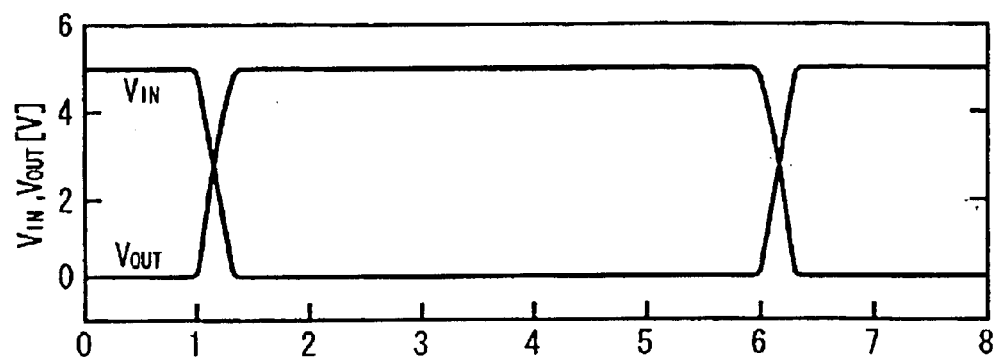
FIG. 1A
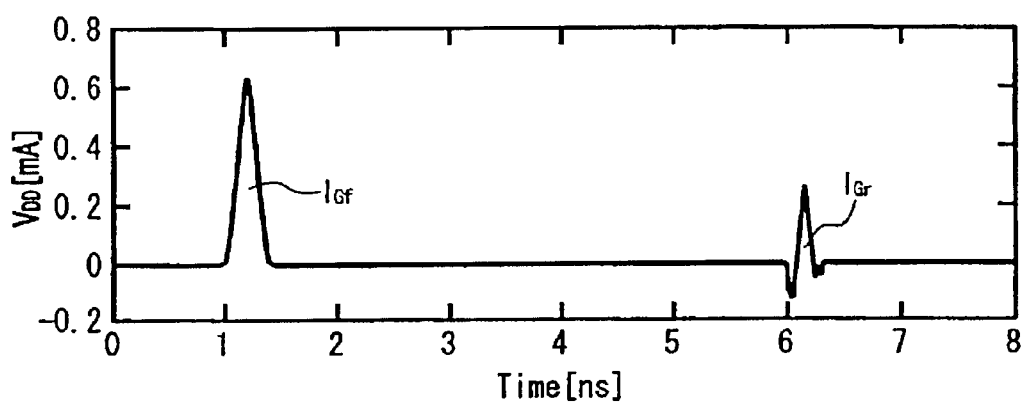
FIG. 1B
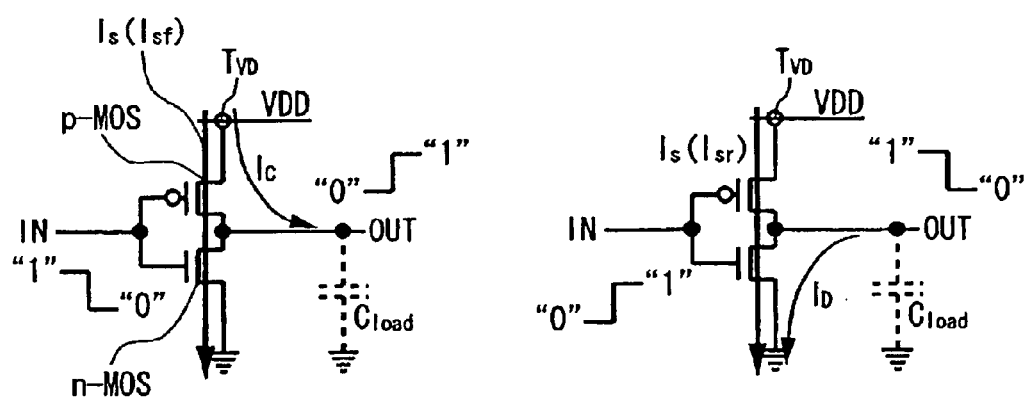
FIG. 1C
FIG. 1D

NO DEFECT: $i_{DDT}(T' + \tau_0) \leq I'$
DEFECT IS PRESENT: $i_{DDT}(T' + \tau_0) > I'$ FIG. 9A
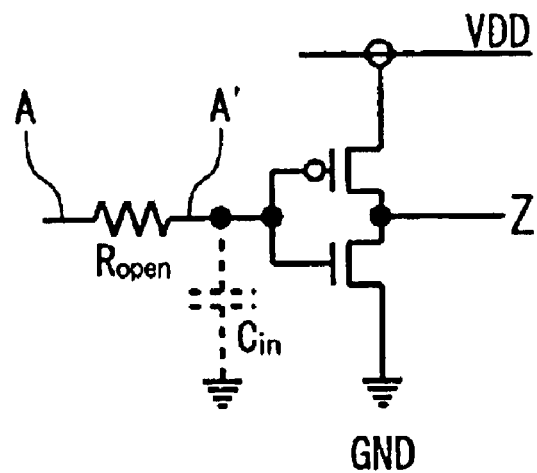
FIG. 9B
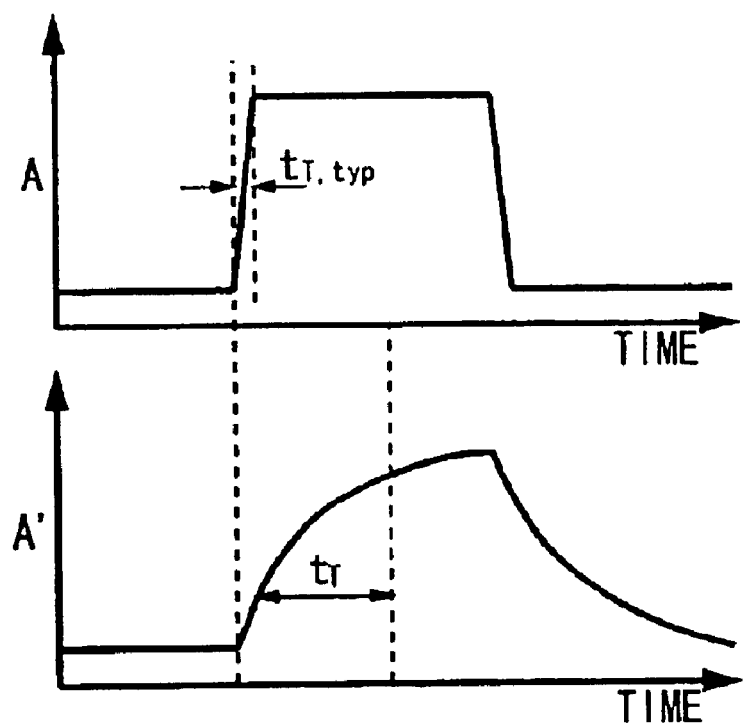
FIG. 9C

| TEST PATTERN SEQUENCE ID NO. | INPUT TERMINAL | | | INTERNAL NODE | | | OUTPUT TERMINAL | | DETECTABLE FAULTY GATE |
|---|---|---|---|---|---|---|---|---|---|
| | I1 | I2 | I3 | N1 | N2 | N3 | O1 | O2 | |
| T1 | 0 | 0 | R | 1 | 1 | 0 | 1 | F | G5 |
| T2 | 0 | 1 | R | 1 | F | R | F | F | G2, G3, G4, G5 |
| T3 | 1 | 0 | R | 0 | 1 | 1 | 0 | 0 | — |
| T4 | 1 | 1 | R | 0 | F | 1 | 0 | 0 | G2 |
| T5 | 0 | R | 0 | 1 | 1 | 0 | 1 | 1 | — |
| T6 | 0 | R | 1 | 1 | F | R | F | 0 | G2, G3, G4 |
| T7 | 1 | R | 0 | 0 | 1 | 1 | 0 | 0 | — |
| T8 | 1 | R | 1 | 0 | F | 1 | 0 | 0 | G2 |
| T9 | R | 0 | 0 | F | 1 | R | F | F | G1, G3, G4, G5 |
| T10 | R | 0 | 1 | F | 1 | R | F | 0 | G1, G3, G4 |
| T11 | R | 1 | 0 | F | 1 | R | F | F | G1, G3, G4, G5 |
| T12 | R | 1 | 1 | F | 0 | 1 | 0 | 0 | G1 |
| ⋮ | ⋮ | ⋮ | ⋮ | ⋮ | ⋮ | ⋮ | ⋮ | ⋮ | ⋮ |

FIG. 15

| TEST PATTERN SEQUENCE ID NO. | INPUT TERMINAL | | | INTERNAL SIGNAL LINE | | | | | | | | | | | | OUTPUT TERMINAL | | DETECTABLE DEFECTIVE INTERNAL SIGNAL LINE |
|---|---|---|---|---|---|---|---|---|---|---|---|---|---|---|---|---|---|---|
| | I1 | I2 | I3 | 1 | 2 | 3 | 4 | 5 | 6 | 7 | 8 | 9 | 10 | 11 | 12 | O1 | O2 | |
| T1 | 0 | 0 | R | 0 | 0 | R | R | R | 1 | 1 | 1 | 1 | 1 | 1 | F | 1 | F | L3, L5, L12 |
| T2 | 0 | 1 | R | 0 | 1 | R | R | R | 1 | F | F | F | F | F | F | F | F | L3, L4, L5, L7, L8, L9, L10, L11, L12 |
| T3 | 1 | 0 | R | 1 | 0 | R | R | R | 0 | 1 | 0 | 0 | 0 | 0 | 0 | 0 | 0 | — |
| T4 | 1 | 1 | R | 1 | 1 | R | R | R | 0 | F | 0 | 0 | 0 | 0 | 0 | 0 | 0 | L3, L4 |
| T5 | 0 | R | 0 | 0 | R | 0 | 0 | 0 | 1 | 1 | 1 | 1 | 1 | 1 | F | 1 | 1 | — |
| T6 | 0 | R | 1 | 0 | R | 1 | 1 | 1 | 1 | F | F | 0 | 0 | 0 | 0 | F | 0 | L2, L7, L8, L9, L11 |
| T7 | 1 | R | 0 | 1 | R | 0 | 0 | 0 | 0 | 1 | 0 | 0 | 0 | 0 | 0 | 0 | 0 | — |
| T8 | 1 | R | 1 | 1 | R | 1 | 1 | 1 | 0 | F | 0 | 0 | 0 | 0 | 0 | 0 | 0 | L2 |
| T9 | R | 0 | 0 | R | 0 | 0 | 0 | 0 | F | 1 | F | F | F | F | F | F | F | L1, L6, L8, L9, L10, L11 |
| T10 | R | 0 | 1 | R | 0 | 1 | 1 | 1 | F | 1 | F | F | F | F | F | F | 0 | L1, L6, L8, L9, L11 |
| T11 | R | 1 | 0 | R | 1 | 0 | 0 | 0 | F | 1 | F | F | F | F | F | F | F | L1, L6, L8, L9, L10, L11, L12 |
| T12 | R | 1 | 1 | R | 1 | 1 | 1 | 1 | F | 0 | 0 | 0 | 0 | 0 | 0 | 0 | 0 | L1 |
| ... | ... | ... | ... | ... | ... | ... | ... | ... | ... | ... | ... | ... | ... | ... | ... | ... | ... | ... |

*FIG. 17*

| TEST PATTERN SEQUENCE ID NO. | INPUT SIGNAL | | | INTERNAL NODE | | | OUTPUT TERMINAL | | DETECTABLE FAULTY PATH |
|---|---|---|---|---|---|---|---|---|---|
| | I1 | I2 | I3 | N1 | N2 | N3 | O1 | O2 | |
| T1 | 0 | 0 | R | 1 | 1 | 0 | 1 | F | ⟨I3, O2⟩ |
| T2 | 0 | 1 | R | 1 | F | R | F | F | ⟨I3, N2, N3, O1⟩<br>⟨I3, N2, N3, O2⟩ |
| T3 | 1 | 0 | R | 0 | 1 | 1 | 0 | 0 | — |
| T4 | 0 | 1 | R | 0 | F | 1 | 0 | 0 | — |
| T5 | 0 | R | 0 | 1 | 1 | 0 | 1 | 1 | — |
| T6 | 0 | R | 1 | 1 | F | R | F | 0 | ⟨I2, N2, N3, O1⟩ |
| T7 | 1 | R | 0 | 0 | 1 | 1 | 0 | 0 | — |
| T8 | 1 | R | 1 | 0 | F | 1 | 0 | 0 | — |
| T9 | R | 0 | 0 | F | 1 | R | F | F | ⟨I1, N1, N3, O1⟩<br>⟨I1, N1, N3, O2⟩ |
| T10 | R | 0 | 1 | F | 1 | R | F | 0 | ⟨I1, N1, N3, O1⟩ |
| T11 | R | 1 | 0 | F | 1 | R | F | F | ⟨I1, N1, N3, O1⟩<br>⟨I1, N1, N3, O2⟩ |
| T12 | R | 1 | 1 | F | 0 | 1 | 0 | 0 | — |
| ⋮ | ⋮ | ⋮ | ⋮ | ⋮ | ⋮ | ⋮ | ⋮ | ⋮ | ⋮ |

*FIG. 18*

| TEST PATTERN SEQUENCE ID NO. | INPUT TERMINAL | | | INTERNAL SIGNAL LINE | | | | | | | | | | | | OUTPUT TERMINAL | | DETECTABLE FAULTY PATH |
|---|---|---|---|---|---|---|---|---|---|---|---|---|---|---|---|---|---|---|
| | I1 | I2 | I3 | 1 | 2 | 3 | 4 | 5 | 6 | 7 | 8 | 9 | 10 | 11 | 12 | 1 | 2 | |
| T1 | 0 | 0 | R | 0 | 0 | R | R | R | 1 | 1 | 1 | 1 | 1 | 1 | F | 1 | F | ⟨I3, L3, L5, L12, O2⟩ |
| T2 | 0 | 1 | R | 0 | 1 | R | R | R | 1 | F | F | F | F | F | F | F | F | ⟨I3, L3, L5, L12, O2⟩<br>⟨I3, L3, L4, L7, L8, L9, L11, O1⟩<br>⟨I3, L3, L4, L7, L8, L10, L12, O1⟩ |
| T3 | 1 | 0 | R | 1 | 0 | R | R | R | 0 | 1 | 0 | 0 | 0 | 0 | 0 | 0 | 0 | — |
| T4 | 1 | 1 | R | 1 | 1 | R | R | R | 0 | F | 0 | 0 | 0 | 0 | 0 | 0 | 0 | — |
| T5 | 0 | R | 0 | 0 | R | 0 | 0 | 0 | 1 | 1 | 1 | 1 | 1 | 1 | 1 | 1 | 1 | — |
| T6 | 0 | R | 1 | 0 | R | 1 | 1 | 1 | 1 | F | 1 | 1 | 1 | 1 | F | F | F | ⟨I2, L2, L7, L8, L9, L11, O1⟩ |
| T7 | 1 | R | 0 | 1 | R | 0 | 0 | 0 | 0 | 0 | 0 | 0 | 0 | 0 | 0 | 0 | 0 | — |
| T8 | 1 | R | 1 | 1 | R | 1 | 1 | 1 | 0 | F | 1 | 1 | 1 | 1 | F | F | F | — |
| T9 | R | 0 | 0 | R | 0 | 0 | 0 | 0 | F | 1 | F | F | F | F | F | F | F | ⟨I1, L1, L6, L8, L9, L11, O1⟩<br>⟨I1, L1, L6, L8, L10, L12, O2⟩ |
| T10 | R | 0 | 1 | R | 0 | 1 | 1 | 0 | F | 1 | F | F | F | 0 | F | F | 0 | ⟨I1, L1, L6, L8, L9, L11, O1⟩ |
| T11 | R | 1 | 0 | R | 1 | 0 | 0 | 0 | F | 1 | F | F | F | F | F | F | F | ⟨I1, L1, L6, L8, L9, L11, O1⟩<br>⟨I1, L1, L6, L8, L10, L12, O2⟩ |
| T12 | R | 1 | 1 | R | 1 | 1 | 1 | 1 | F | 0 | 0 | 0 | 0 | 0 | 0 | 0 | 0 | — |
| ⋯ | ⋯ | ⋯ | ⋯ | ⋯ | ⋯ | ⋯ | ⋯ | ⋯ | ⋯ | ⋯ | ⋯ | ⋯ | ⋯ | ⋯ | ⋯ | ⋯ | ⋯ | ⋯ |

FIG. 19

METHOD AND APPARATUS FOR DEFECT ANALYSIS OF SEMICONDUCTOR INTEGRATED CIRCUIT

This patent application is a divisional application of U.S. patent application Ser. No. 09/980,891, filed Dec. 3, 2001, now U.S. Pat. No. 6,801,049, is a continuation application of PCT/JP01/02910 filed on Apr. 4, 2001, further of a Japanese patent application, 2000-101867 filed Apr. 4, 2000, the contents of which are incorporated herein by reference.

BACKGROUND OF THE INVENTION

1. Field of the Invention

The present invention relates to a method and apparatus for fault analysis of semiconductor integrated circuit, and the present application is related to the Japanese patent application described as below. For designated states which permit incorporation of a document by reference, contents of the application specified as below is incorporated in the present application by reference, thereby contents of the application specified as below becomes a part of the present application.

Japanese Patent Application No. 2000-101867
Application date: Heisei 12, April 4

2. Description of the Related Art

A conventional method for fault analysis of semiconductor integrated circuit (IC) utilized an electron beam tester, an emission microscope, or a liquid crystal to specify the fault location of the semiconductor IC. The fault analysis of semiconductor IC using an electron beam tester is a method to specify the fault location, such as logic fault, by obtaining a voltage difference between a normal circuit and a defect circuit. The voltage difference can be obtained while observing, using an electron beam tester, a voltage contrast image of the tested IC to which an input test pattern is given. This is disclosed, for example, in Japanese Patent Publication No. 45423/93. The fault analysis of semiconductor IC using an emission microscope is a method to specify the current leak position by matching the emission image of the tested IC's wiring pattern with the light image from current leak detected by the photon detector (emission microscope), which can detect extremely dim light of a photon level. It is reported, for example, in Japanese Patent Publication No. 4128/98. The fault analysis of semiconductor IC using a liquid crystal is a method to specify the fault location, such as current leak accompanied with some heat, by observing the optical change of liquid crystal, spread on the surface of the tested IC, elicited by the input test pattern. It is reported, for example, in Japanese Patent Publication No. 74911/93.

On the other hand, fault analysis using fault simulation is a nondestructive fault analysis method. The fault simulation simulates the output from the output terminal responding to the given input test pattern after assuming a fault inside the IC. The results of the simulation are arranged by matching the input-output logic value with the correspondingly assumed fault, so called, fault dictionary. The fault analysis by the fault simulation is, when the output signal from the output terminal is different from the expected value responding to the input test pattern to the tested IC, performed by matching the input-output logic values from the tested IC with the fault dictionary.

In order to work on faults without a logical error such as a short defect or a current leak defect, a fault analysis method based on IDDQ fault information of semiconductor IC and the input test pattern, accompanied by IDDQ (quiescent power supply current) test and the fault simulation, is proposed. The fault analysis method accompanied by IDDQ test is disclosed, for example, in the Japanese Patent Publication No. 201486/96.

However, the fault analysis methods using the electron beam tester, the emission microscope, and the liquid crystal are costly since these methods require the semiconductor IC to be opened and the chip surface exposed. Moreover, multi-layer wiring and large integration of semiconductor IC's render it difficult to specify fault locations.

A fault analysis method with input output signal response and fault simulation can simulate only a fault of which model is stuck on single signal line (0 or 1), so called single-stuck-at fault (stuck-at-0 or stuck-at-1), but neither a fault stuck on multiple signal line, delay fault, nor fault of short circuit in signal wires. Also, since this fault analysis method can not specify the fault location if the discrepancy between the output value of IC and the expected value is not detected, it cannot guess the fault location of non-logical faults, for example short circuit, where the logic did not become abnormal even with a fault inside the circuit. Furthermore, although fault locations of a delay fault and/or open defect accompanying delay fault can be specified with programming the fault model for the delay fault in the fault simulation, it is difficult to generate a test pattern for observing effects of the delay fault in the semiconductor IC and to effectively specify the fault location of the delay fault.

Furthermore, in the fault analysis accompanied by the IDDQ testing and fault simulation, since the IDDQ testing is a method designed to measure a power supply current of semiconductor IC in its stable state and does not have the transient information of the semiconductor IC, it is difficult to specify the fault location altering a delay time of a circuit. Also, because the IDDQ testing, since it is primarily applied to a short defect, cannot detect open defect and abnormality (parametric defects) of local process parameter (sheet resistance, oxidation etc.) causing delay faults, it has been a problem that it could not detect the fault location of delay fault, open defect, and parametric defect.

Therefore, a fault analysis method is needed that can effectively detect a delay fault and/or open defect and presume the fault location.

The object of the present invention is to provide a method and apparatus which can specify the fault location of a delay fault and/or open defect in a semiconductor IC without processing the semiconductor IC devices.

SUMMARY OF THE INVENTION

In order to achieve the above and other objects, according to the first aspect of the present invention, a fault analysis method for presuming a fault location of a semiconductor IC comprising the steps of: applying a power supply voltage to the semiconductor IC; supplying a test pattern sequence having a plurality of test patterns to the semiconductor IC; storing an analysis point included in the IC, the electric potential of which changes in accordance with change of the supplied test pattern, to be corresponding to the test pattern sequence; measuring a transient power supply current generated on the semiconductor IC in accordance with the change of the test pattern and determining whether the transient current shows abnormality or not; and presuming a fault location out of the analysis points based on the test pattern sequence, where the transient power supply current shows abnormality, and the analysis point stored to be corresponding to the test pattern sequence.

Moreover, it is preferable that the transient power supply current is determined to be abnormal when pulse width of the transient power supply current is over a predetermined value in the step of determining.

Moreover, the transient power supply current may be determined to be abnormal when instant value of the transient power supply current at a predetermined time point is over a predetermined value in the step of determining.

Moreover, the transient power supply current may be determined to be abnormal in case time integral of the transient power supply current is over a predetermined value in the step of determining.

Moreover, it is preferable that the method further comprises a step of producing the predetermined value by simulation.

Moreover, it is preferable that the step of presuming a fault location presumes the analysis point, which is placed to be corresponding to all of the test pattern sequence where the transient power supply current shows abnormality, to be the fault location in case the transient power supply current shows abnormality for two or more of the plurality of test pattern sequence.

It is preferable that the step of presuming comprises the steps of: deleting, in case the transient power supply current shows abnormality for two or more test pattern sequence out of the plurality of test pattern sequence, an analysis point, which is not corresponding to the remaining ones of the two or more test pattern sequence, from the analysis points which are corresponding to a predetermined test pattern sequence out of the two or more test pattern sequence; and presuming a remaining analysis point out of the analysis points corresponding to the predetermined test pattern sequence to be a fault location.

In this case, it is preferable that the step of deleting includes a step of determining a test pattern sequence, where the transient power supply current shows abnormality first out of the plurality of test pattern sequence supplied to the semiconductor IC, to be the predetermined test pattern sequence.

The step of presuming may comprise the steps of: deleting the analysis points corresponding to the test pattern sequence, where the transient power supply current does not show abnormality, from the analysis points corresponding to the test pattern sequence where the transient power supply current shows abnormality; and presuming a remaining analysis point out of the analysis points corresponding to the test pattern sequence where the transient power supply current shows abnormality to be a fault location.

The step of storing analysis points may store a logic element included in the IC, the output of which changes in accordance with a change of the supplied test pattern, as an analysis point to be corresponding to the test pattern sequence.

The step of storing analysis points may store a signal line included in the IC, the electric potential of which changes in accordance with a change of the supplied test pattern, to be corresponding to the test pattern sequence.

Furthermore, the step of storing analysis points may store a signal transmission path included in the IC to be corresponding to the test pattern sequence, the signal transmission path having: a signal line, the electric potential of which changes in accordance with a change of supplied test pattern; and a logic element, the output of which changes in accordance with a change of supplied test pattern, connected to the signal line.

According to the second aspect of the present invention, a fault analysis apparatus for presuming a fault location of a semiconductor IC comprising: a means for applying a power supply voltage to the semiconductor IC; a means for supplying a test pattern sequence having a plurality of test patterns to the semiconductor IC; a means for storing an analysis point included in the IC, the electric potential of which changes in accordance with change of the supplied test pattern, to be corresponding to the test pattern sequence; a transient power supply current tester for measuring a transient power supply current generated on the semiconductor IC in accordance with the change of the test pattern and determining whether the transient current shows abnormality or not; and a fault location presuming unit for presuming a fault location out of the analysis point based on the test pattern sequence, where the transient power supply current shows abnormality, and the analysis point stored to be corresponding to the test pattern sequence.

According to the third aspect of the present invention, a fault analysis apparatus for presuming a fault location of semiconductor IC comprising: a means for applying a power supply voltage to the semiconductor IC; a means for supplying a test pattern sequence having a plurality of test patterns to the semiconductor IC; a means for storing an analysis point included in the IC, the electrical potential of which changes in accordance with change of the supplied test pattern, to be corresponding to the test pattern sequence; a means for measuring a transient power supply current generated on the semiconductor IC in accordance with a change of the test pattern; a means for determining that the transient power supply current is abnormal in case pulse width of the transient power supply current is over a predetermined value; and a means for presuming a fault location out of the analysis point based on the test pattern sequence, where the transient power supply current shows abnormality, and the analysis point stored to be corresponding to the test pattern sequence.

According to the fourth aspect of the present invention, a fault analysis apparatus for presuming a fault location of semiconductor IC comprising: a means for applying a power supply voltage to the semiconductor IC; a means for supplying a test pattern sequence comprising a plurality of test patterns to the semiconductor IC; a means for storing an analysis point included in the IC, the electric potential of which changes in accordance with change of the test pattern, to be corresponding to the test pattern sequence; a means for measuring a transient power supply current generated on the semiconductor IC in accordance with a change of the test pattern; a means for determining that the transient power supply current is abnormal in case instant value of the transient power supply current at a predetermined time point is over a predetermined value; and a means for presuming a fault location out of the analysis point based on the test pattern sequence, where the transient power supply current shows abnormality, and the analysis point stored to be corresponding to the test pattern sequence.

According to the fifth aspect of the present invention, a fault analysis apparatus for presuming a fault location of semiconductor IC comprising: a means for applying a power supply voltage to the semiconductor IC; a means for supplying a test pattern sequence comprising a plurality of test patterns to the semiconductor IC; a means for storing an analysis point included in the IC, the electric potential of which changes in accordance with change of the test pattern, to be corresponding to the test pattern sequence; a means for measuring a transient power supply current generated on the semiconductor IC in accordance with a change of the test pattern; a means for determining that the transient power supply current is abnormal in case time integral of the transient power supply current is over a predetermined value; and a means for presuming a fault location out of the analysis point based on the test pattern sequence, where the transient power supply current shows abnormality, and the analysis point placed to be corresponding to the test pattern sequence.

This summary of the invention does not necessarily describe all necessary features so that the invention may also be a sub-combination of these described features.

BRIEF DESCRIPTION OF THE DRAWINGS

FIG. 1a shows an example response of the output voltage $V_{OUT}$ for the change of input voltage $V_{IN}$ of CMOS inverter over time.

FIG. 1b shows an example transient response of the current $I_{DD}$ for the change of input voltage $V_{IN}$ over time as shown in FIG. 1a.

FIG. 1c illustrates the CMOS inverter circuit and the power supply current flowing at rising transition of output.

FIG. 1d illustrates the CMOS inverter circuit and the power supply current flowing at falling transition of output.

FIG. 2b shows the approximate waveform of the transient current shown in FIG. 2a.

FIG. 3b shows the changes of input voltage and output voltages for the IC of FIG. 3a.

FIG. 4b shows the relation between the operation clock CLK and the delay of the output voltage $V_{OUT}$ for the input voltage $V_{IN}$ of the circuit shown in FIG. 4a.

FIG. 5b shows the input and output voltages for the signal line illustrated in FIG. 5a.

FIG. 6b is a diagram to show the principle of the transient power supply current testing method and it illustrates a transient power supply current corresponding to the change of input and output voltages of FIG. 6a.

FIG. 9a is a model of a small open defect present in the input signal line of the CMOS inverter.

FIG. 9b is a schematic diagram showing signal transition time in a case that no small open defect is present.

FIG. 9c is a schematic diagram showing signal transition time after the small open defect in a case that the small open defect is present.

FIG. 15 shows an example result of a fault simulation for the test CMOS IC shown in FIG. 14.

FIG. 17 shows an example result of another fault simulation for the test CMOS IC shown in FIG. 16.

FIG. 18 shows an example fault location list in terms of signal transmission path for the circuit shown in FIG. 14.

FIG. 19 shows an example fault location list in terms of signal transmission path for the circuit shown in FIG. 16.

DETAILED DESCRIPTION OF THE INVENTION

The preferred embodiments of the present invention are now described in detail with reference to the accompanying drawings. First, an outline of the present invention is provided using a CMOS IC, which is the most conventional semiconductor IC, as an example device. According to the present invention, a transient power supply current of the semiconductor IC to be tested is measured and determined whether it is abnormal or not. Thus, the transient power supply current is explained first.

Transient Power Supply Current

The power supply current of the CMOS IC is a power supply current which is flowed into the CMOS IC, and it is the sum of the currents which flow in each logic gate composing IC.

FIG. 1 shows the transient response of the CMOS inverter (FIGS. 1c and 1d). The transient response is obtained using a circuit simulator. FIG. 1a shows a response of the output voltage $V_{OUT}$ for the input voltage $V_{IN}$ in a transient state, and FIG. 1b shows a response of the current $I_{DD}$ flowed to the CMOS inverter from the power supply. The current $I_{DD}$ is referred to as a transient current. When the input IN of the inverter changes from "1" to "0" (FIG. 1c), n-MOS and p-MOS are instantly and almost simultaneously turned on, and a short circuit current $I_S$ flows from the power supply terminal $T_{VD}$ to ground GND when the input voltage is higher than the threshold voltage of n-MOS and lower than the threshold voltage of p-MOS. At this time, to change the output OUT of the output signal line of the inverter from "0" to "1", the current $I_c$ which charges the parasitic capacitance $C_{load}$ connected to the output signal line of the inverter flows from the power supply terminal $T_{VD}$ to the parasitic capacitance $C_{load}$ almost simultaneously with the short circuit current $I_S$. Thus, when a falling transition occurs in the input IN of the inverter (it is denoted by the suffix "f"), the transient current $I_{Gf}$ flowed into the inverter is the sum of the short circuit current $I_{Sf}$ and the capacitance charging current $I_C$.

$$I_{Gf} = I_{Sf} + I_C \tag{1}$$

On the other hand, when the input IN transits from "0" to "1" (the output changes from "1" to "0") (it is denoted by the suffix "r") (FIG. 1d), the current $I_{Gr}$ flowed into the inverter from the power supply terminal $T_{VD}$ is only the short circuit current $I_{Sr}$ although the capacitance discharging current $I_D$ is generated due to discharging of the parasitic capacitance $C_{load}$ connected to the output signal line. Therefore, the peak of the current $I_{Gr}$ is a little bit smaller than that of the transient current $I_{Gf}$ during the falling transient of input as shown in FIG. 1b.

$$I_{Gr} = I_{Sr} \tag{2}$$

Figure 2A:
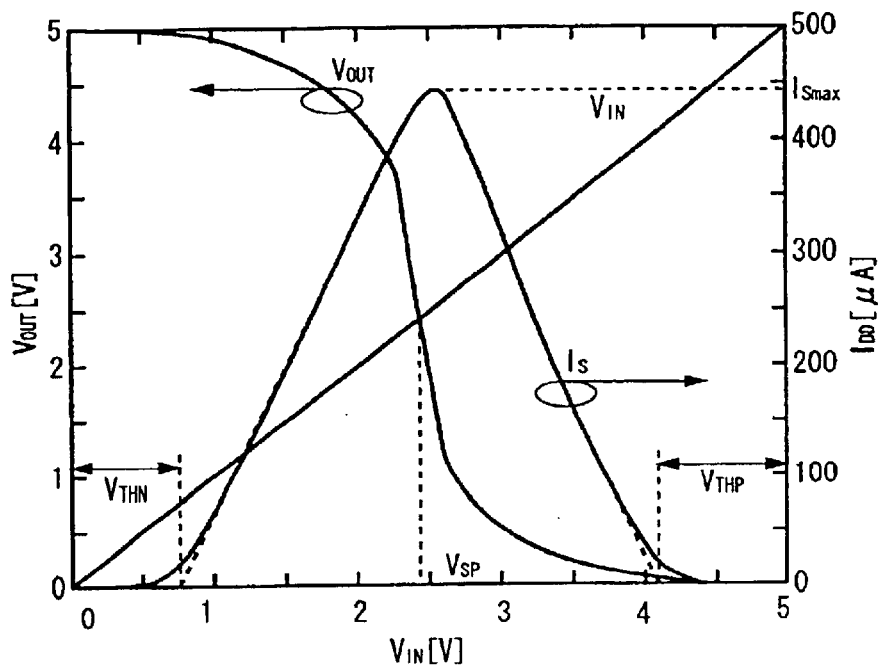
FIG. 2a shows the transmission characteristics of input voltage $V_{IN}$, output voltage $V_{OUT}$ and power supply current for the typical example of the transient response of the CMOS logic gate.
Figure 2B:
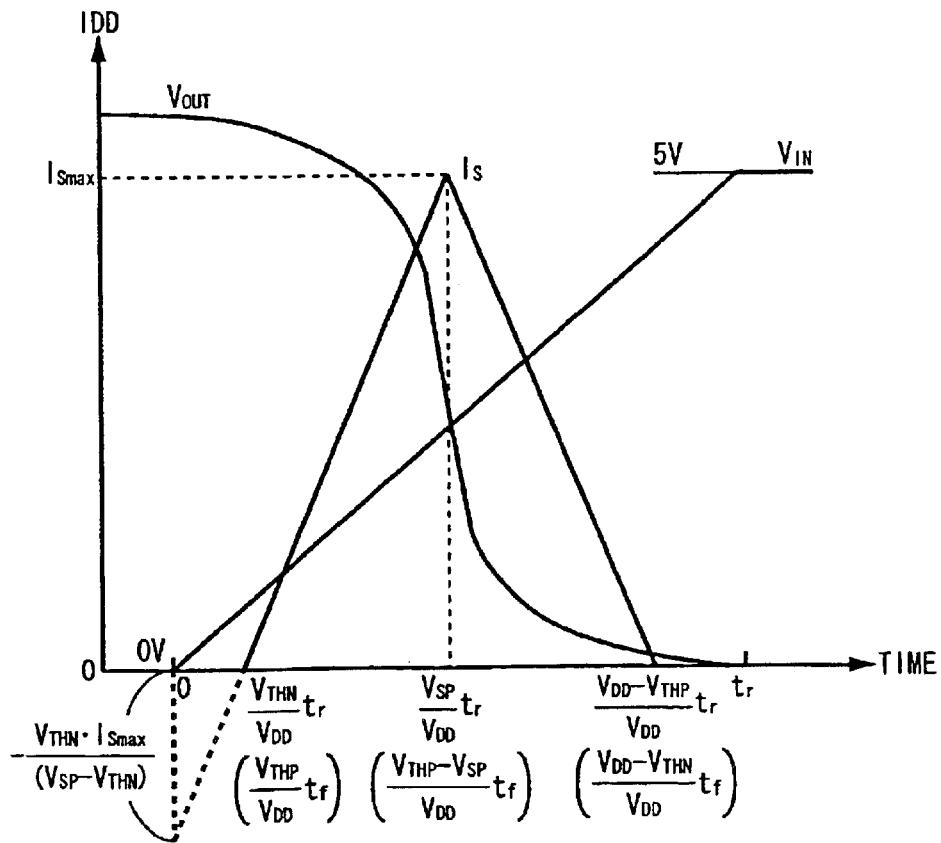

The transfer characteristic of the CMOS inverter shows the current $I_S$ of triangular pulse form as to the change of the input voltage $V_{IN}$ as shown in FIG. 2a. Therefore, the short circuit current waveform $I_{Sr}$ flowed in the CMOS inverter is approximated to be a triangular pulse "$I_S$" as shown in FIG. 2b if the input voltage $V_{IN}$ changes as a ramp shape, when the input of the CMOS inverter has a rising transition. Moreover, the short circuit current waveform $I_{Sr}$ of the CMOS inverter for the first start transition of the input signal shown in FIG. 2b is given as the following equation.

$$I_{Sr} = \begin{cases} 0, & t \leq \frac{V_{THN}}{V_{DD}} t_r \\ \frac{V_{DD} \cdot I_{Smax}}{(V_{SP} - V_{THN}) \cdot t_r} t - \frac{V_{THN} \cdot I_{Smax}}{(V_{SP} - V_{THN})}, & \frac{V_{THN}}{V_{DD}} t_r < t \leq \frac{V_{SP}}{V_{DD}} t_r \\ \frac{V_{DD} \cdot I_{Smax}}{(V_{SP} - V_{DD} + V_{THP}) \cdot t_r} t - \frac{(V_{DD} - V_{THP}) \cdot I_{Smax}}{(V_{SP} - V_{DD} + V_{THP})}, & \frac{V_{SP}}{V_{DD}} t_r < t \leq \frac{V_{DD} - V_{THP}}{V_{DD}} t_r \\ 0, & t \geq \frac{V_{DD} - V_{THP}}{V_{DD}} t_r \end{cases} \tag{3}$$

Here, $I_{Smax}$ is a maximum value of the transient current (short circuit current) flowed into the CMOS inverter, $V_{DD}$ is a power supply voltage, $V_{THN}$ is a threshold voltage of an n-MOS transistor, $V_{THP}$ is a threshold voltage of a p-MOS transistor, and $t_r$ is a start transition time of the input signal. $V_{THP}$ is indicated as an absolute value. To make the equation simple, it is possible to set the transition start time of the input voltage $V_{IN}$ as 0 with the transition finish time as $t_r$ and input voltage as $V_{DD}$.

The short circuit current waveform $I_{Sf}$ for the falling transition of the input signal maybe similarly obtained by equation (4).

$$I_{Sr} = \begin{cases} 0, & t \leq \dfrac{V_{THN}}{V_{DD}} t_f \\ \dfrac{V_{DD} \cdot I_{Smax}}{(V_{DD} - V_{THN} - V_{SP}) \cdot t_f} t - \dfrac{V_{THN} \cdot I_{Smax}}{(V_{DD} - V_{THN} - V_{SP})'} & \dfrac{V_{THN}}{V_{DD}} t_f < t \leq \dfrac{V_{DD} - V_{SP}}{V_{DD}} t_r \\ \dfrac{V_{DD} \cdot I_{Smax}}{(V_{THP} - V_{SP}) \cdot t_f} t - \dfrac{(V_{DD} - V_{THP}) \cdot I_{Smax}}{(V_{THN} - V_{SP})'} & \dfrac{V_{DD} - V_{SP}}{V_{DD}} t_f < t \leq \dfrac{V_{DD} - V_{THN}}{V_{DD}} t_f \\ 0, & t \geq \dfrac{V_{DD} - V_{THN}}{V_{DD}} t_f \end{cases} \quad (4)$$

Here, $t_f$ is a falling transition time of the input signal. The start time of the rising edge of the power supply current, the time of the maximum value $I_{Smax}$, and the finish time of the falling transition of this case are indicated in FIG. 2b with parentheses.

Capacitance charging current $I_C$ to the parasitic capacitance $C_{load}$ of the output signal line of the CMOS inverter is shown as the following equation if the voltage change of the output signal line is denoted as $V_{out}$ (t).

$$I_C = C_{load} \dfrac{dv_{out}(t)}{dt} \quad (5)$$

These equations may also be obtained for logic gates other than the inverter.

If it is premised that most of the transient current $I_G$ flowed into a logic gate is the short circuit current, it may be approximated to be a triangular pulse as shown in FIG. 2b. In fact, the form of a transient current $I_G$ of the CMOS inverter is a triangular pulse as shown in FIG. 1b. Therefore, the transient current $I_G$ of a logic gate is monotonously increased until it reaches the maximum value $I_{Smax}$, and monotonously decreased after the maximum value $I_{Smax}$. Further, the transient current $I_G$ becomes the maximum value $I_{Smax}$ when the input voltage $V_{IN}$ becomes a switching voltage $V_{SP}$. In other words, as shown in FIG. 2b, the time when the transient current $I_G$ reaches a peak value substantially coincides with the transition time of an input to a logic gate. Since a logic gate generally has a delay time, an output transition time is delayed to a predetermined period from the input transition time. In other words, the time when the $I_G$ reaches a peak value leads the output transition time a little bit. In this case, it is possible to consider that the falling edge (falling portion) of the form of the transient current $I_G$ coincides with the output transition time. Further, the pulse width of the transient current $I_G$ of a logic gate is proportional to the transient time of an input voltage.

Until now, it is assumed that most of the transient current $I_G$ flowed in to the logic gate is the short circuit current. However, the line delay became more predominant than the gate delay because the CMOS fabrication process becomes minute. This means that the ratio of the capacitance current $I_C$ to the output signal line becomes larger than the ratio of the short circuit current $I_S$ for the transient current $I_G$ flowed into the CMOS logic gate if it is assumed that the transition time of the input voltage is constant. Therefore, the time when the transient current waveform reaches its peak depends on the ratio of the capacitance current $I_C$ for the short circuit current. When $I_C$ is smaller than $I_S$, a peak of the transient current waveform $I_G$ corresponds to the peak of $I_S$. Since the peak of $I_S$ corresponds to the transition time of the input voltage, the peak of $I_G$ precedes the transition time of the logic gate. On the contrary, when $I_C$ is larger than $I_S$, a peak of the transient current waveform corresponds to the peak of $I_C$. Since the capacitance current $I_C$ is related to the voltage transition of the output signal line, the peak of $I_G$ nearly corresponds to the transition time of the output of the logic gate.

Figure 3A:
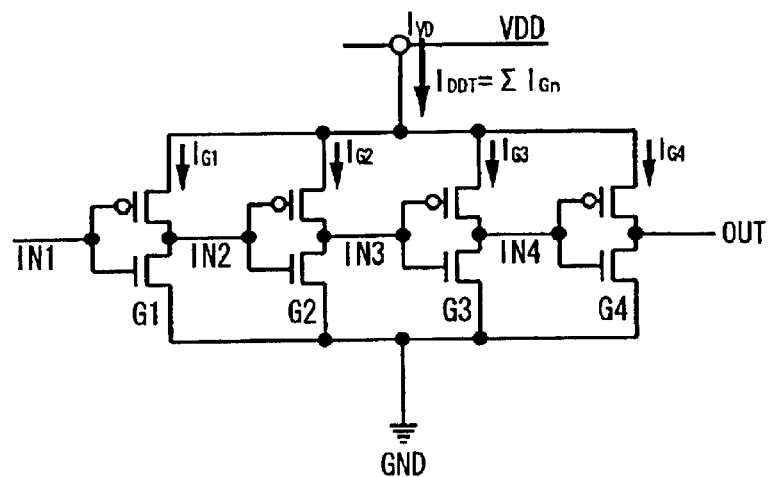
FIG. 3a is a circuit diagram of an example CMOS IC.
Figure 3B:
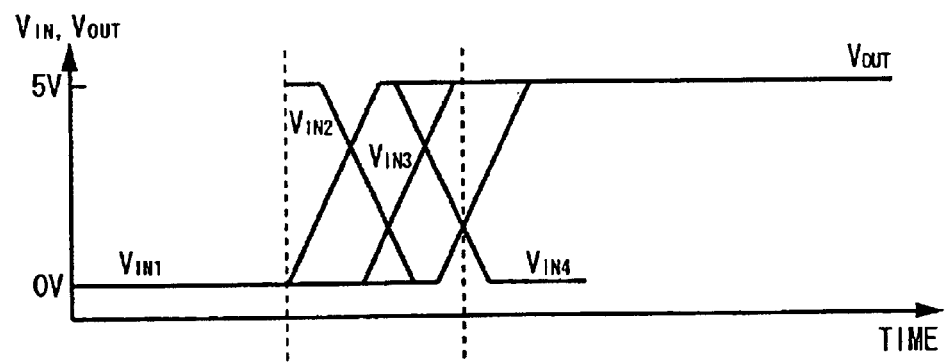
Figure 3C:
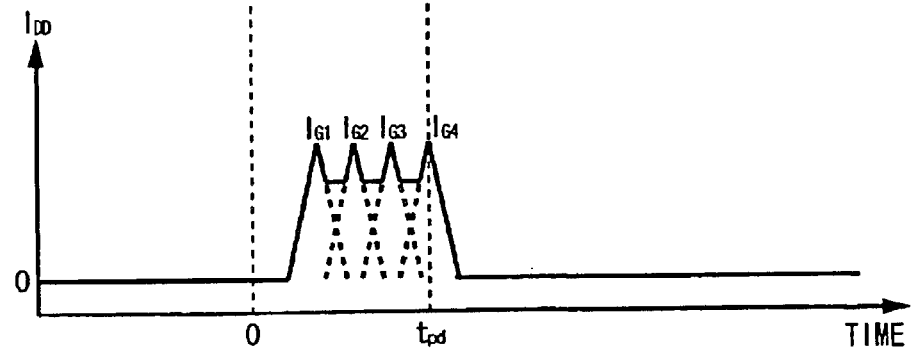
FIG. 3c shows the transient power supply current $I_{DDT}$ corresponding to the change as shown in FIG. 3b.

The CMOS IC shown in FIG. 3a has serially-formed four (4) inverters G1, G2, G3, and G4 illustrated in FIG. 1c, and the transient currents $I_{G1}$, $I_{G2}$, $I_{G3}$, and $I_{G4}$ which flow in each of the inverters, respectively, are supplied from a power supply terminal $T_{VD}$. Therefore, transient power supply current response of the IC is the sum of the transient currents which flow in each of the logic gates as the following equation as shown in FIG. 3c.

$$I_{DDT} = \sum_{n=1}^{N} I_{Gn} \quad (6)$$

Here, N is the number of logic gates switched by the inputted test pattern sequence and N is 4 (four) for the example of FIG. 3a. FIG. 3b shows the relation between the input voltage and the output voltage of each logic gate.

As the peak (or the falling edge) of the transient current waveform of the logic gate corresponds to the transition time of the output of the logic gate, the final peak (final falling edge) of the transient current waveform of the CMOS IC corresponds to the output transition time of the logic gate of the CMOS IC which is switched last. Therefore, path delay time of the IC is obtained by detecting the final peak (final falling edge) of the transient current waveform of the CMOS IC and comparing the detected time to the input transition time. Here, the time of the final peak (final falling edge) of the transient current waveform may be obtained as the maximum value of the time, for example, from the transition time of the input of the path of the IC to the time when the transient power supply current becomes a predetermined current value. The predetermined current value is the value of the power supply current when the output voltage of the final logic gate on the path to be tested becomes half of the power supply voltage $V_{DD}$ and it may be obtained using circuit simulation for the circuit to be tested or the statistics of the result devices.

Now, the method for detecting faults of the semiconductor IC is described based on the transient power supply current as described above.

As described above, a delay fault of the path of the semiconductor IC to be tested can be detected by comparing the obtained delay time to the predetermined time (for example, a period $T_{CLK}$ of the system clock).

Delay Fault

First, a delay fault is defined. It is assumed that the path P=$\{g_0, g_1, g_2, \ldots, g_m\}$ of the CMOS logic circuit is activated utilizing a test pattern sequence T=$<v_1, v_2>$ (this means that the voltage signal $v_1$ is followed by the voltage signal $v_2$) having two test patterns $v_1$, and $v_2$. Here, $g_0$ is the input signal line of path P, and $g_1, g_2, \ldots, g_m$ are the output signal lines of each of the logic gates $G_1, G_2, \ldots, G_m$ on path P, respectively. At the same time, $g_0, g_1, \ldots, g_{m-1}$ are the input signal lines of each of the logic gates $G_1$, $G_2, \ldots, G_m$ on path P, respectively. If the signal transition time (the time when the voltage signal is $V_{DD}/2$) of each signal line $g_0, g_1, \ldots, g_m$ is $\tau_0, \tau_1, \ldots, \tau_m$, the gate delay time $t_{gdi}$, $1<i<m$ of each logic gate $G_1, G_2, \ldots, G_m$ on path P is obtained as the following equation.

$$t_{gdi}=\tau_i-\tau_{i-1} \quad (7)$$

Therefore, a path delay time $t_{pd}$ can be obtained as the sum of the gate delay time $t_{gdi}$ as the following equation.

$$t_{pd} = \sum_{i=1}^{m} t_{gdi} = t_m - t_0 \quad (8)$$

However, the actual gate delay time $t_{gdi}$ becomes the value of the following equation because of the effect of the defect.

$$t_{gdi}=t_{gdi,typ}+\delta_i, \; 1<i<m \quad (9)$$

Here, $t_{gdi,typ}$ is a typical value of the gate delay time of the logic gate $G_i$, and $\delta_i$ is the difference component of the gate delay time. For example, the open defect increases the gate delay time of the only logic gate having a defect, and does not increase the gate delay time of the other logic gates. The parametric defect increases the delay times of all logic gates. Path delay time changes as the following equation according to the change of the gate delay time.

$$t_{pd} = t_{pd,typ} + \Delta = \sum_{i=1}^{m} (t_{gdi,typ} + d_i) \quad (10)$$

Here, $t_{pd,typ}$ is a typical value of the path delay time of the path P, and $\Delta$ is the difference component of the path delay time.

Figure 4A:
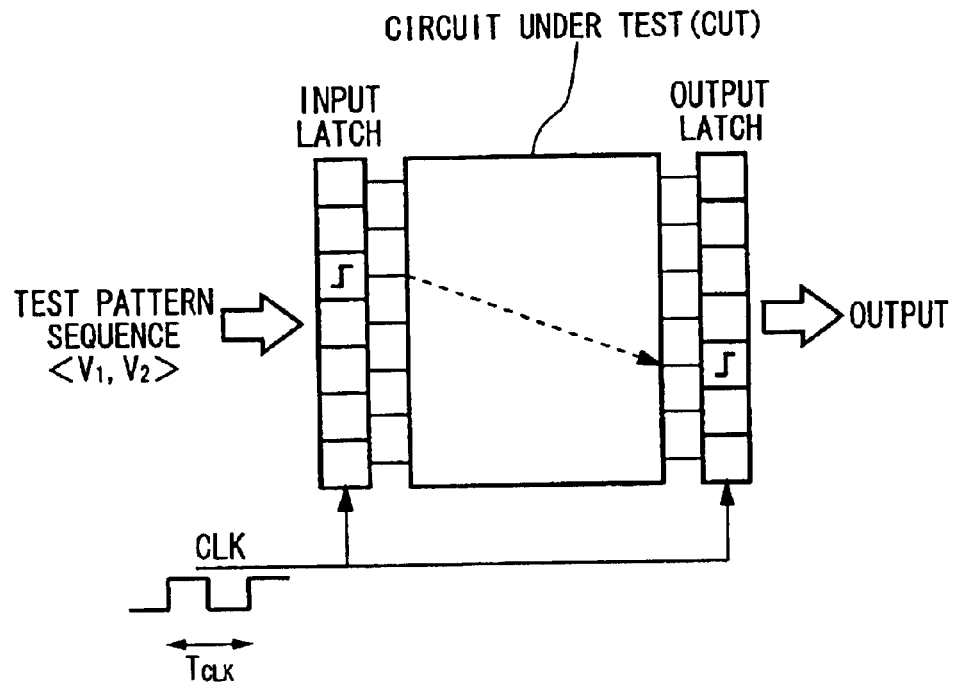
FIG. 4a is a schematic diagram showing the principle of the delay fault testing method for the semiconductor having an output latch.
Figure 4B:
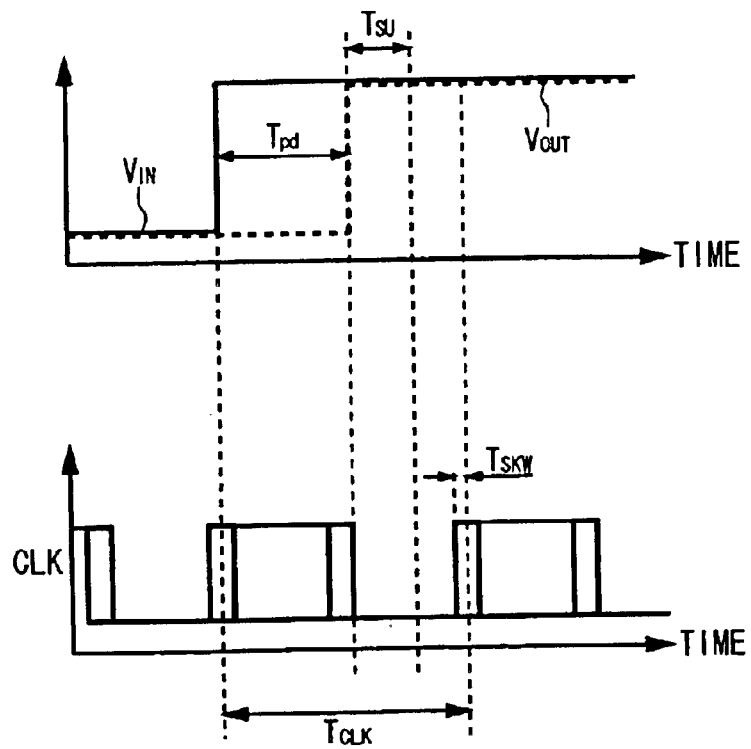

The principle of the delay fault testing method is schematically shown in FIG. 4. For the semiconductor IC CUT to be tested to operate normally, signal transition generated at the input latch should be transferred through the path P in the semiconductor IC to be tested to the output latch in a predetermined time period. Therefore, the path delay time $t_{pd}$ of the path P should satisfy the following condition based on the relation between system clock CLK and between input $V_{IN}$ and output $V_{OUT}$ as shown in FIG. 4b.

$$t_{pd}+T_{SU}<T_{CLK}-T_{SKW} \quad (11)$$

Here, $T_{SU}$ is a setup time of the signal, $T_{CLK}$ is a period of the system clock, and $T_{SKW}$ is a clock skew of the system clock. The clock skew $T_{SKW}$ is the difference component of the timing of the system clock, and the ± amount of difference of the edge of the system clock. Equation (11) may be transformed as the following equation (12).

$$t_{pd}<T_{CLK}-T_{SKW}-T_{SU} \; T' \quad (12)$$

That is, the path delay time $t_{pd}$ of the path P should be smaller than the time T' which subtracts the clock skew $T_{SKW}$ and the setup time $T_{su}$ from the clock period $T_{CLK}$. If $t_{pd}$ is larger than T', the signal transmission through the path P does not correspond to the system clock and the circuit cannot operate correctly. This situation is defined as a delay fault. That is, if $t_{pd}$ is larger than the predetermined time T', it is defined that path P has a delay fault. Here, T' is the maximum value of the permissible delay time.

Open Defect (which Accompanies a Delay Fault)

Figure 5A:
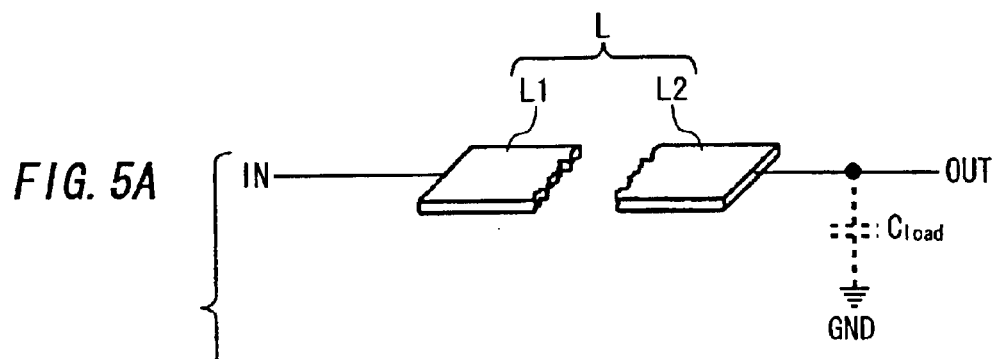
FIG. 5a illustrates a disconnection of a signal line which makes a logic fault.
Figure 5B:
Figure 5C:
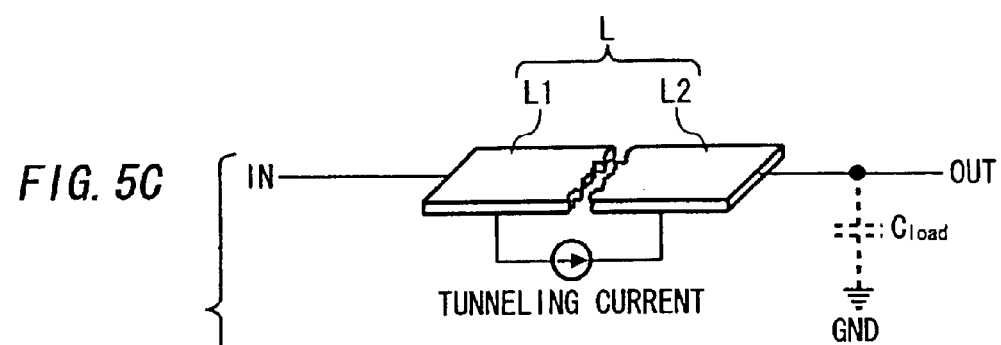
FIG. 5c illustrates a disconnection of a signal line which makes a delay fault.
Figure 5D:
FIG. 5d shows the input and output voltages for the signal line illustrated in FIG. 5c.

Next, an open defect, which accompanies a delay fault, is defined. An open defect means the electronic discontinuity, which is not intentional, and that one signal line is divided to two or more signal lines. An open defect includes an open contact by the damage of metal or oxide, a metal line open by patterning or etching inferiority, a diffusion layer by the mask inferiority or open of the polysilicon, etc. Moreover, the open defect may be classified as two types. One is that line L is divided to L1 and L2, and the gap between L1 and L2 is quite large, as shown in FIG. 5a, therefore, the input $V_{IN}$ of one end of the line L does not appear to the output $V_{OUT}$ of the other end of the line L, as shown in FIG. 5b. The other is the open defect which accompanies the delay fault that the divided lines L1 and L2 are close to each other, as shown in FIG. 5c, therefore, the input $V_{IN}$ of one end of the line L flows as the tunneling current and outputs to the other end of the line L late, as shown in FIG. 5d. The open defect which accompanies the logic fault makes the logic fault that charging and discharging of the parasitic capacitance $C_{load}$ accompanied by the signal transition are not conducted and the logic is fixed to the constant value since no current flows on the lines of both sides of the defect (divided lines L1 and L2) if the voltage is applied. On the other hand, if an open defect which accompanies the delay fault is generated, charging and discharging of the parasitic capacitance $C_{load}$ accompanied by the signal transition are delayed thereby the delay time of the circuit increases since the current amount is smaller than normal although the current flows on the lines of both sides of the defect (L1 and L2) if the voltage is applied. An open defect which accompanies the delay fault includes a resistive open defect which takes place in the case that the resistance of the signal line L becomes larger than the normal value by the defect of the signal line L or the resistance between signal lines L1 and Ls becomes larger than the normal value by the inferiority of contact, etc., and a small (<100 nm) open defect that a minute leakage current flows through the opened signal line L1 and L2 by the tunneling effect. In this specification, an open defect which accompanies the delay fault is simply called an open defect.

Method for Detecting Delay Fault (Using Pulse Width of the Transient Power Supply Current)

Figure 6A:
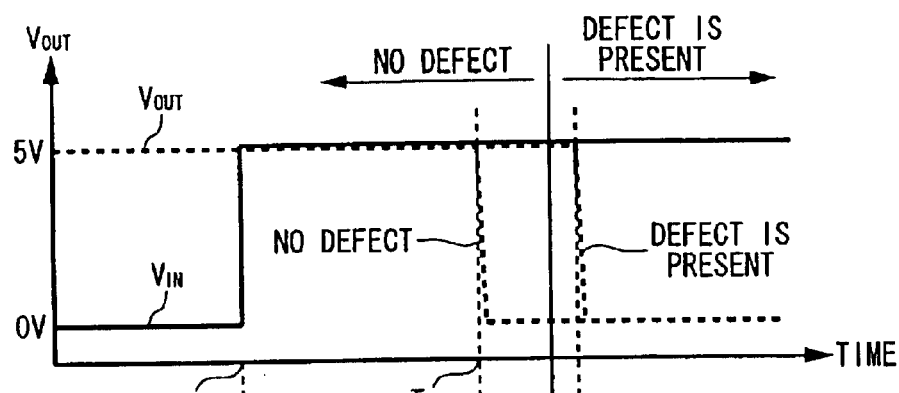
FIG. 6a shows the time delay of the input and output voltages in cases that the delay fault is present and not present for the CMOS logic circuit.
Figure 6B:
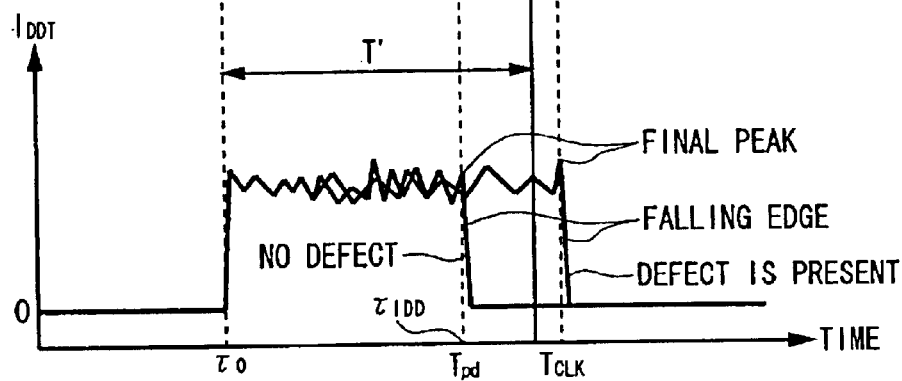

Next, a method for detecting a delay fault using pulse width of the transient power supply current which is mentioned above is described in detail. This method is to compare the pulse width of the transient power supply current waveform of the circuit to be tested to a predetermined time value. The principle of the method is shown in FIG. 6.

It is assumed that a plurality of paths $P_1, P_2, \ldots, P_n$ are activated utilizing a test pattern sequence $T=<v_1, v_2>$ having two test patterns $v_1$ and $v_2$ for the CMOS logic circuit. If $\tau_{ij}$ is the time when the j-th logic gate from the input of the path Pi switches, the time $\tau_{max}$ of the output transition of the logic gate, which switches last, for the paths $P_1, P_2, \ldots, P_n$ is given as the following equation since the number of logic gates of each path $P_1, \ldots, P_n$ is different to each other.

$$\tau_{max} = \max_{i,j}\{\tau_{ij}\}, \quad 1 \leq i \leq n, \quad 1 \leq j \quad (13)$$

Therefore, the maximum value of the path delay time $t_{pd,max}$ for the paths $P_1, P_2, \ldots, P_n$ is the interval between $\tau_{max}$ and the time $\tau_0$ of the input transition which is obtained by the following equation.

$$t_{pd,max}=\tau_{max}-\tau_0 \quad (14)$$

On the other hand, a pulse width $t_{PW}$ of the transient power supply current waveform of the CMOS logic circuit is defined as the time interval between the time $\tau_0$ of the signal transition of the circuit input and the time $\tau_{IDD}$ of the final peak (falling edge) of the transient power supply current.

$$t_{PW} \tau_{IDD} - \tau_0 \quad (15)$$

As mentioned above, since the time $\tau_{IDD}$ of the final peak of the transient power supply current corresponds to the time of the output transition of the logic gate $G_{final}$ which switches last or precedes $\tau_{max}$, the pulse width $t_{PW}$ of the transient power supply current waveform corresponds to the delay time $t_{pd}$, max of the path P activated by the test pattern T.

$$t_{PW} = \tau_{IDD} - \tau_0 < \tau_{max} - \tau_0 = t_{pd,max} \quad (16)$$

If, $t_{PW}$ is larger than the maximum value T' of permissible delay time, then it becomes the following equation.

$$T' < t_{PW} < t_{pd,max} \quad (17)$$

For the path having the longest delay time $t_{pd,max}$, the transmission of the signal is late to the system clock. That is, the circuit has a delay fault. Therefore, $t_{PW}$ which is larger than T' indicates that there is a delay fault on any side of the activated path, and $t_{PW}$ which is smaller than T' indicates that there is no delay fault in the vicinity of the activated path.

No delay fault, $t_{PW} < T'$

Delay fault is present, $t_{PW} > T'$ \quad (18)

As described above, a delay fault of a circuit can be tested by comparing the pulse width $t_{PW}$ of the transient power supply current waveform to a predetermined time T'.

Method for Detecting Delay Fault (Using an Instant Value of the Transient Power Supply Current)

Since the transient power supply current of the logic gate decreases monotonously as shown in FIG. 1, the power supply current of the CMOS IC shown in FIG. 3c decreases simply after the output transition time of the logic gate which switches last for the IC. That is, for the CMOS IC without fault, if it is assumed that the output transition time of the logic gate which switches last is $\tau_{max}$ and the instant value of the transient power supply current is I', then the transient power supply current of the CMOS IC after $\tau_{max}$ may not be larger than I'.

Using this principle, a delay fault of the circuit to be tested can be detected by measuring the instant value of the transient power supply current of the CMOS IC at a predetermined time point. Here, the current value I' which is the standard for determining a fault is a value of the power supply current when the output of the last logic gate of the path to be tested is a half of the power supply voltage and can be obtained by circuit simulation for the circuit to be tested or the statistics of the result devices.

Figure 7A:
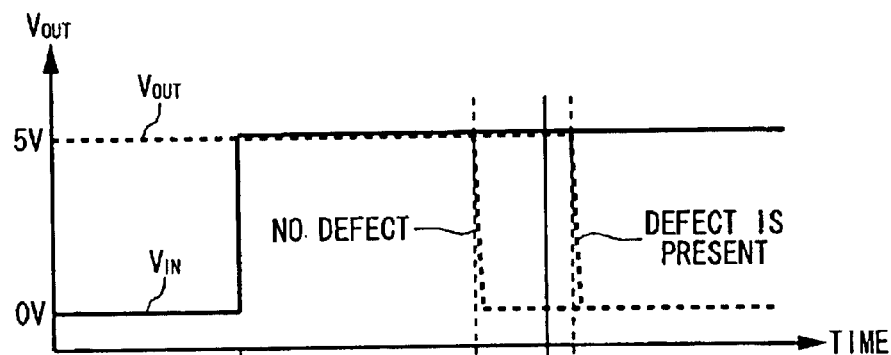
FIG. 7 is a diagram to show the principle of another transient power supply current testing method, and (a) shows the time delay of the input and output voltages in cases that the delay fault is present and not present and (b) shows corresponding transient power supply current and measuring time.
Figure 7B:
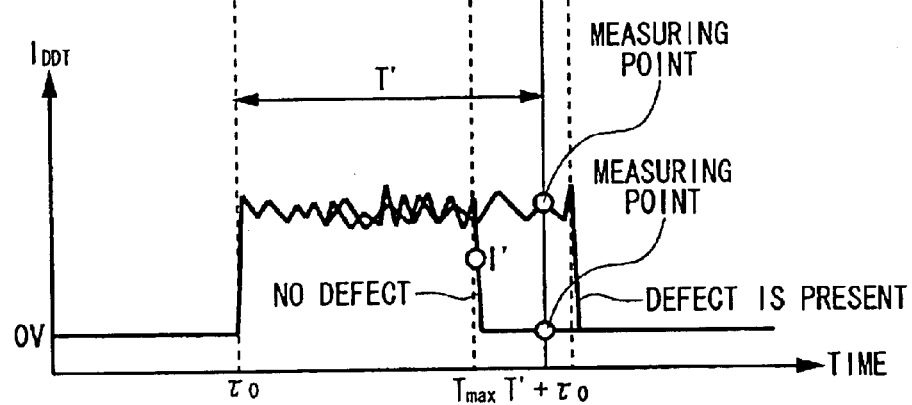

The method for detecting a delay fault using the instant value of the transient power supply current as mentioned above is now described in detail. The method is to measure the instant value of the transient power supply current of the circuit to be tested at a predetermined time point and compare the instant value with the transient power supply current of the golden circuit without delay fault. The principle of the method is illustrated in FIG. 7.

It is assumed that a plurality of paths $P_1, P_2, \ldots, P_n$ are activated by the test pattern sequence $T = <v_1, v_2>$ for the CMOS logic gate. If $\tau_{ij}$ is the time when the jth logic gate from the input of the path $P_i$ switches, the time $\tau_{max}$ of the output transition of the logic gate, which switches last, for the paths $P_1, P_2, \ldots, P_n$ is given as the following equation.

$$\tau_{max} = \max_{i,j}\{\tau_{ij}\}, \quad 1 \leq i \leq n, \quad 1 \leq j \quad (19)$$

Therefore, the maximum value of the path delay time $t_{pd,max}$ for the paths $P_1, P_2, \ldots, P_n$ is the interval between $\tau_{max}$ and the time $\tau_0$ of the input transition which is obtained by the following equation.

$$t_{pd,max} = \tau_{max} - \tau_0 \quad (20)$$

As mentioned before, since the time of the output transition of the logic gate corresponds to the peak or the falling edge, $\tau_{max}$ corresponds to the time $\tau_{IDD}$ of the final peak or the falling edge of the transient power supply current waveform $I_{DDT}$. As the power supply current $I_G$ of the logic gate can be approximated as a triangular wave and $G_{final}$ is the gate that switches last, there is no logic gate having a peak of the power supply current after $\tau_{max}$. Therefore, if it is assumed that the time function of the power supply current waveform is $i_{DDT}(t)$, and the instant value of the power supply current at the time $\tau_{max}$ is as the following equation, $$I' \, i_{DDT}(\tau_{max}) \quad (21)$$

Then, for t of $t > \tau_{max}$, the following equation is made up., $$i_{DDT}(t) < i_{DDT}(\tau_{max}) = I', \; t > \tau_{max} \quad (22)$$

For normal operation of the circuit, $t_{pd,max}$ should be smaller than the maximum value of the delay time T' ($=T_{CLK} - T_{SKEW} - T_{SU}$) (equation 12).

$$t_{pd,max} = \tau_{max} - \tau_0 < T' \quad (23)$$

Therefore, the following equation is made up from the equation (22) at the time point t of $t = T' + \tau_0 > \tau_{max}$ for the circuit without defect.

$$i_{DDT}(T' + \tau_0) < I' \quad (24)$$

If the instant value of $I_{DDT}$ at $T' + \tau_0$ is larger than I', that is, if the following equation is satisfied, $$i_{DDT}(T' + \tau_0) > I' = i_{DDT}(\tau_{max}) \quad (25)$$

since $T' + \tau_0$ cannot be larger than $\tau_{max}$ according to the equation (22), the following equations are made up.

$$\tau_{max} > T' + \tau_0 \quad (26)$$

$$t_{pd,max} = \tau_{max} - \tau_0 > T' \quad (27)$$

For the paths having the longest delay time $t_{pd,max}$, the transmission of the signal is late for the system clock. That is, there is a delay fault in the circuit. Therefore, the fact that the transient power supply current $i_{DDT}(T' + \tau_0)$ at the time $T' + \tau_0$ is larger than I' means that there is a delay fault on any side of the activated path. On the other hand, the fact that $i_{DDT}(T' + \tau_0)$ is smaller than I' means that there is no delay fault in the vicinity of the activated path.

No delay fault, $i_{DDT}(T + \tau_0) < I'$

Delay fault is present, $i_{DDT}(T + \tau_0) > I'$ \quad (28)

As described above, a delay fault of a circuit can be tested by comparing the instant value of $I_{DDT}$ at a predetermined time with the $I_{DDT}$ level of the circuit without fault.

Integral of the Transient Power Supply Current

The time integrals $Q_{Sr}$ and $Q_{Sf}$ of the short circuit currents $I_{Sr}$ and $I_{Sf}$, respectively, are given as the following equations (29) and (30), respectively, by the equations (3) and (4).

$$Q_{Sr} = \int_{-\infty}^{\infty} I_{Sr} dt = \frac{I_{Smax}(V_{DD} - V_{THN} - V_{THP})}{2V_{DD}} t_r \quad (29)$$

$$Q_{Sf} = \int_{-\infty}^{\infty} I_{Sf} dt = \frac{I_{Smax}(V_{DD} - V_{THN} - V_{THP})}{2V_{DD}} t_f \quad (30)$$

Therefore, the integral $Q_S$ of the short circuit current flowed in the logic gate during switching is given as the following equation.

$$Q_S = \int_{-\infty}^{\infty} I_S dt = \frac{I_{Smax}(V_{DD} - V_{THN} - V_{THP})}{2V_{DD}} t_T \propto t_T \quad (31)$$

Here, $t_T$ is the transition time of the input signal. That is, the integral $Q_S$ of the short circuit current $I_S$ ($I_{Sr}$ or $I_{Sf}$) is proportional to the transition time $t_T$ of the input signal. Moreover, $Q_S$ does not depend on the transition direction of the input signal whether it is a rising or a falling transition.

The integral $Q_C$ of the charging current of the output load capacitance $C_{load}$ of the CMOS inverter is given as the following equation from the equation (5) and independent of the input transition time $t_T$ of the CMOS inverter.

$$Q_c = \int_{-\infty}^{\infty} I_C dt = \int_{-\infty}^{\infty} C_{load} \frac{dv_{out}(t)}{dt} \quad (32)$$

$$= C_{load}[V_{out}(t)]_{-\infty}^{\infty} = C_{load}(V_{DD} - 0) = C_{load} V_{DD}$$

Therefore, the integrals $Q_{Gf}$ and $Q_{Gr}$ of the transient currents $I_{Gf}$ and $I_{Gr}$ flowed in the logic gate, respectively, are given as the following equations (33) and (34), respectively, by the equations (1), (2), (31) and (32).

$$Q_{Gf} = \int_{-\infty}^{\infty} (I_{Sf} + I_C) dt \quad (33)$$

$$= \frac{I_{Smax}(V_{DD} - V_{THN} - V_{THP})}{2V_{DD}} t_T + C_{load} V_{DD} \propto t_T$$

$$Q_{Gf} = \int_{-\infty}^{\infty} I_{Sr} dt \frac{I_{Smax}(V_{DD} - V_{THN} - V_{THP})}{2V_{DD}} t_T \propto t_T \quad (34)$$

Figure 8:
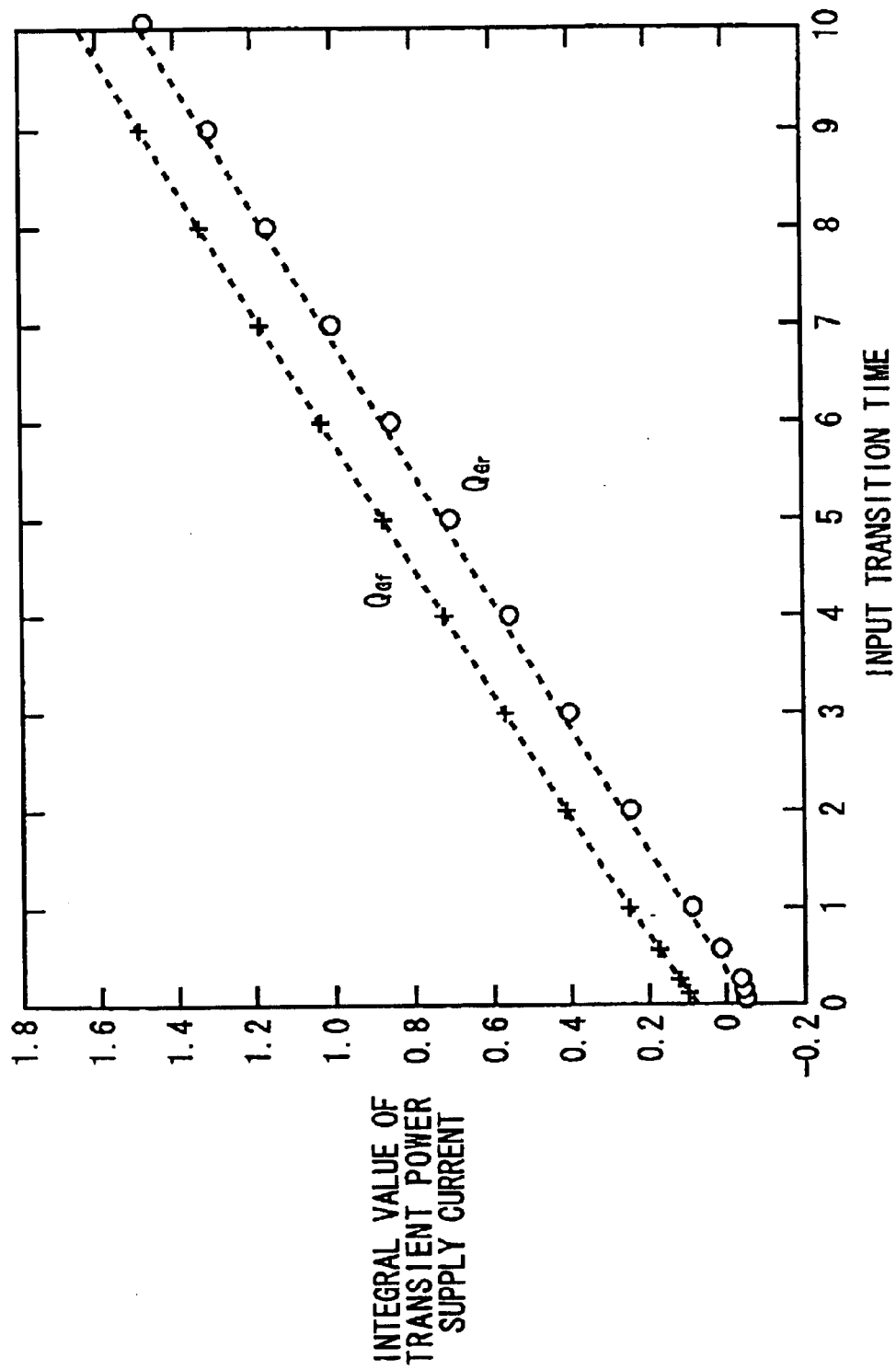
FIG. 8 shows the change of the integral of the transient power supply current for the input transition time of the CMOS inverter.

That is, the integral of the transient current of the logic gate is proportional to the input transition time of the logic gate. FIG. 8 shows the result of simulation for the change of the integral of the transient current of the inverter according to the change of the input transition time of the inverter. It can be known that the equations (33) and (34) are correct from FIG. 8.

The CMOS IC shown in FIG. 3a has serially-formed four (4) inverters G1, G2, G3, and G4 illustrated in FIG. 1c, and the currents $I_{G1}$, $I_{G2}$, $I_{G3}$, and $I_{G4}$ which flow in each of the inverters, respectively, are supplied from one power supply terminal. Therefore, transient power supply current response $I_{DDT}$ of the IC is the sum of the currents which flow in each of the logic gates as shown in FIG. 3c (the equation (6)). Therefore, the integral $Q_{DDT}$ of the transient power supply current $I_{DDT}$ is the sum of the integrals $Q_{Gn}$ (1<n<N) of the currents which flow in each of the logic gates as the equation (35). N is the number of logic gates switched by the inputted test pattern sequence and N is 4 (four) for the example of FIG. 3a.

$$Q_{DDT} = \int_{-\infty}^{\infty} I_{DDT} dt \quad (35)$$

$$= \int_{-\infty}^{\infty} \left( \sum_{n=1}^{N} I_{Gn} \right) dt = \sum_{n=1}^{N} \int_{-\infty}^{\infty} I_{G_{th}} dt = \sum_{n=1}^{N} Q_{Gn}$$

In the example illustrated in FIG. 3a, the integral $Q_{DDT}$ of the transient power supply current $I_{DDT}$ is the sum of the integrals $Q_{G1}$, $Q_{G2}$, $Q_{G3}$, and $Q_{G4}$ of the currents $I_{G1}$, $I_{G2}$, $I_{G3}$, and $I_{G4}$ which flow in each inverter.

Since the integral $Q_{Gn}$ (1<n<N) of the current which flows in each of the logic gates is proportional to the input transition time $t_{Tn}$ (1<n<N) as shown in equation (33) or (34), $Q_{DDT}$ is given as a linear polynominal expression of $t_{Tn}$ (1<n<N). For example, $Q_{DDT}$ is given as a linear polynominal expression (36) of the input transition times $t_{T1}$, $t_{T2}$, $t_{T3}$ and $t_{T4}$ of the inverters G1, G2, G3, and G4 according to the example shown in FIG. 3.

$$Q_{DDT} = \sum_{n=1}^{N} Q_{Gn} = \sum_{n=1}^{N} Q_{Sn} + \sum_{n=1}^{N} Q_{Cn} = \sum_{n=1}^{N} a_n t_{Tn} + b \quad (36)$$

For the equation (36), $a_n$ is the proportional coefficient between the integral $Q_{Sn}$ of the short circuit current of the logic gate $G_n$ and the input transition time $t_{Tn}$ of the logic gate $G_n$, and b is an constant term which is the sum of the charging current $Q_{Cn}$ flowed into each of the logic gates.

Open Defect (Using the Integral of the Transient Power Supply Current)

Using this principle, an open defect and a delay fault due to the open defect of the path to be tested may be detected.

An open defect can be modeled by the large resistance $R_{open}$ because the minute current flows through the defect. FIG. 9a shows an example of a CMOS inverter having an open defect in the input. When the signal transition shown in FIG. 9b is generated on the input signal line A, the signal transition of the signal line A' following the open point becomes late as shown in FIG. 9c. At this time, the signal transition time $t_T$ of the signal line A' is given as the following equation when $R_{open}$ is the resistance of the open defect and $C_{in}$ is the parasitic capacitance of the input of the inverter.

$$t_T = t_{T,typ} + 2.2 R_{open} C_{in} \quad (37)$$

Here, $t_{T, typ}$ is the typical value of the transition time of the input signal when there is no defect, and the transition $t_T$ is the time needed to ascend the voltage value from 0.1 $V_{DD}$ to 0.9 $V_{DD}$ (or, descend the voltage value from 0.9 $V_{DD}$ to 0.1 $V_{DD}$). 2.2 $R_{open} C_{in}$ is the value obtained by $\log_e (0.9 V_{DD}/0.1 V_{DD}) \times R_{open} C_{in}$ when $C_{in}$ changes from 0.1 $V_{DD}$ to 0.9 $V_{DD}$. That is, the increment of the transition time of the input signal of the inverter is proportional to the resistance $R_{open}$ of the open defect. Therefore, when there is an open defect of the input of the kth inverter on the path to be tested, the integral $Q_{DDT}$ of the power supply of the CMOS IC is obtained by the equation (38) according to the equations (36) and (37), $Q_{DDT}$ changes linearly according to the resistance $R_{open}$ of the open defect, and the increment thereof is proportional to the resistance $R_{open}$ of the open defect.

$$Q_{DDT} = \sum_{n=1}^{N} a_n T_{Tn} + b = \left(\sum_{n=1}^{N} a_n t_{nTYP} + b\right) + 2.2 a_k C_{in} R_{open} \quad (38)$$

Figure 10:
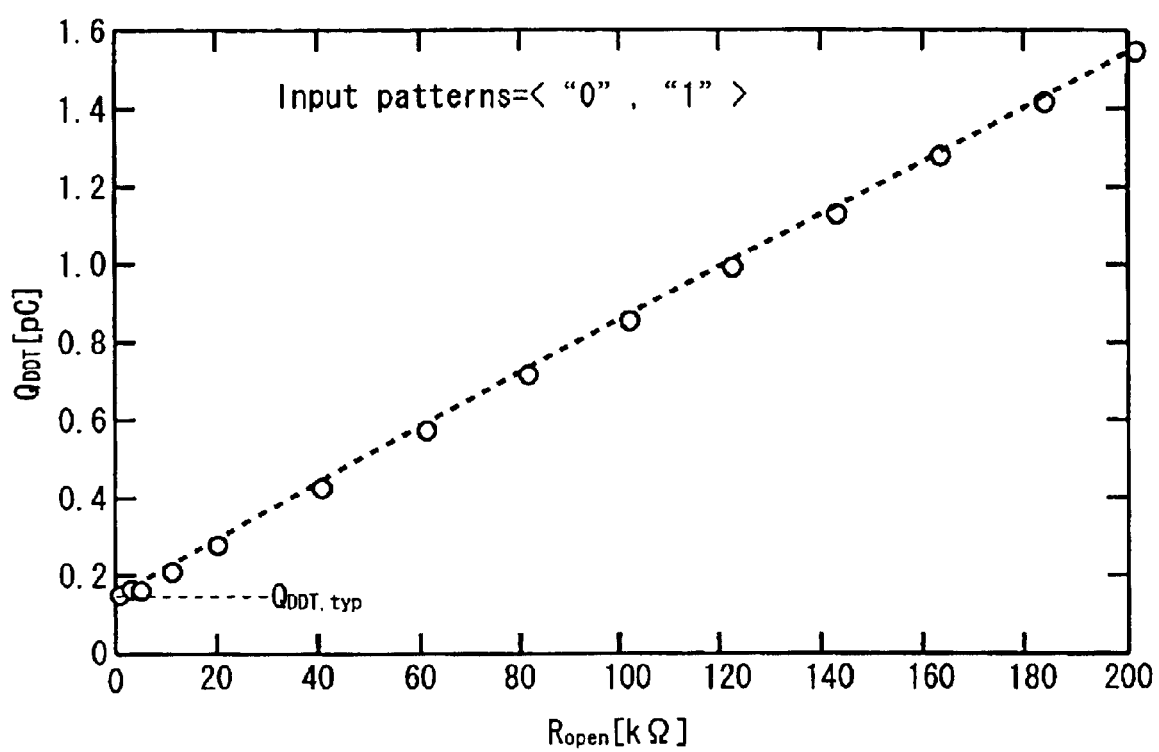
FIG. 10 shows the change of the integral $Q_{DDT}$ of the transient power supply current for the resistance $R_{open}$ for the small open defect present in the CMOS IC.

Here, $Q_{DDT,\,typ}$ is the typical value of the integral of the power supply current when there is no defect. $2.2\ a_k C_{in} R_{open}$ of the second term of the right side of the equation (38) is an additional amount according to the input open defect of the kth inverter. This equation (38) corresponds to the result of simulation of the change of $Q_{DDT}$ for $R_{open}$. FIG. 10 plots the change of $Q_{DDT}$ for the resistance $R_{open}$ of the open defect when there is an open defect on input signal line IN2 of the inverter G2 for the circuit shown in FIG. 3.

Figure 11:
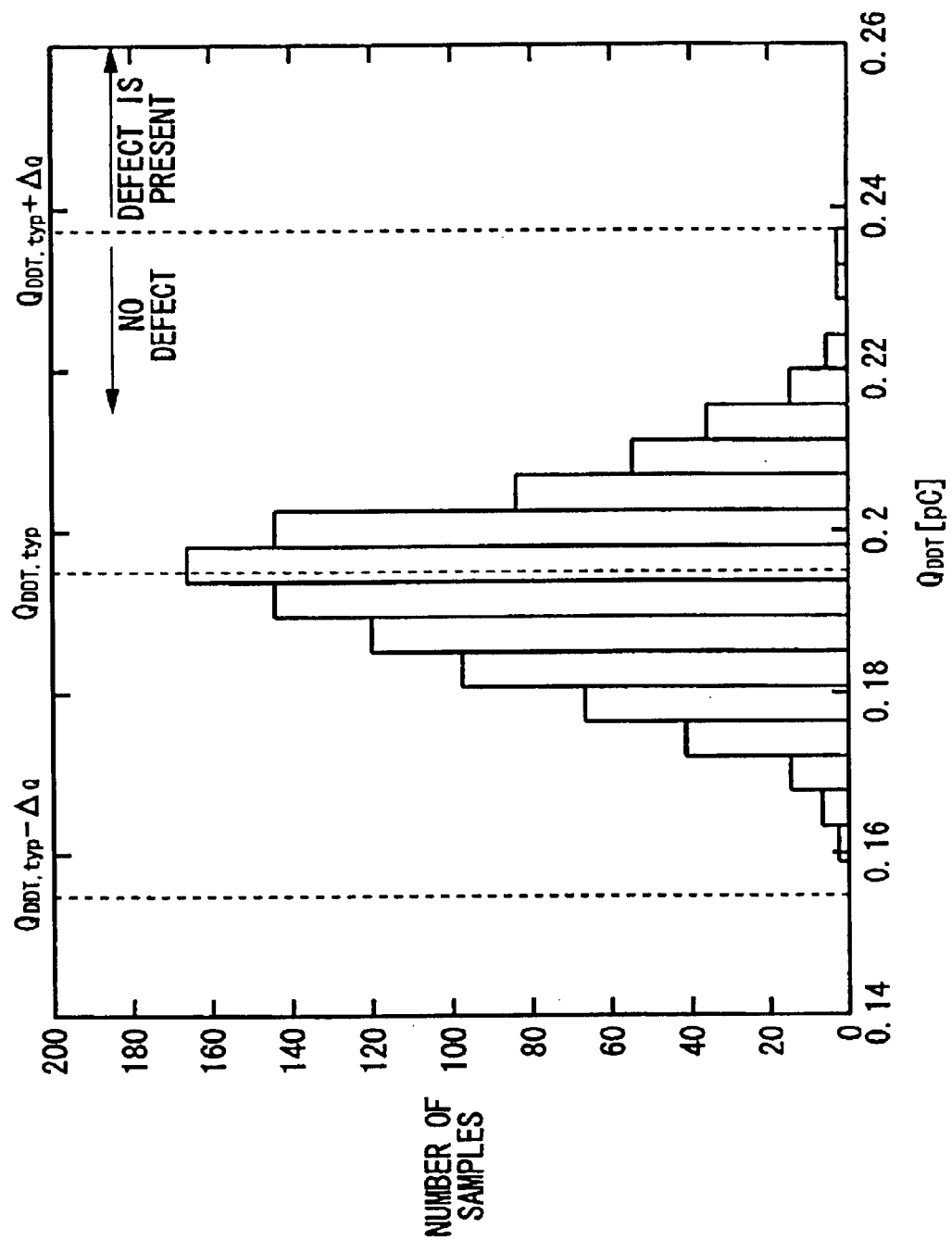
FIG. 11 is a bar graph showing the distribution of the transient power supply current of the CMOS IC for the difference of the CMOS fabrication process.

Therefore, an open defect present on the input end of the logic gate on the path under test can be tested by measuring the integral $Q_{DDT}$ of the transient power supply current and comparing it to the integral $Q_{DDT,typ}$ of the transient power supply current of the circuit without defect. According to the actual CMOS fabrication process, the integral of the transient power supply current changes in the range of $Q_{DDT,typ} \pm \Delta_Q$ due to the difference of the process parameter as shown in FIG. 11. Here, $\Delta_Q$ is the change amount of the integral of the transient power supply current. Therefore, when $Q_{DDT}$ is larger than the maximum value $Q_{DDT,typ} + \Delta_Q$ of the integral of the transient power supply current which can be generated in the circuit without defect, it is possible to determine that there is an open defect on the path under test. That is, $Q_{DDT}$ which is smaller than $Q_{DDT,typ} + \Delta_Q$ indicates that there is no open defect in the CMOS IC, and $Q_{DDT}$ which is larger than $Q_{DDT,typ} + \Delta_Q$ indicates that there is an open defect in the CMOS IC.

No open defect, $Q_{DDT} < Q_{DDT,typ} + \Delta_Q$

Open defect is present, $Q_{DDT} > Q_{DDT,typ} + \Delta_Q$ \quad (39)

Here, $Q_{DDT,typ}$ and $\Delta_Q$ can be obtained by the simulation for the process change.

Method for Detecting a Delay Fault (Using the Integral of the Transient Power Supply Current)

Next, a method for detecting a delay fault using the integral of the transient power supply current as mentioned above is described in detail. This method is to evaluate a delay fault by measuring the integral of the transient power supply current of the circuit under test and comparing it to a predetermined value.

The gate delay time $t_{gd}$ of the logic gate is proportional to the transition time $t_T$ of the input signal as shown in equation (40).

$$t_{gd} = t_{gd,step} + \frac{1}{6}\left(1 - 2\frac{V_{TH}}{V_{DD}}\right)t_T \quad (40)$$

Here, $t_{gd,step}$ is the delay time of the step input of transition time 0 of the inverter without defect. $V_{TH}$ is a threshold voltage of p-MOS or n-MOS, and $V_{TH}=V_{THN}$ for the rising edge of the input and $V_{TH}=V_{THP}$ for the falling edge of the input. Therefore, gate delay time $t_{gd}$ of the logic gate having an open defect which can be modeled by the resistance $R_{open}$ on the input signal line is obtained by the following equation by substituting the equation (37) to the equation (40) since the input transition time of the logic gate is given as the equation (37).

$$\begin{aligned}
t_{gd} &= t_{gd,step} + \frac{t_T}{6}\left(1 - 2\frac{V_{TH}}{V_{DD}}\right) \\
&= t_{gd,step} + \frac{t_{T,typ} + 2.2 R_{open} C_{in}}{6}\left(1 - 2\frac{V_{TH}}{V_{DD}}\right) \\
&= t_{gd,step} + \frac{t_{T,typ}}{6}\left(1 - 2\frac{V_{TH}}{V_{DD}}\right) + \frac{2.2 C_{in}}{6}\left(1 - 2\frac{V_{TH}}{V_{DD}}\right) R_{open} \\
&= t_{gd,step} + \frac{2.2 C_{in}}{6}\left(1 - 2\frac{V_{TH}}{V_{DD}}\right) R_{open} \propto R_{open}
\end{aligned} \quad (41)$$

Here, $t_{gd,typ}$ is a typical value of the gate delay time of the logic gate without defect. That is, the gate delay time $t_{gd}$ changes by the resistance $R_{open}$ of the defect, and the increment $\delta$ of the gate delay time is proportional to the resistance $R_{open}$ of the defect. Therefore, when there are open defects on some logic gates on the path under test, path delay time $t_{pd}$ is also proportional to $R_{open}$. This can be expressed in equation (42) by substituting the equation (41) to the equation (10).

$$\begin{aligned}
t_{pd} &= \sum_{i=1}^{m} t_{gdi} \\
&= \sum_{i=1}^{m} t_{gdi,typ} + \frac{2.2 C_{ink}}{6}\left(1 - 2\frac{V_{DD}}{V_{TH}}\right) R_{open} t_{pd,typ} + \\
&\quad \frac{2.2 C_{ink}}{6}\left(1 - 2\frac{V_{DD}}{V_{TH}}\right) R_{open} \propto R_{open}
\end{aligned} \quad (42)$$

Figure 12:
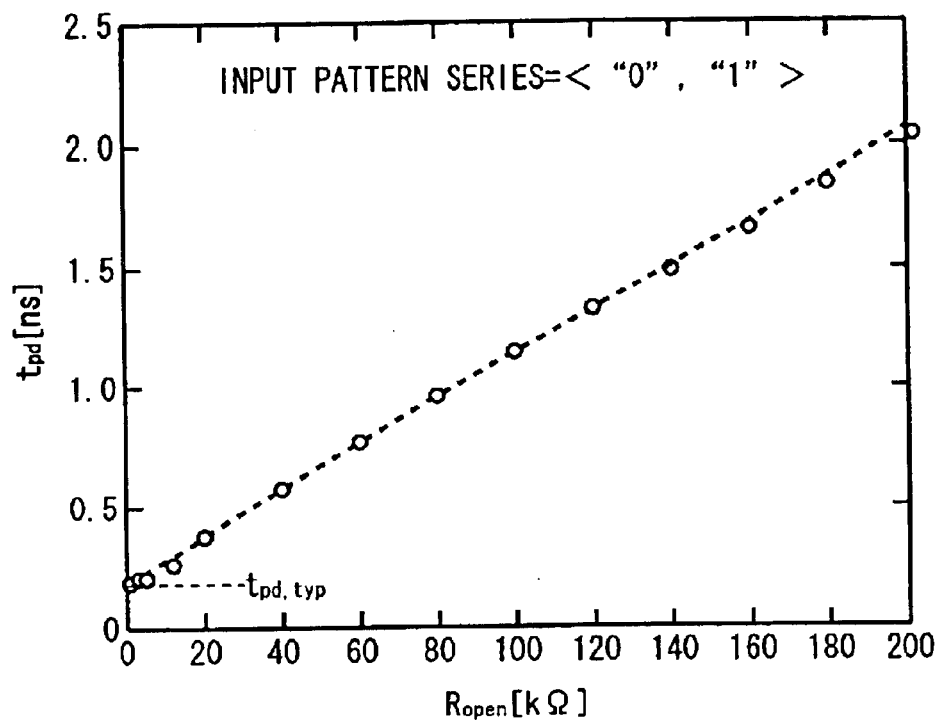
FIG. 12 illustrates the change of path delay time $t_{pd}$ of the path under test for the resistance $R_{open}$ of the small open defect present on the path under test of the CMOS IC.

This corresponds to the simulation result of the change of $t_{pd}$ for $R_{open}$ as shown in FIG. 12. FIG. 12 plots the change of $t_{pd}$ for the resistance $R_{open}$ of the open defect when there is an open defect on input signal line IN2 of the inverter G2 for the circuit shown in FIG. 3a.

The integral $Q_{Sk}$ of the short circuit current of $G_k$, when there is an open defect on the input of the logic gate $G_k$ on the path P, is given as the following equation from the equations (31) and (37).

$$\begin{aligned}
Q_{Sk} &= \frac{I_{S\max}(V_{DD} - V_{THN} - V_{THP})}{2V_{DD}} t_{Tk} \\
&= \frac{I_{S\max}(V_{DD} - V_{THN} - V_{THP})}{2V_{DD}} (t_{T,typ} + 2.2 R_{open} C_{ink}) \\
&= \frac{I_{S\max}(V_{DD} - V_{THN} - V_{THP})}{2V_{DD}} t_{T,typ} + \\
&\quad \frac{I_{S\max}(V_{DD} - V_{THN} - V_{THP})}{2V_{DD}} 2.2 R_{open} C_{ink} \\
&= Q_{sk,\,typ} + \frac{2.2 I_{S\max}(V_{DD} - V_{THN} - V_{THP}) C_{ink}}{2V_{DD}} R_{open}
\end{aligned}$$

Therefore, the integral $Q_{DDT}$ of the transient power supply current of the IC becomes the following equation, and it is also proportional to the resistance $R_{open}$ of the open defect.

$$\begin{aligned}
Q_{DDT} &= \sum_{n=1}^{N} Q_{Gn} \\
&= \sum_{n=1}^{N} Q_{Sn} += \sum_{n=1}^{N} Q_{Gn} \\
&= \sum_{n \neq k} Q_{Sn,typ} + Q_{Sk,typ} +
\end{aligned} \quad (43)$$

-continued $$\frac{2.2I_{Smax}(V_{DD} - V_{THN} - V_{THP})C_{ink}}{2V_{DD}} R_{open} + \sum_{n=1}^{N} Q_{Cn}$$

$$= \sum_{n=1}^{N} Q_{Sn,typ} + \sum_{n=1}^{N} Q_{Cn} +$$

$$\frac{2.2I_{Smax}(V_{DD} - V_{THN} - V_{THP})C_{ink}}{2V_{DD}} R_{open}$$

$$= Q_{DDT,typ} + \frac{2.2I_{Smax}(V_{DD} - V_{THN} - V_{THP})C_{ink}}{2V_{DD}} R_{open}$$

Figure 13:
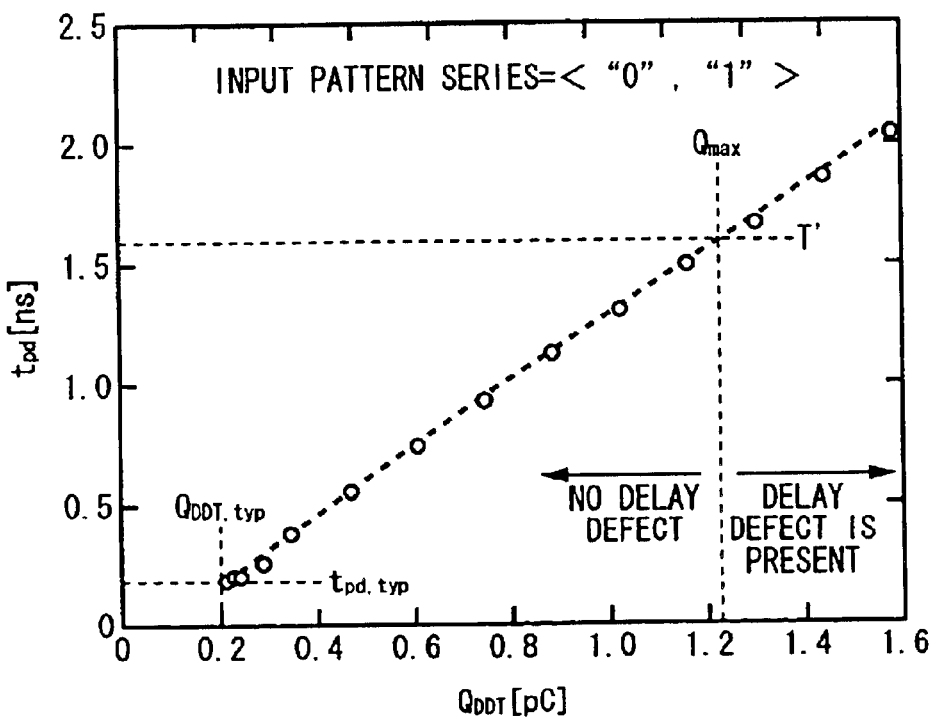
FIG. 13 shows the linearity between the path delay time $t_{pd}$ and the integral $Q_{DDT}$ of the transient power supply current of the CMOS IC.

Therefore, according to the equations (42) and (43), the delay time $t_{pd}$ of the path P having an open defect changes linearly to the integral $Q_{DDT}$ of the transient power supply current of the CMOS IC. This corresponds to the simulation result of the change of $t_{pd}$ for $Q_{DDT}$ as shown in FIG. 13. FIG. 13 plots the change of $t_{pd}$ for the integral $Q_{DDT}$ of the transient power supply current when there is an open defect on input signal line IN2 of the inverter G2 for the circuit shown in FIG. 3a.

The equation (44) is obtained by substituting $R_{open}$ obtained from the equation (43) to the equation (42).

$$t_{pd} = t_{pd,typ} + \frac{2.2C_{ink}}{6}\left(1 - 2\frac{V_{TH}}{V_{DD}}\right)R_{open} \quad (44)$$

$$= t_{pd,typ} +$$

$$\frac{2.2C_{in}}{6}\left(1 - 2\frac{V_{TH}}{V_{DD}}\right)\frac{(Q_{DDT} - Q_{DDT,typ}) \cdot 2V_{DD}}{2.2I_{Smax}(V_{DDT} - V_{THN} - V_{THP})C_{ink}}$$

$$= t_{pd,typ} + \frac{V_{DD} - 2V_{TH}}{3I_{Smax}(V_{DDT} - V_{THN} - V_{THP})}(Q_{DDT} - Q_{DDT,typ})$$

If the integral $Q_{max}$ of the transient power supply current when the path delay time $t_{pd}$ is the maximum permissible value T', $Q_{max}$ is obtained as the following equation when $t_{pd}$=T', $Q_{DDT}$=$Q_{max}$ for the equation (44).

$$Q_{max} = Q_{DDT,typ} + \frac{3I_{Smax}(V_{DDT} - V_{THN} - V_{THP})}{V_{DD} - 2V_{TH}}(T' - t_{pd,typ}) \quad (45)$$

$Q_{max}$ is the maximum value of the integral $Q_{DDT}$ of the transient power supply current of the CMOS IC having no open defect. That is, it can be determined that there is no delay fault when $Q_{DDT}$ is smaller than $Q_{max}$, and the delay fault due to the open defect is present when $Q_{DDT}$ is larger than $Q_{max}$.

No delay fault, $Q_{DDT} < Q_{max}$

Delay fault is present, $Q_{DDT} > Q_{max}$ (46)

As described above, a delay fault of a circuit can be tested by comparing the integral $Q_{DDT}$ of the transient power supply current pulse to a predetermined value $Q_{max}$. The predetermined value $Q_{max}$ can be obtained by circuit simulation or the statistics using the equation (45).

Characteristics of the Delay Fault Testing Using Transient Power Supply Current

The transient power supply current is the transient current which flows in the power supply pin of the IC, and it can be observed more easily than the voltage signal. Therefore, the delay fault testing method using a transient power supply current is superior to the delay fault testing method using voltage signal for the function of detecting delay faults. For example, the delay fault testing method using voltage signal can only detect the delay fault if the voltage signal is transmitted to the output signal line of the IC, while the delay fault testing method using transient power supply current can detect the delay fault if the voltage signal in not transmitted to the output signal line of the IC because the transient power supply current signal having a pulse width corresponding to the delay time of transmitted path can be observed. Moreover, the delay fault testing method using transient power supply current has less limitations for test pattern generation than the delay fault testing method using voltage signal because there is no need to transmit to the output signal line for the voltage signal. Therefore, the test pattern can be generated easily. For an extreme case, if the test pattern sequence is selected at random, it is possible to detect the delay fault of the path activated by the selected test pattern sequence using the delay fault testing method using transient power supply current.

Method for Generating Fault List (Logic Gate)

Figure 14:
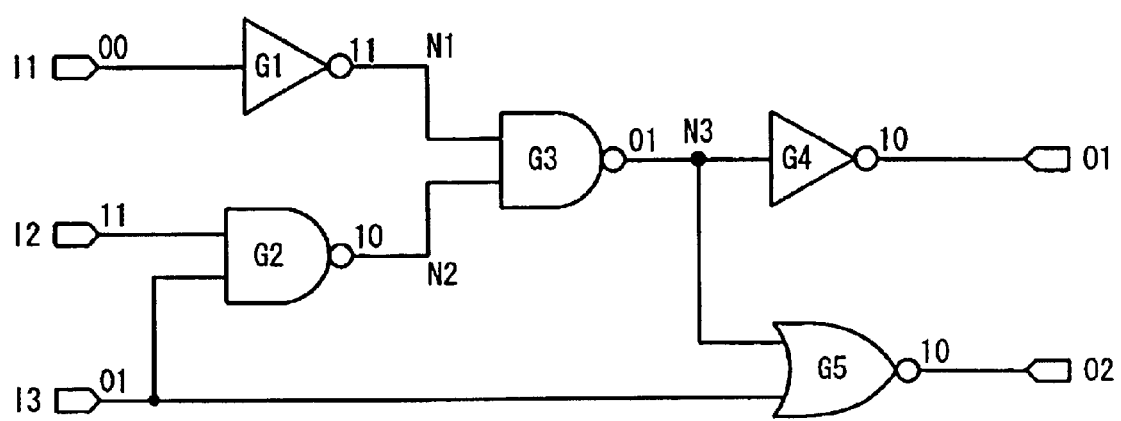
FIG. 14 is a circuit diagram of an example CMOS IC to be tested.

Next, a method for generating fault list is explained. FIG. 14 illustrates an example CMOS IC to be tested. This IC has three (3) input terminals I1, I2 and I3, two (2) output terminals O1 and O2, three (3) internal signal node N1, N2 and N3, and five (5) logic gates G1, G2, G3, G4 and G5. The input terminal I1 is connected to the input of the inverter logic gate G1, the output terminal thereof is connected to one of the input sides of the NAND logic gate G3 through the node N1, the input terminals I2 and I3 are connected to the input side of the NAND logic gate G2, the output terminal thereof is connected to one of the input sides of logic gate G3 through the node N2, the output terminal thereof is connected to one of the input sides of the NOR logic gate G5 and the input side of the inverter logic gate G4 through the node N3, the input terminal I3 is connected to one of the input sides of logic gate G5, and the output terminals O1 and O2 are connected to each of the output sides of the logic gates G4 and G5, respectively. Moreover, the logic gates G1, G2, G3, G4 and G5 are connected to a common power supply terminal.

An example of the fault simulation result conducted on the above CMOS IC to be tested is shown in FIG. 15. In FIG. 15, the first column indicates the identifier(s) of the test pattern sequence. The second column of FIG. 15 illustrates the input signals (test pattern sequence) applied to the input terminals I1, I2 and I3 of the CMOS IC, the third column shows the signals generated on the internal signal nodes N1, N2 and N3 of the CMOS IC without fault when each test pattern sequence is applied, and the fourth column shows the signals generated on the output terminals O1 and O2 of the CMOS IC without fault when each test pattern sequence is applied. Here, signals "0", "1", "R" and "F" of the second to the fourth columns of FIG. 15 indicate each of the signals <"0", "0"> (the first element in < > is the start signal value and the second element is the final signal value) which is always low, <"1", "1"> which is always high, <"0", "1"> which is a rising signal from a low level to a high level, and <"1", "0"> which is a falling signal from a high level to a low level, respectively. Therefore, each test pattern sequence is composed of two test patterns, for example, the test pattern sequence T1="00R" means I1, I2, I3=<"000", "001">. That is "000" and "001" are test patterns, and the columns of "000" and "001" are test pattern sequence. The fifth column of FIG. 15 shows the set of the faulty logic gate (fault location list) detectable by the test using transient power supply current when each test pattern sequence is applied.

When a logic gate has a delay fault or an open defect, the transient power supply current becomes abnormal because the switching operation is delayed and thus the transient power supply current waveform changes. Therefore, whether the logic gate which switches by the input test pattern sequence has a fault or not can be determined by applying the test pattern sequence and measuring the transient power supply current whether it is abnormal or not. For example, if the test pattern sequence T2 is applied to the CMOS IC shown in FIG. 14, transition signals are generated on the internal signal node (signal line) N2 and N3 and the output terminals O1 and O2 by the switching operation of the logic gates G2, G3, G4 and G5, whose logic states are shown in FIG. 14, in the CMOS IC to be tested. Therefore, when there is a fault on any of the logic gates G2, G3, G4 and G5, the abnormality of the transient power supply current is detected by the transient power supply current testing having test pattern sequence T2. Thus, a fault of logic gates of G2, G3, G4 and G5 can be detected by the transient power supply current testing having test pattern sequence T2. Then, a fault location list for the test pattern sequence (a list of the gates that the fault is detectable) T2 is obtained as GT2={G2, G3, G4, G5} by the fault simulation as described above.

Method of Presuming a Fault Location (Logic Gate)

Next, a method of presuming a fault location is described in detail. For example, it is considered that the transient power supply current shows abnormality for all the test pattern sequence when the test pattern sequence T2, T4 and T6 is applied to the CMOS IC to be tested shown in FIG. 14. According to the result of the fault simulation, a set of the faulty logic gates, i.e. a fault location list detectable by each of the test pattern sequence T2, T4 and T6 is GT2={G2, G3, G4, G5}, GT4={G2} and GT6={G2, G3, G4}, respectively. Therefore, the presumed logic gate to be faulty is the common element of the fault location lists GT2, GT4 and GT6, i.e. the intersection of the sets GT2, GT4 and GT6.

$$GT2\ GT4\ GT6=\{G2\} \tag{47}$$

Therefore, the Faulty Logic Gate is Presumed to be G2.

Moreover, the faulty logic gate G2 can be presumed by excluding the points (fault-free location) which are not included in the fault location lists GT6 and GT4 from the fault location list GT2={G2, G3, G4, G5} of the test pattern sequence T2 which is set to the standard fault location list. The fault location list that the abnormality of the transient power supply current is detected first is set as the standard fault location list as the following.

{G2, G3, G4, G5}

Next, the fault-free locations {G1, G5} which are not included in the fault location list GT6 which is generated next are excluded from the standard fault location list GT2. Here, the list of the fault-free locations is indicated as the complementary set of the fault location list GT6 (it is denoted by~GT6). Therefore, the standard fault location list becomes the following by excluding G5.

{G2, G3, G4}

That is, the only elements which correspond GT6 among GT2 remain. Then, the fault-free locations ~GT4={G1, G3, G4, G5} which are not included in the fault location lists GT4 are similarly excluded from the standard fault location list. Then, the standard fault location list becomes the following.

{G2}

Therefore, the Faulty Logic Gate is Presumed to be G2.

Next, it is assumed that the transient power supply current shows abnormality when the test pattern sequence T10 is applied and the transient power supply current is normal when the test pattern sequence T6 is applied to the CMOS IC to be tested shown in FIG. 14. Here, T10 is referred to as an abnormal test pattern sequence, and T6 as a normal test pattern sequence. According to the result of the fault simulation, a set of the faulty logic gates, i.e. a fault location list detectable by each of the test pattern sequence T10 and T6 is GT10={G1, G3, G4} and GT6={G2, G3, G4}, respectively. Here, the fault locations included in the fault location list GT6 is referred to as the normal locations. That is, the faulty logic gate is any one of the logic gates in the fault location list GT10, and not the ones in the fault location list GT6. Therefore, the presumed logic gate to be faulty is present as the intersection of the set GT10 and the complementary set of GT6.

$$GT10\ \sim GT6=\{G1, G3, G4\}\ \{G1, G5\}=\{G1\} \tag{48}$$

Then, the faulty logic gate is presumed to be G1. The method as described above is equivalent to the method of excluding the fault-free location included in the fault location list GT6 from the fault location list GT10 .

As described above, the fault location can be presumed in terms of the logic gate. However, the present invention is not limited to presume the fault location in terms of the logic gate, it is possible to presume the fault location in terms of the signal line by the fault simulation on the assumption that the fault is present on the signal line in the IC.

Method of Generating a Fault Location List (Signal Line)

Figure 16:
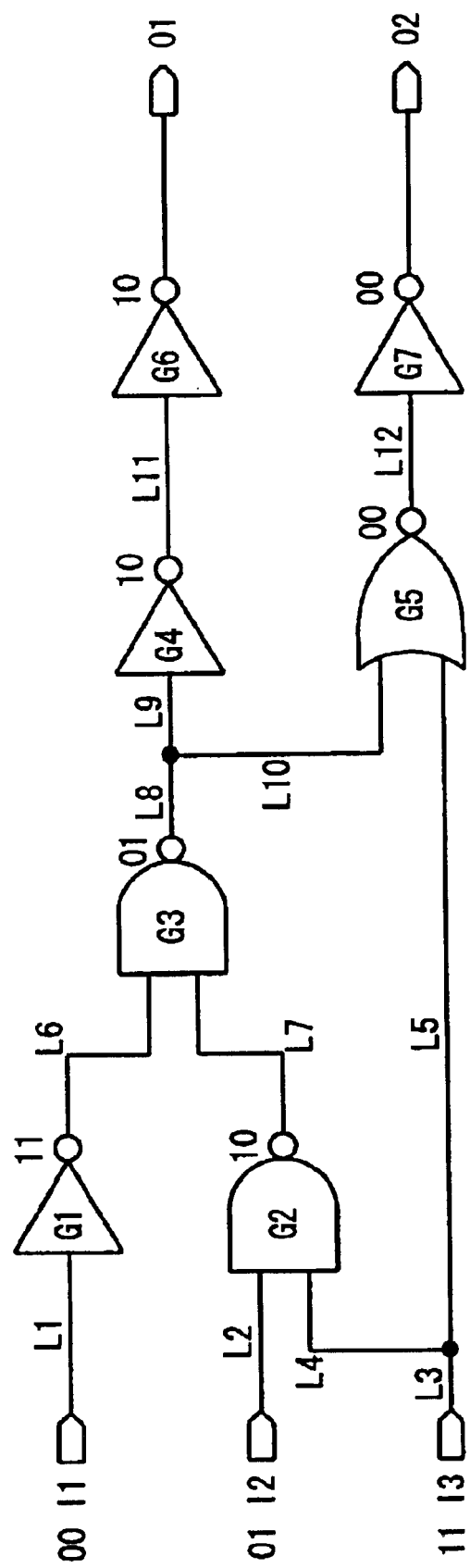
FIG. 16 is a circuit diagram of another example CMOS IC to be tested.

FIG. 16 illustrates an example CMOS IC to be tested. This IC has three (3) input terminals I1, I2 and I3, two (2) output terminals O1 and O2, five (5) logic gates G1, G2, G3, G4 and G5, and twelve (12) signal lines L1, L2, . . . , L12. Here, the signal lines include input/output signal lines and the branch signal line is denoted as the separate signal line. The output signal lines L11 and L12 are connected to the output buffer G6 and G7, respectively. The input terminal I1 is connected to the input side of the inverter logic gate G1 through the signal line L1, each of the input terminals I2 and I3 is connected to the input side of the NAND logic gate G2 through each of the signal lines L2, L3 and L4, respectively, each of the output sides of the logic gates G1 and G2 is connected to the input side of the NAND logic gate G3 through each of the signal lines L6 and L7, respectively, the output side of the logic gate G3 is connected to the input side of the inverter logic gate G4 through the signal lines L8 and L9 and to one of the input sides of the NOR logic gate G5 through the signal lines L8 and L10, the input terminal I3 is connected to one of the input sides of the logic gate G5 through the signal lines L3 and L5, the output side of the logic gate G4 is connected to the output terminal O1 through the signal line L11 and the buffer G6, and the output side of the logic gate G5 is connected to the output terminal O2 through the signal line L12 and the buffer G7. Though it is not shown in the figure, the power supply terminals of the logic gates G1, G2, G3, G4 and G5 and the output buffers G6 and G7 are connected to a common power supply.

An example of the fault simulation result conducted on the above CMOS IC to be tested is shown in FIG. 17. In FIG. 17, the first column indicates the identifier(s) of the test pattern sequence. The second column of FIG. 17 illustrates the input signals applied to the input terminals I1, I2 and I3 of the CMOS IC, the third column shows the signals generated on the signal lines L1, L 2, . . . , L12 of the CMOS IC, and the fourth column shows the signals generated on the output terminals O1 and O2 of the CMOS IC. Here, signals "0", "1", "R" and "F" of the second to the fourth columns of FIG. 17 indicate each of the signals <"0", "0"> (the first element in < > is the start signal value and the second element is the final signal value) which is always low, <"1", "1"> which is always high, <"0", "1"> which is a rising signal from a low level to a high level, and <"1", "0"> which is a falling signal from a high level to a low level, respectively. Therefore, each test pattern sequence is composed of two test patterns, for example, the test pattern sequence T1="00 R" means I1I2I3 =<"000","001">. The fifth column of FIG. 17 shows the set of the defective signal lines detectable by the test using transient power supply current when each test pattern sequence is applied, i.e. the fault location list. When a signal line has an open defect, the transient power supply current of the IC to be tested becomes abnormal because the switching operation of the logic gate whose input is provided through the defective signal line and thus the transient power supply current waveform of the logic circuit changes. Therefore, by applying the test pattern sequence and measuring the transient power supply current whether it is abnormal or not, it can be determined whether the logic circuit has a defect or not for the signal line whose switching operation is occurred by the input test pattern sequence when the logic gate whose input is provided from the above signal switches.

For example, if the test pattern sequence T6 is applied to the CMOS IC shown in FIG. 16, the signal lines L2, L7, L8, L9, L10 and L11 of the CMOS IC to be tested switches and thus the logic gates G2, G3 and G4 and the buffer G6 switches as denoted by signal 0 or 1 of each point in the figure. The signal line L10 switches but the logic gate G5 whose input is the signal line 10 does not switch. Therefore, when there is a defect on any of the signal lines L2, L7, L8, L9 and L11, the abnormality of the transient power supply current is detected by the transient power supply current testing having test pattern sequence T6. Thus, a fault location list for the test pattern sequence T6 is obtained as LT6={L2, L7, L8, L9, L11} by the fault simulation as described above.

Method of Presuming a Fault Location (Signal Line)

Next, a method of presuming a fault location according to the fault analysis method of the present invention is described in detail. For example, it is considered that the transient power supply current shows abnormality for all the test pattern sequence when the test pattern sequence T1, T2 and T6 is applied to the CMOS IC to be tested shown in FIG. 16. According to the result of the fault simulation (FIG. 17), a set of the defective signal lines, i.e. a fault location list (the internal signal lines where a defect may be detected) detectable by each of the test pattern sequence T1, T2 and T4 is LT1={L3, L5, L12}, LT2={L3, L4, L5, L7 L8, L9, L10, L11, L12} and LT4={L3, L4}, respectively. Therefore, the presumed signal lines to be defective are the common elements of the sets LT1, LT2 and LT4.

$$LT1 \; LT2 \; LT4 = \{L3\} \qquad (49)$$

Therefore, the Defective Signal Line is Presumed to be L3.

Moreover, the defective signal line L3 can be presumed by excluding the points (fault-free locations) which are not included in the fault location lists LT1 and LT4 from the fault location list LT2={L3, L4, L5, L7, L8, L9, L10, L11, L12} of the test pattern sequence T2 which is set to the standard fault location list. First, the standard fault locations LT2 is considered as the following.

{L3, L4, L5, L7, L8, L9, L10, L11, L12}

Next, the fault-free locations {L1, L2, L4, L6, L7, L8, L9, L10, L11} which are not included in the fault location list LT1 are excluded from the standard fault location list. Here, the list of the fault-free locations is present as the complementary set of the fault location list LT1 (it is denoted by ~LT1). Therefore, the standard fault location list becomes the following by excluding L4, L7, L8, L9, L10 and L11.

{L3, L5, L12}

Then, the fault-free locations, that is, LT4={L1, L2, L5, L6, L7, L8, L9, L10, L11, L12} which are not included in the fault location list LT4 are similarly excluded from the standard fault location list. Then, the standard fault location list becomes the following.

{L3}

Therefore, the fault location is presumed to be L3.

Next, it is assumed that the transient power supply current shows abnormality when the test pattern sequence T10 is applied and the transient power supply current is normal when the test pattern sequence T6 or T12 is applied to the CMOS IC to be tested shown in FIG. 16. Here, T10 is referred to as an abnormal test pattern sequence, and T6 and T12 as normal test pattern sequence. According to the result of the fault simulation, a set of the defective signal lines, i.e. a fault location list detectable by each of the test pattern sequence T10, T6 and T12 is LT10={L1, L6, L8, L9, L11}, LT6={L2, L7, L8, L9, L11} and LT12={L1}, respectively. Here, the fault locations included in the fault location list LT6 and LT12 are called as the normal locations. That is, the defective signal line is any one of the signal lines in the set LT10, and not the ones in the set LT6 or LT12. Therefore, the presumed signal line to be defective is present as the intersection of the set LT10, the complementary set of LT6 (LT6={L1, L3, L4, L5, L6, L10, L12}) and the complementary set of LT12 (LT12={L2, L3, L4, L5, L6, L7, L8, L9, L10, L11, L12}) as the following equation.

$$LT10 \sim LT6 \sim LT12 = \{L6\} \qquad (50)$$

Then, the defective signal line is presumed to be L6. The method as described above is equivalent to the method of excluding the fault-free locations included in the fault location lists LT6 and LT12 from the fault location list LT10.

As described above, the fault location can be presumed in terms of the signal line. However, the present invention is not limited to presume the fault location in terms of the signal line where the logic gate is connected, it is possible to presume the fault location for the signal lines in the logic gate by the fault simulation on the assumption that the fault is present on the signal line in the logic gate.

Method of Presuming a Fault Location (Signal Transmission Path)

It is possible to presume the fault location in terms of the signal transmission path. Generation of the fault location list of this case is now described. Switching status of each part on each of the signal transmission paths for each of the test pattern sequence is examined from the contents of the memory device where the result of the logic simulation is stored, and if all of the parts on a signal transmission path for a test pattern switches, then the test pattern sequence and the signal transmission paths are registered to the fault list. For example, in the logic simulation in terms of the logic gate, each of the input terminals, internal nodes and output terminals changes for each of the test pattern sequence as shown in FIG. 15 in the case of the semiconductor IC shown in FIG. 14. Therefore, in a case that the signal transmission path is <I1, N1, N3, O1>, I1 is R, N1 is F, N3 is R and O1 is F for the test pattern sequence T9, from the result of the logic simulation in the memory device, which means all of the parts on the path are switching. In addition, I1 is R, N1 is F, N3 is R, 01 is F for the test pattern sequence T10 and T11, which means all of the parts on the path are switching. Therefore, test pattern sequence T9, T10 and T11 for the signal transmission path <I1, N1, N3, O1> are registered to the fault list or the path <I1, N1, N3, O1> is registered for each of the test pattern sequence T9, T10 and T11. In the logic simulation in terms of the internal signal line, each of the input terminals, internal signal lines and output terminals changes for each of the test pattern sequence as shown in FIG. 17 in the case of the semiconductor IC shown in FIG. 16. For example, in a case that the signal transmission path is <I3, L3, L5, L12, 02>, I3 is R, L3 is R, L5 is R, L12 is F, and O2 is F for the test pattern sequence T1, from the result of the logic simulation in the memory device, which means all of the parts on the path are switching. In addition, I3 is R, L3 is R, L5 is R, L12 is F, and O2 is F for the test pattern sequence T2, which means all of the parts on the path are switching. Therefore, test pattern sequence T1 and T2 for the signal transmission path <I3, L3, L5, L12, 02> are registered to the fault list or the path <I3, L3, L5, L12, 02> is registered for each of the test pattern sequence T1 and T2. Here, the signal transmission path registered to the fault list is not limited to the path from the input terminal to the output terminal of the circuit, for example, the signal transmission paths which does not reach the output terminal such as the paths <I1, N1> and <I1, L1, L6> of the semiconductor IC. of FIG. 16 may be the object of the test.

By doing this, a fault list is generated for all of the signal transmission paths where a fault may be present. The fault list of the logic simulation in terms of the logic gate for the semiconductor IC shown in FIG. 14 is shown in FIG. 18, and that of the logic simulation in terms of the internal signal line for the semiconductor IC shown in FIG. 16 is shown in FIG. 19.

For presuming a fault location in terms of the signal transmission path, the similar method as for presuming a fault location in terms of the logic gate or the signal line may be used. If the transient power supply current shows abnormality when the test pattern sequence T9 and T10 are applied to the CMOS IC of FIG. 14, then the fault location list for the test pattern sequence T9 is <I1, N1, N3, O1>, <I1, N1, N3, O2> and that for the test pattern sequence T10 is <I1, N1, N3, O1>. It is presumed that the common element <I1, N1, N3, O1> of two fault location lists is the faulty signal transmission path.

Or, by excluding the points (fault-free location) <I3, O2>, <I3, N2, N3, O1>, <I3, N2, N3, O2>, <I2, N2, N3, O1>, <I1, N1, N3, 02> which are not included in the fault location list of the test pattern sequence T10 from the fault location list (the standard fault location list) of the test pattern sequence T9 <I1, N1, N3, O1>, <I1, N1, N3, O2>, the remaining path <I1, N1, N3, O1> is presumed as the faulty signal transmission path.

Next, it is assumed that the transient power supply current shows abnormality for the test pattern sequence T9, but it is normal for the test pattern sequence T10. In this case, by excluding the fault location list <I1, N1, N3, O1> of the normal test pattern sequence T10 from the fault location list <I1, N1, N3, 01>, <I1, N1, N3, O2> of the abnormal test pattern sequence T10, the path <I1, N1, N3, O2> is presumed as the faulty signal transmission path.

Moreover, the fault analysis method of the present invention is not confined to the CMOS IC, it is applicable to other types of semiconductor ICs.

Figure 20:
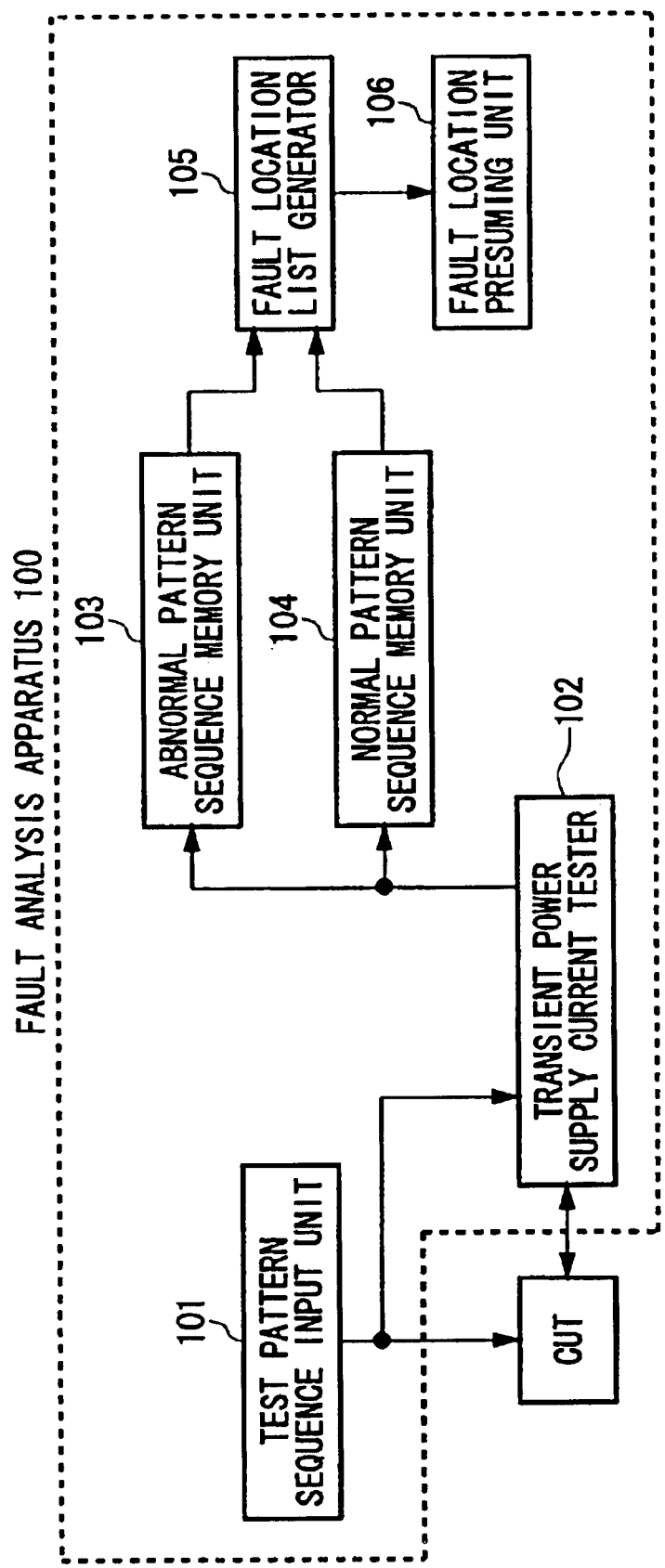
FIG. 20 is a block diagram showing an example constitution of the fault analysis apparatus of the present invention.

FIG. 20 shows an example constitution of the fault analysis apparatus according to an embodiment of the present invention. The fault analysis apparatus 100 comprises a test pattern sequence input unit 101 for inputting a test pattern sequence having two or more test patterns to the input terminal of the semiconductor IC to be tested (DUT), a transient power supply current tester 102 for measuring the transient power supply current generated when said test pattern sequence is inputted and determining said transient power supply current is abnormal or not, an abnormal pattern sequence memory unit 103 for saving a plurality of test pattern sequence that the transient power supply current of said semiconductor IC CUT is abnormal, a normal pattern sequence memory unit 104 for saving a plurality of test pattern sequence that the transient power supply current of said semiconductor IC CUT is normal, a fault location list generator 105 for making the test pattern sequence and the list of the presumed fault locations detected for said test pattern sequence by conducting fault simulation for each of test pattern sequence stored in said abnormal pattern sequence memory unit 103 and said normal pattern sequence memory unit 104, and a fault location presuming unit 106 for presuming the fault locations in said semiconductor IC DUT based on said list of the presumed fault locations obtained by said using said fault location list generator 105.

The test pattern sequence input unit 101 may be a digital data generator, pattern generator of the ATE (automatic testing equipment) for IC, or random pattern generator.

Test of the Transient Power Supply Current (Pulse Width)

Figure 21:
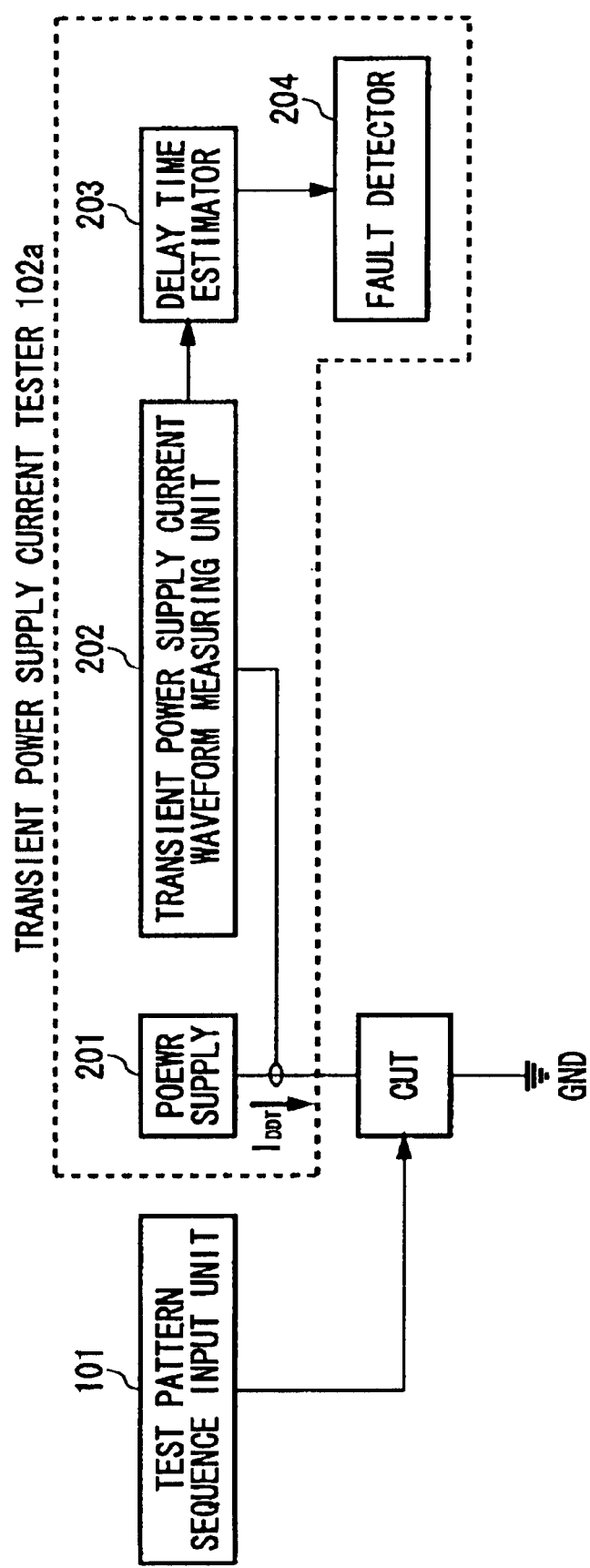
FIG. 21 is a block diagram showing an example constitution of the transient power supply current tester 102 of FIG. 20.

FIG. 21 shows an example constitution of the transient power supply current tester 102 according to the embodiment of the present invention. This transient power supply current tester 102a comprises a power supply 201 for supplying current to the semiconductor IC DUT to be tested, a transient power supply current waveform measuring unit 202 for measuring the transient power supply current waveform $I_{DDT}$ generated by the test pattern sequence outputted by the test pattern sequence input unit 101, a delay time estimator 203 for measuring the pulse width of the power supply current waveform $I_{DDT}$ measured by the transient power supply current waveform measuring unit 202 and obtaining the signal transmission time of the path under test, a fault detector 204 for determining whether there is a fault or not by comparing the delay time obtained by said delay time estimator 203 to a predetermined value, i.e. judging the equation (18).

The power supply 201 may be a static power supply, programmable power supply (PPS) of automatic testing equipment (ATE) for IC, or a condenser having large capacitance. However, it is preferable that the current response is quite rapid for the power supply 201, thus the power supply is placed adjacent to the device DUT. The transient power supply current wave form measuring unit 202 may be formed as shown in FIG. 22 or 23.

Figure 22:
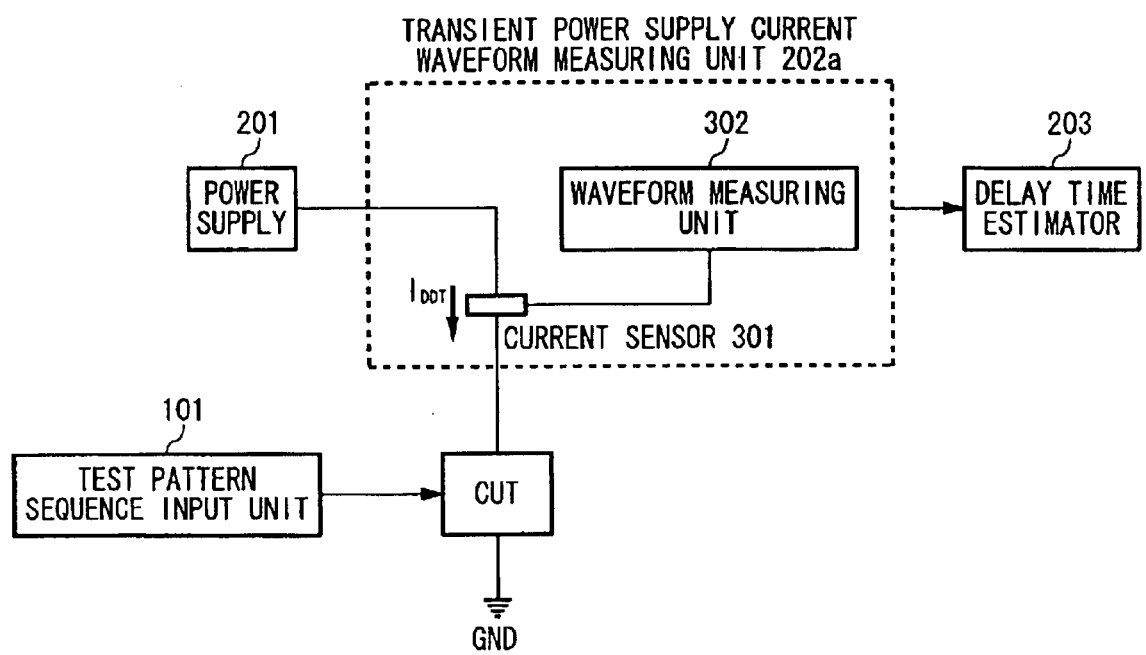
FIG. 22 is a block diagram showing an example constitution of the transient power supply current waveform measuring unit 202 of FIG. 21.

That is, FIG. 22 shows an example constitution of the transient power supply current waveform measuring unit 202 according to the present invention. This transient power supply current waveform measuring unit 202a comprises a current sensor 301 for detecting a current waveform flowing between the power supply terminal of the circuit under test CUT and the power supply and transforming it to the voltage waveform, and a waveform measuring unit 302 for measuring the voltage waveform transformed by the current sensor 301. The current sensor 301 may be a current sensor of induction type which transforms the transient power supply current waveform to the voltage waveform using the change of the magnetic field surrounding the power supply line connected between the power supply 201 and DUT, or a current sensor of resistance type which transforms, after inserting a resistor element of small resistance in the power supply line, the transient power supply current waveform flowing through the resistor element to the voltage wave form using Ohm's law. However, it is preferable that the current sensor is small for preventing ringing due to the induction coefficient component of the power supply line on the transient power supply current waveform. The waveform measuring unit 302 may be an oscilloscope, or a digitizer of ATE for IC.

Figure 23:
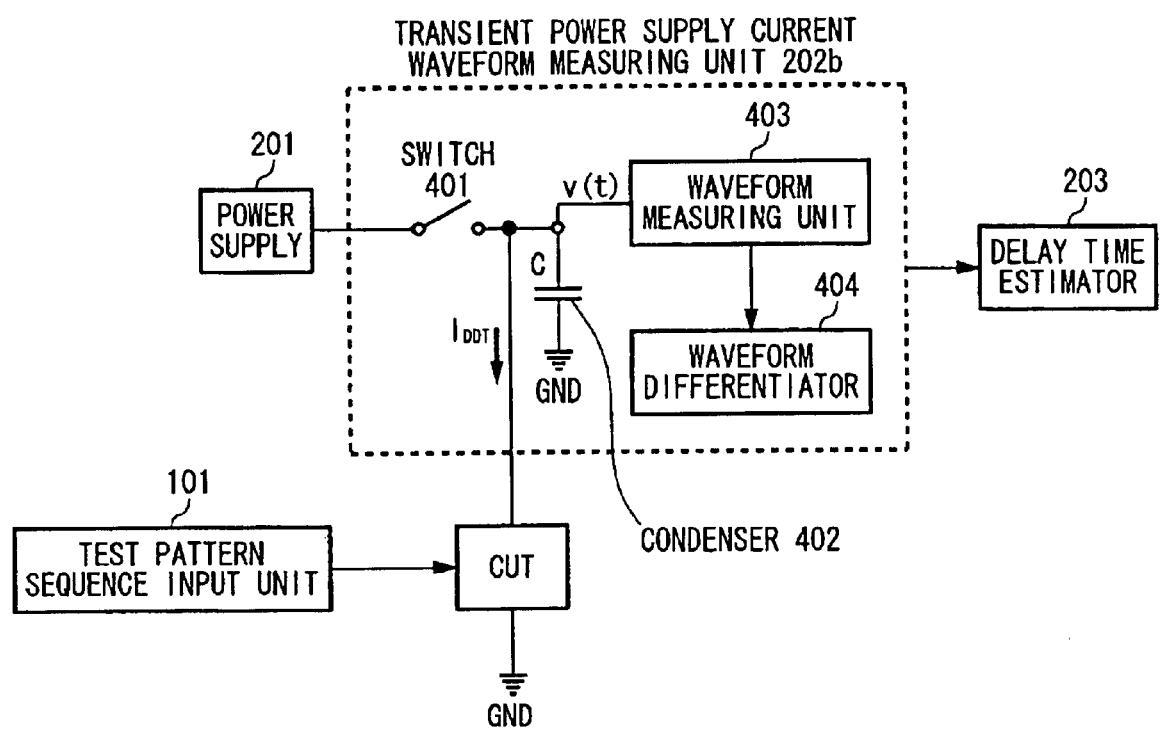
FIG. 23 is a block diagram showing another example constitution of the transient power supply current waveform measuring unit 202 of FIG. 21.

That is, FIG. 23 shows another example constitution of the transient power supply current waveform measuring unit 202 according to the present invention. This transient power supply current waveform measuring unit 202b comprises a switch 401 serially inserted to the power supply line, a condenser 402 for supplying current to the circuit under test CUT, which is connected between the connection point of the switch 401 and the circuit under test CUT and ground, a waveform measuring unit 403 for measuring the voltage change v(t) of the terminal of the circuit under test CUT side, and a waveform differentiator 404 for time-differentiating the voltage waveform v(t) measured by the waveform measuring unit 403. The current flowing from the condenser 402 to the circuit under test CUT when the circuit under test is a transient state, i.e. the transient power supply current $I_{DDT}$, is given as following equation if the capacitance of condenser 402 is C, and the voltage of the circuit under test CUT side terminal of the condenser 402 is v(t).

$$I_{DDT} = -C\frac{dv(t)}{dt} \tag{51}$$

Therefore, the transient power supply current waveform flowing through the circuit under test CUT by time-differentiating the voltage waveform v(t) of the condenser 402. Here, the switch 401 is provided to supply all current flowed into the circuit under test CUT to the condenser 402 by removing the induction coefficient component or the capacitance component of the power supply line. The waveform measuring unit 403 may be an oscilloscope, or a digitizer of ATE for IC. The waveform differentiator 404 may be formed as hardware or software.

The delay time estimator 203 and the fault detector 204 may be formed as hardware or software.

Figure 24:
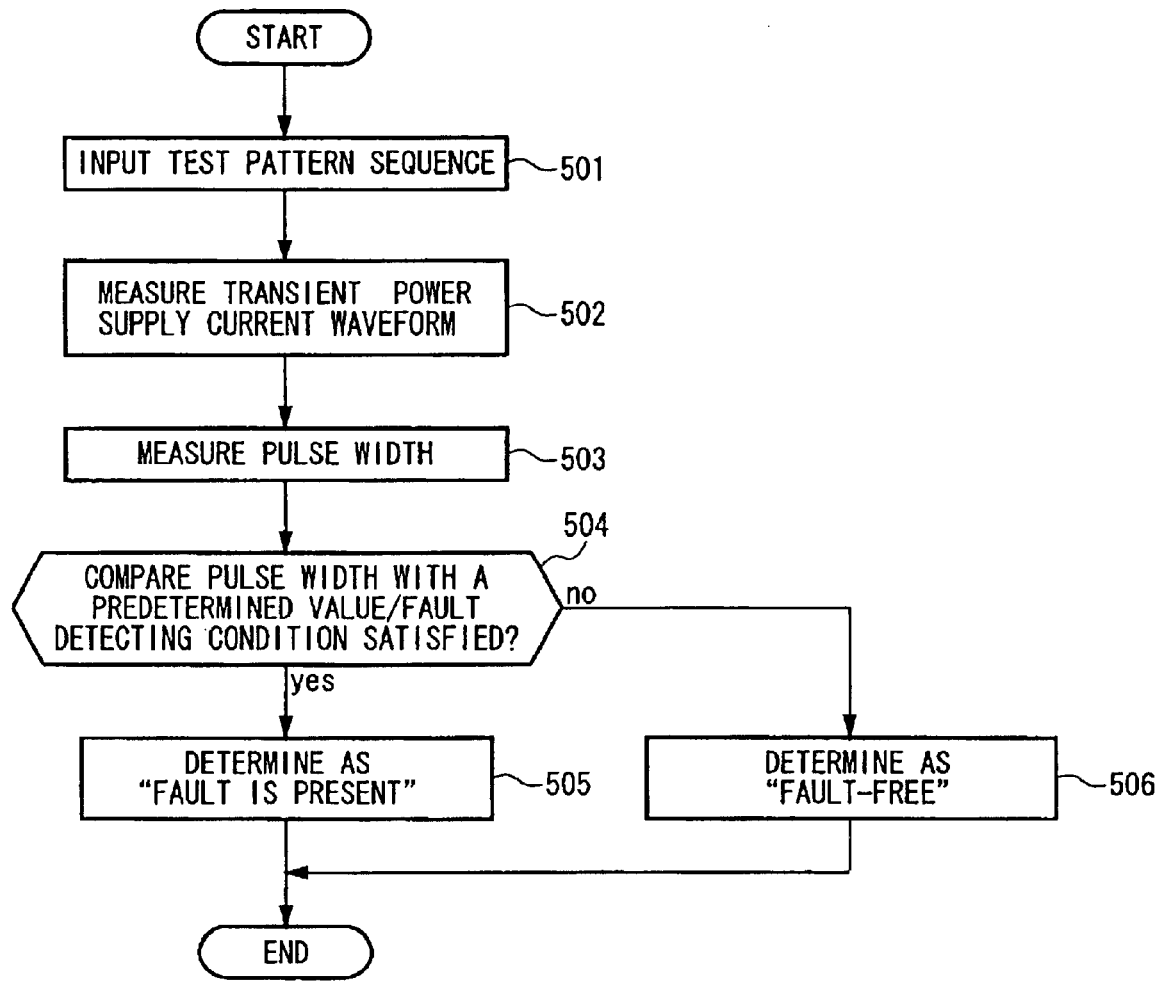
FIG. 24 is a flowchart illustrating an example process sequence of the transient power supply current testing method which can be used as the fault analysis method of the present invention.

Next, the operation of testing semiconductor IC using the transient power supply current tester 102a is described in detail. FIG. 24 illustrates the procedure of the testing method of the transient power supply current according to the present invention. The test pattern sequence input unit 101 inputs a test pattern sequence activating the circuit under test CUT in step 501. In step 502, the transient power supply current waveform measuring unit 202 measures the transient response waveform $I_{DD}$ of the power supply current flowing into the power supply pin of the circuit under test CUT from the power supply.

Next, the delay time estimator 203 measures the pulse width $t_{PW}$ of the transient power supply current waveform $I_{DDT}$ measured by the transient power supply current waveform measuring unit 202 to obtain the delay time of the path under test in step 503. Last, the fault detector 204 compares, in step 504, the pulse width $t_{PW}$ of the transient power supply current waveform $I_{DDT}$ obtained by the delay time estimator 203 to the predetermined value T', determines that a fault is present when the comparison result satisfies the condition of fault detection $t_{PW}$>T' in step 505, and that there is fault free when the comparison result does not satisfy the condition of fault detection $t_{PW}$>T' in step 506, and then the process is finished.

Here, the power supply 201 supplies a predetermined voltage, for example, 3.3V constantly to the circuit under test CUT through the process of semiconductor IC test, i.e. the steps of 501, 502, 503, 504, 505 and 506. The step 501 of inputting a test pattern sequence and the step 502 of measuring the transient power supply current waveform are performed nearly at the same time. In the step 502 of measuring the transient power supply current waveform, the transient power supply current waveform may be measured by single or multiple measurement(s). For single measurement, the test pattern sequence is inputted once, while the test pattern sequence is inputted repeatedly for multiple measurements. In a case of multiple measurements, it is reset to the initial state upon inputting the test pattern sequence, that is, the condenser 402 is charged at every time when the condenser 402 is used.

Test of the Transient Power Supply Current (Instant Value)

Figure 25:
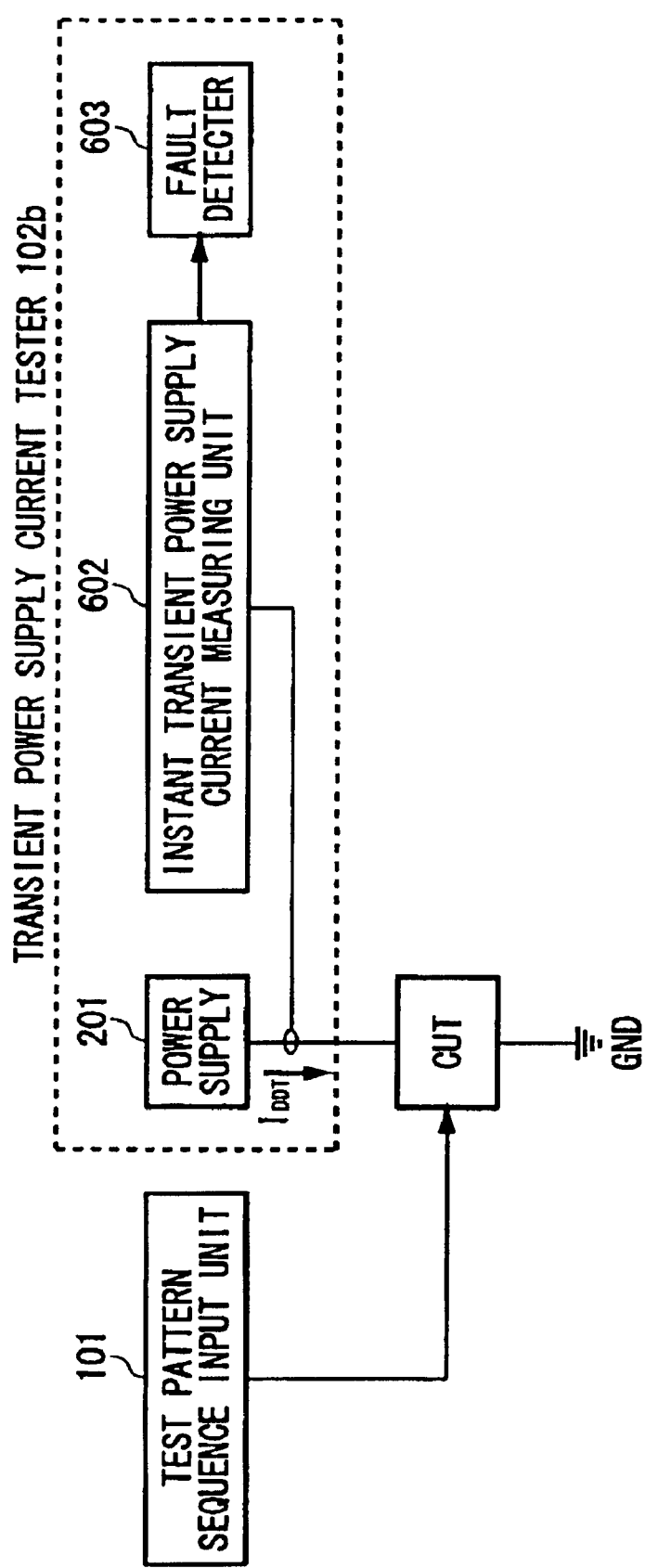
FIG. 25 is a block diagram showing another example constitution of the transient power supply current tester 102 of FIG. 20.
Figure 26:
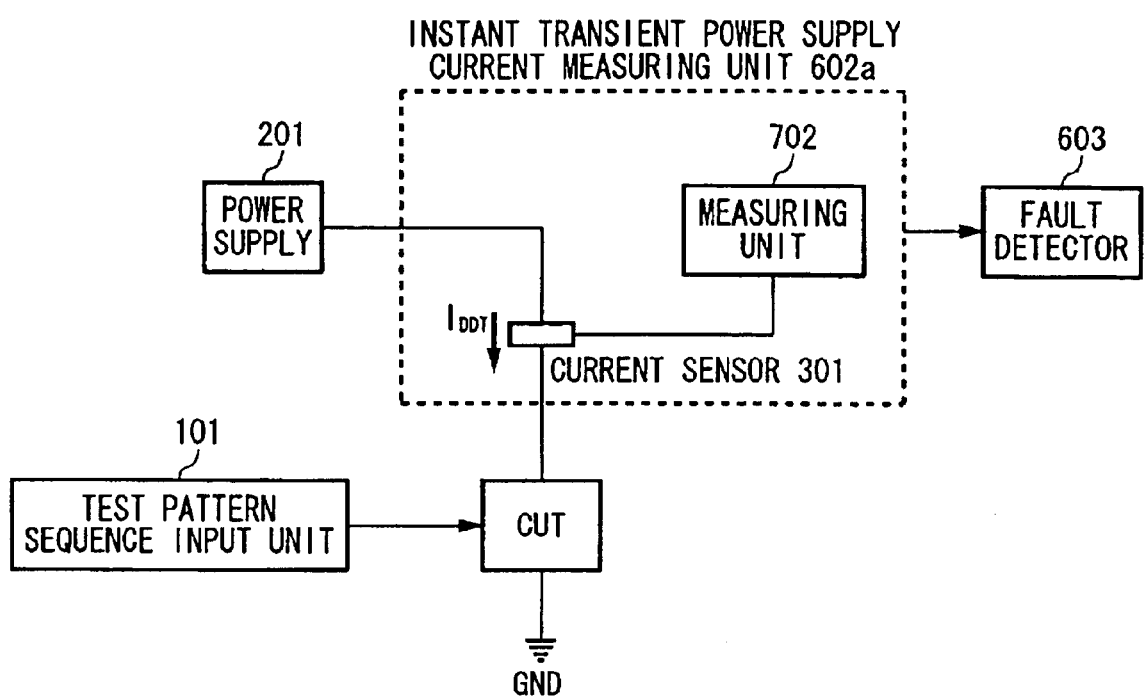
FIG. 26 is a block diagram showing an example constitution of the instant transient power supply current measuring unit 602 of FIG. 25.
Figure 27:
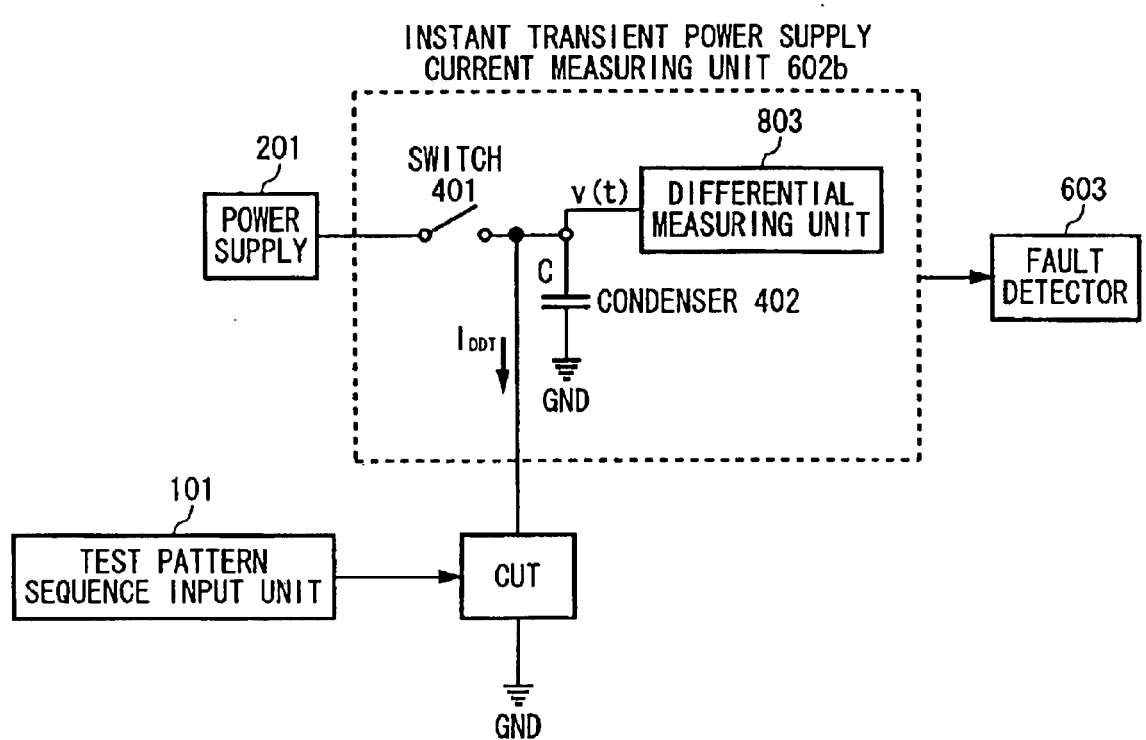
FIG. 27 is a block diagram showing another example constitution of the instant transient power supply current measuring unit 602 of FIG. 25.

FIG. 25 shows another example constitution of the transient power supply current tester 102 according to the embodiment of the present invention. This transient power supply current tester 102b comprises a power supply for supplying power to the semiconductor ICDUT to be tested, an instant transient power supply current measuring unit 602 for measuring the instant value $I_{DDT}$ (τ) of the transient power supply current generated by the test pattern sequence outputted by the test pattern sequence input unit 101 at a predetermined time τ, and a fault detector 603 for comparing the transient power supply current value $i_{DDT}$ (τ) measured by the instant transient power supply current measuring unit 602 to a predetermined current value I' and determining whether a delay fault is present or not. The power supply 201 may be the one shown in FIG. 21. The instant transient power supply current measuring unit 602 may be formed as shown in FIG. 26 or 27. The fault detector 603 may be formed as hardware or software.

FIG. 26 shows an example constitution of the instant transient power supply current measuring unit 602 according to the embodiment of the present invention. This instant transient power supply current measuring unit 602a has a measuring unit 702 for measuring the voltage value transformed by the current sensor 301 instead of the waveform measuring unit 202 in the transient power supply current measuring unit 202 as shown in FIG. 22. The measuring unit 702 may be a digital multimeter, an oscilloscope, or a digitizer of the ATE for IC.

FIG. 27 shows another example constitution of the instant transient power supply current measuring unit 602 according to the embodiment of the present invention. This instant transient power supply current measuring unit 602b has a differential measuring unit 803 for measuring the instant differential value of the voltage waveform v(t) of the circuit under test CUT side terminal of the condenser 402 instead of the waveform measuring unit 403 and the waveform differential unit 404 in the transient power supply current measuring unit 202b as shown in FIG. 23. The current flowing from the condenser 402 to the circuit under test CUT when the circuit under test is a transient state, i.e. the transient power supply current $I_{DDT}$, is given as the following equation which is the same as equation (51).

$$I_{DDT} = -C\frac{dv(t)}{dt} \tag{52}$$

Therefore, the instant value $I_{DDT}$ (τ) of the transient power supply current flowing through the circuit under test CUT by measuring the time-differential value of the voltage waveform v (t) of the condenser 402 at the time τ. Here, the instant differential value of voltage wave form v (t) at time τ maybe obtained by dividing the difference between two instant values of v(t) at a very short time interval Δt near the time τ by the time interval Δt as shown as the following equation (53). It is preferable that Δt is as short as possible to obtain a more accurate instant differential value.

$$\left.\frac{dv(t)}{dt}\right|_{t=\tau} = \frac{v(\tau + \Delta t) - v(t)}{\Delta t} \quad (53)$$

Here, the switch 401 is provided to supply all current flowed into the circuit under test CUT to the condenser 402 by removing the induction coefficient component or the capacitance component of the power supply line. The differential measuring unit 803 may be a digital multimeter, an oscilloscope, or a digitizer of the ATE for IC.

Figure 28:
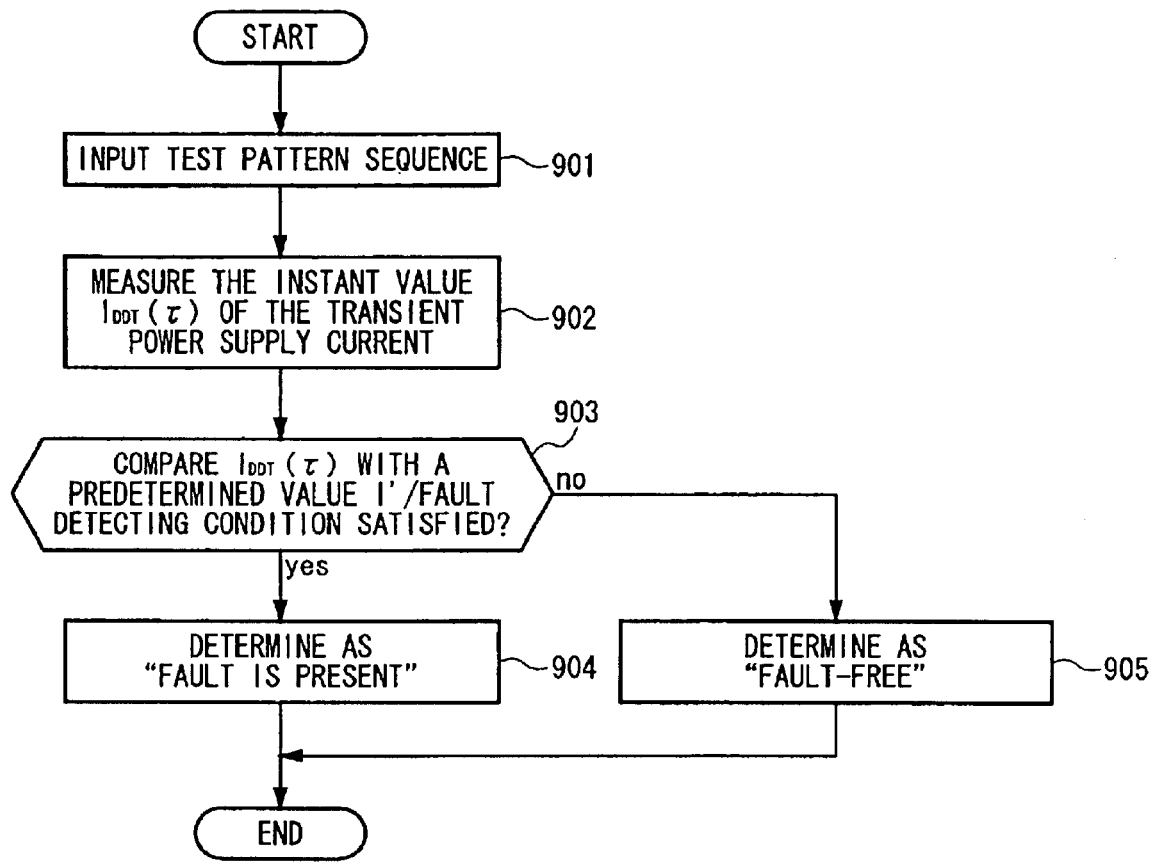
FIG. 28 is a flowchart illustrating another example process sequence of the transient power supply current testing method which can be used as the fault analysis method of the present invention.

Next, the operation of testing semiconductor IC using the transient power supply current tester 102b is described in detail. FIG. 28 illustrates the procedure of the testing method of the transient power supply current according to the present invention. The test pattern sequence input unit 101 inputs a test pattern sequence activating the circuit under test CUT in step 901. In step 902, the instant transient power supply current measuring unit 602 measures the instant value $i_{DDT}(\tau)$ of the power supply current flowing into the power supply pin of the circuit under test CUT from the power supply at a predetermined time τ. Here, as explained above, τ may be obtained by the equation τ=T'+τ$_0$, where τ$_0$ is the time of input transition, and T' is the maximum value of permissible delay time. Finally, the fault detector 603 compares, in step 903, the instant value $i_{DDT}(\tau)$ of the transient power supply current obtained by the instant transient power supply current measuring unit 602 to the predetermined value, for example, a typical value I'(=$i_{DDT}$ ($\tau_{max}$)) of power supply current at the time $\tau_{max}$ of the output transition time of the logic gate G$_{final}$ which switches last for the circuit without fault, determines that "a fault is present" when the comparison result satisfies the condition of fault detection $i_{DDT}(\tau)$ >I' in step 904, and that "there is no fault" when the comparison result does not satisfy the condition of fault detection $i_{DDT}(\tau)$<I' in step 905, and then the process is finished.

Here, the power supply 201 supplies a predetermined voltage, for example, 3.3V constantly to the circuit under test CUT through the process of the delay fault testing, i.e. the steps of 901, 902, 903, 904 and 905. The step 901 of inputting a test pattern sequence and the step 902 of measuring the instant value of the transient power supply current are performed nearly at the same time. In the step 902 of measuring the instant value of the transient power supply current, the value maybe measured by single measurement or by the method of taking the average of the results of multiple measurements to measure it more accurately. For single measurement, the test pattern sequence is inputted once, while the test pattern sequence is inputted repeatedly for multiple measurements.

Test of the Transient Power Supply Current (Integral Value)

Figure 29:
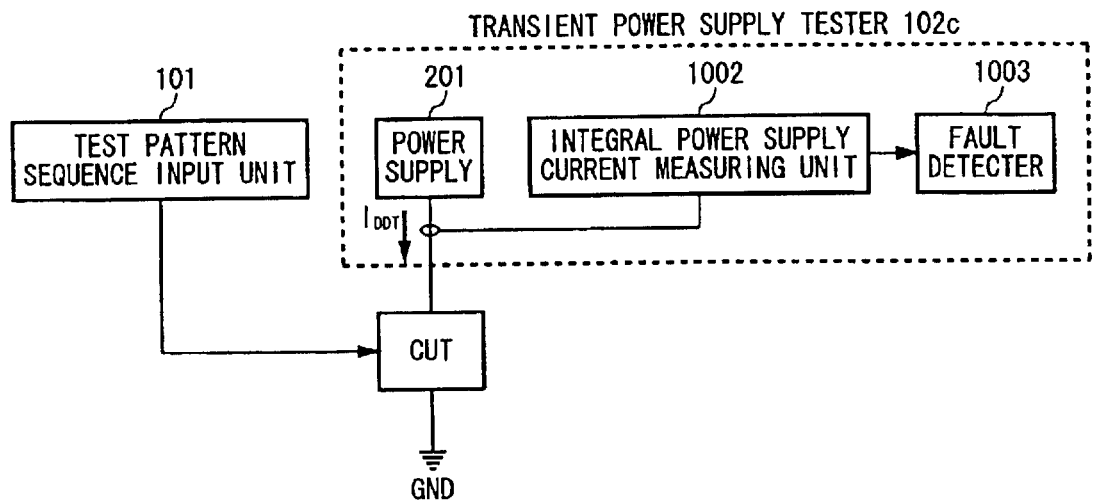
FIG. 29 is a block diagram showing yet another example constitution of the transient power supply current tester 102 of FIG. 20.
Figure 30:
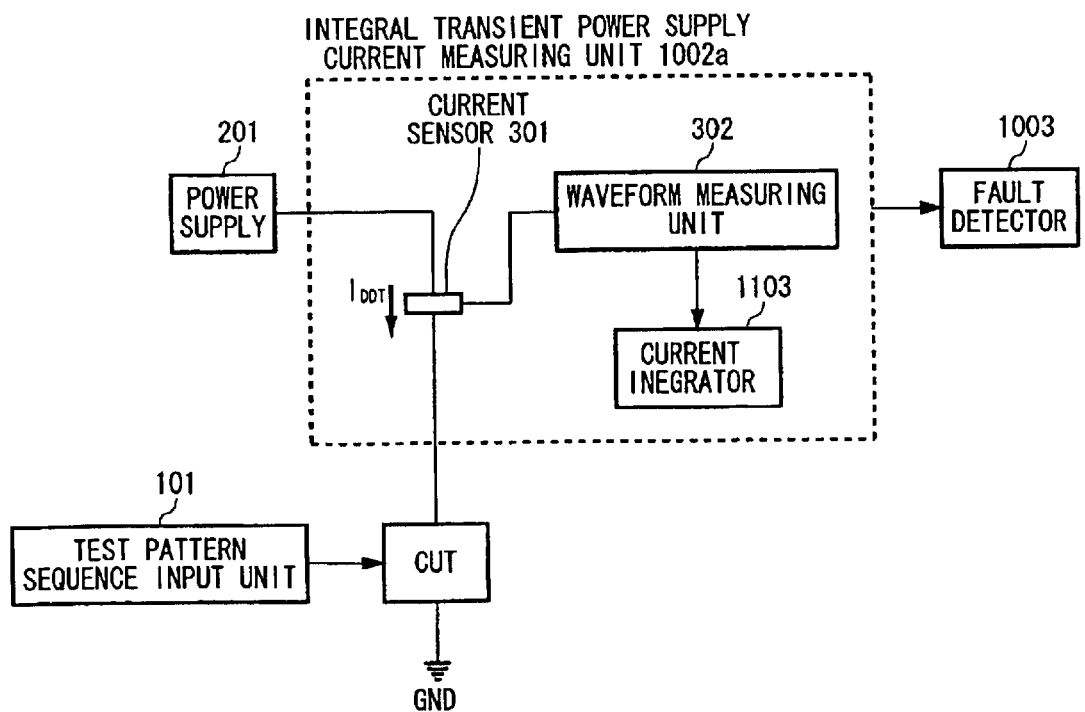
FIG. 30 is a block diagram showing an example constitution of the integral transient power supply current measuring unit 1002 of FIG. 29.
Figure 31:
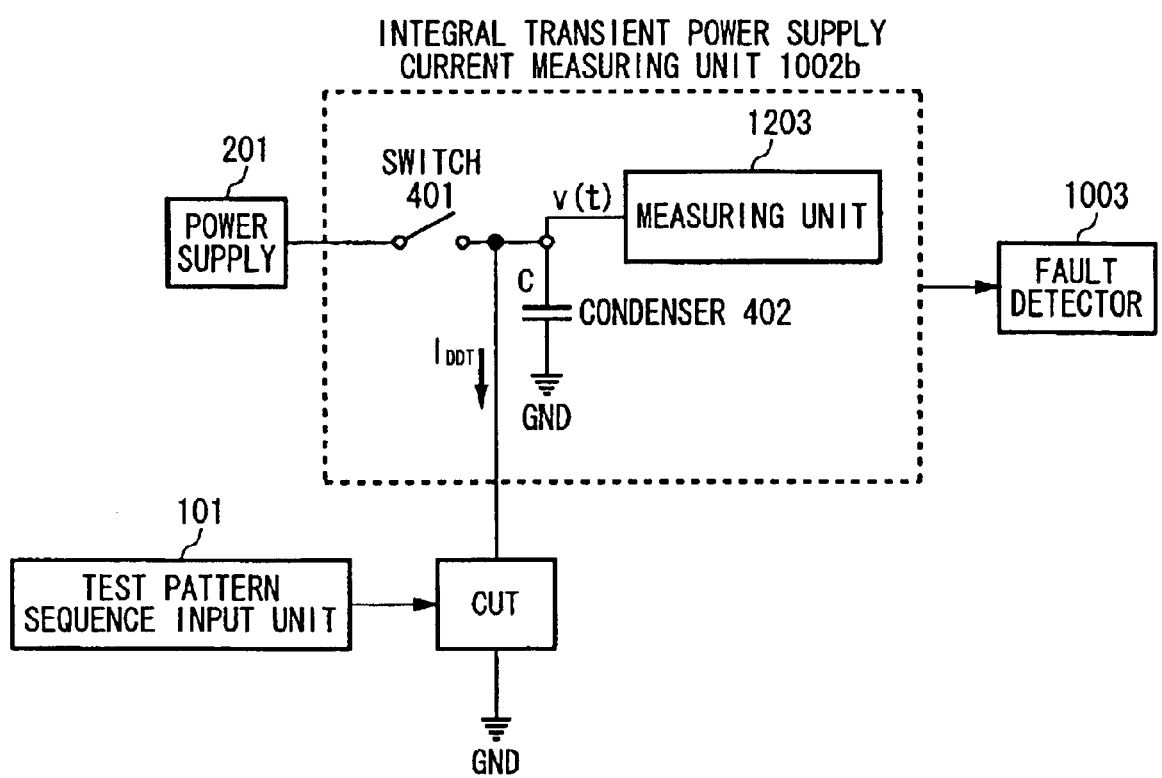
FIG. 31 is a block diagram showing another example constitution of the integral transient power supply current measuring unit 1002 of FIG. 29.

FIG. 29 shows another example constitution of the transient power supply current tester 102 according to the embodiment of the present invention. This transient power supply current tester 102c comprises a power supply 201 for supplying power to the circuit under test, an integral transient power supply current measuring unit 1002 for measuring the integral value $Q_{DDT}$ of the transient power supply current generated by the test pattern sequence outputted by the test pattern sequence input unit 101 for a predetermined time period, and a fault detector 1003 for comparing the transient power supply current value $Q_{DDT}$ measured by the integral transient power supply current measuring unit 1002 to a predetermined current value and determining whether a delay fault is present or not. The power supply 201 may be the one shown in FIG. 21. The integral transient power supply current measuring unit 1002 may be composed of a current sensor 301, a waveform measuring unit 302, and a current integrator 1103 as shown in FIG. 30 or composed of a switch 401, a condenser 402, and a measuring unit 1203 as shown in FIG. 31. The fault detector 1003 may be formed as hardware or software.

FIG. 30 shows an example constitution of the integral transient power supply current measuring unit 1002 according to the embodiment of the present invention. In this integral transient power supply current measuring unit 1002a, the voltage value transformed by the current sensor 301 is measured by the waveform measuring unit 302 as shown in FIG. 22, and the integral value of the current waveform measured, for this example, by the waveform measuring unit 1102 for the predetermined time period. The current integrator 1103 may be formed as hardware or software.

FIG. 31 shows another example constitution of the integral transient power supply current measuring unit 1002 according to the embodiment of the present invention. According to this integral transient power supply current measuring unit 1002b, the current flowing from the condenser 402 to the circuit under test CUT when the circuit under test is a transient state, i.e. the transient power supply current $I_{DDT}$ is given as following equation, which is the same as shown in FIG. 23.

$$I_{DDT} = -C\frac{dv(t)}{dt} \quad (54)$$

Therefore, the integral value $Q_{DDT}$ of the transient power supply current becomes the following equation.

$$Q_{DDT} = \int_{\infty}^{\infty} I_{DDT} dt \quad (55)$$
$$= -C\int_{\infty}^{\infty} \frac{dv(t)}{dt} dt = -C[v(t)]_{-\infty}^{\infty} = C[v(-\infty) - v(\infty)]$$

Here, v(−) and v (±) indicate the initial and final value of the voltage of the condenser 402, respectively. Therefore, the integral value $Q_{DDT}$ of the transient power supply current flowing through the circuit under test CUT can be calculated by measuring the difference between the initial and final value of the voltage of the condenser 402. Here, it is preferable hat the initial voltage value v(−) of the condenser 402 is measured slightly before the signal transition of the input signal line of the path under test, and the final voltage v(±) of the condenser 402 is measured slightly after the power supply current becomes quiescent power supply current value $I_{DDQ}$ by switching all of the logic gates on the path under test. However, it is difficult to determine the time when power supply current becomes value $I_{DDQ}$, therefore it is possible to measure the final voltage v(±) of the condenser 402 at the time after a sufficient time passes from the input of the test pattern sequence. The measuring unit 1203 for measuring these voltages v(−) and v (±) may be a digital multimeter, an oscilloscope, or digitizer of the ATE or IC.

Figure 32:
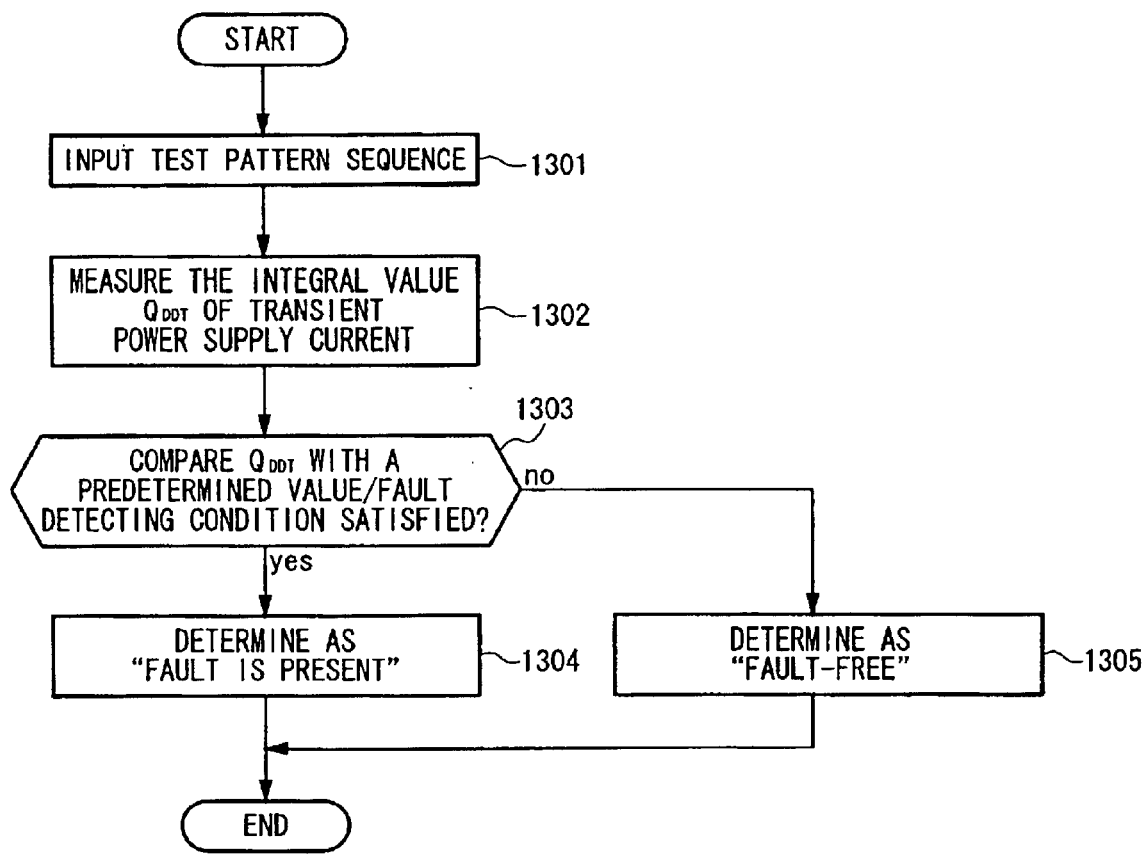
FIG. 32 is a flowchart illustrating yet another example process sequence of the transient power supply current testing method which can be used as the fault analysis method of the present invention.

Next, the operation of testing semiconductor IC using the transient power supply current tester 102c is described in detail. FIG. 32 illustrates the procedure of the testing method of the transient power supply current according to the present invention. The test pattern sequence input unit 101 inputs a test pattern sequence activating path under test in step 1301. In step 1302, the integral transient power supply current measuring unit 1002 measures the integral value $Q_{DDT}$ of the power supply current flowing into the power supply pin of the circuit under test CUT from the power supply for a predetermined time period T. Here, T is the time period, for example, from time *(−) slightly before the input transition to the time *(±) until the circuit under test is stabilized sufficiently. Finally, the fault detector 1003 compares, in step 1303, the integral value $Q_{DDT}$ of the transient power supply current obtained by the integral transient power supply current measuring unit 1002 to the predetermined value $Q_{DDT,\ typ+}{}^*_Q$ as shown in equation (39), and determines that "a fault is present" when the comparison result satisfies the condition of fault detection $Q_{DDT} > Q_{DDT,\ typ+}{}^*_Q$ in step 1304, and that "there is no fault" when the comparison result does not satisfy the condition of fault detection $Q_{DDT} > Q_{DDT,\ typ+}{}^*_Q$ in step 1305, and then the process is finished. Here, the power supply 201 supplies a predetermined voltage, for example, 3.3V constantly to the circuit under test CUT through the process of delay fault testing, i.e., the steps 1301, 1302, 1303, 1304, and 1305. The step 1301 of inputting a test pattern sequence and the step 1302 of measuring the integral value of the transient power supply current are preformed nearly at the same time. In the step 1302 of measuring the integral value of the transient power supply current, the value may be measured by single measurement or by the method of taking the average of the results of multiple measurements to measure it more accurately. For single measurement, the test pattern sequence is inputted once, while the test pattern sequence is inputted repeatedly for multiple measurements.

For the integral transient power supply current measuring unit 1002, it is possible to integrate the transient power supply current for a time period T' and to determine whether a fault is present or not by determining whether the integrated value $Q_{DDT}$ is over $Q_{max}$ or not, i.e. by the equation (46).

Fault Analysis

Figure 33:
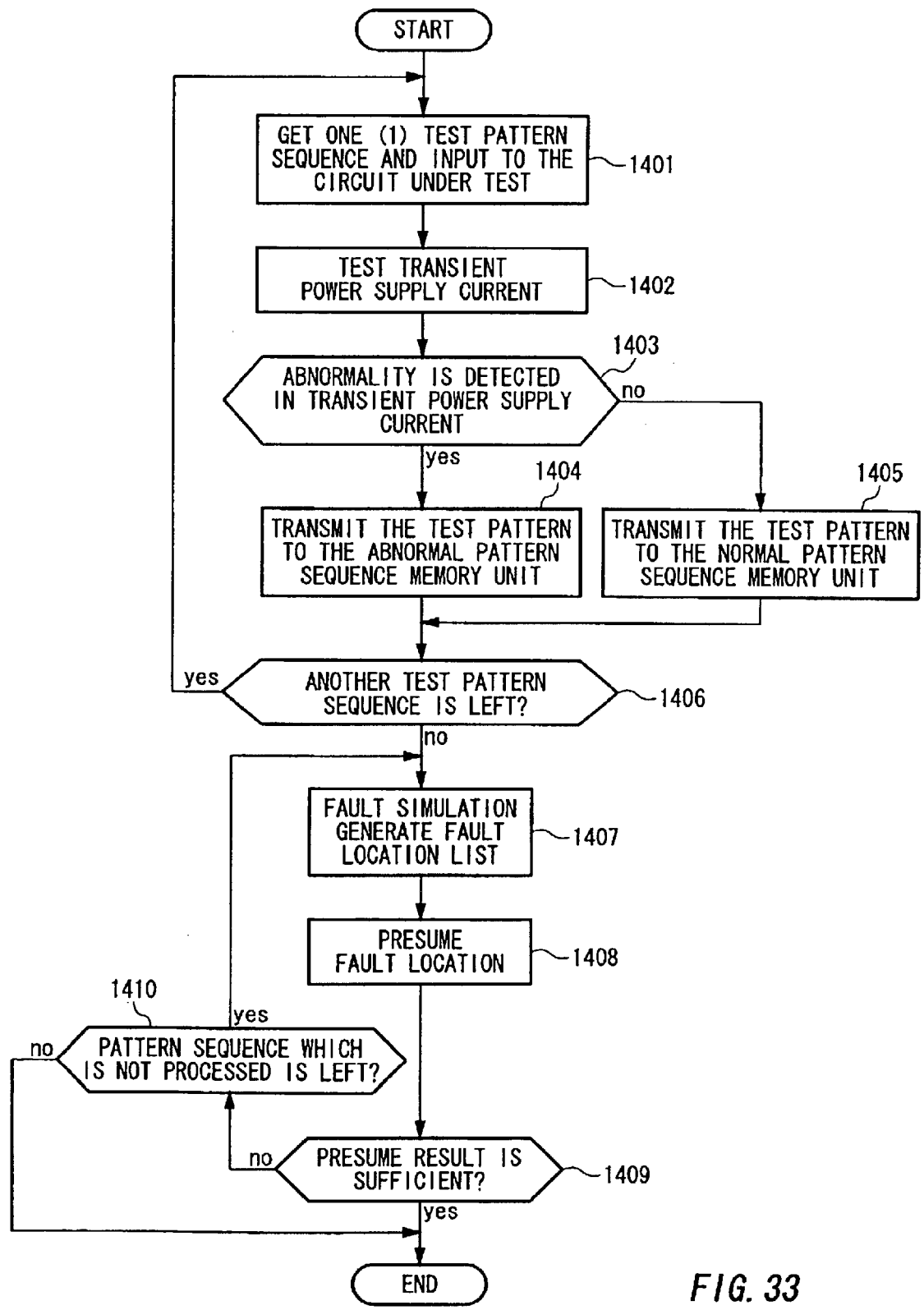
FIG. 33 is a flowchart illustrating an example process sequence of the fault analysis method of the present invention.

Next, the operation of fault analysis of semiconductor IC using the fault analysis apparatus 100 is described in detail. FIG. 33 illustrates the procedure of fault analysis method. The test pattern sequence input unit 101 inputs a test pattern sequence selected from a prepared set of test pattern sequence to the circuit under test CUT in step 1301. The test pattern sequence inputted to the circuit under test CUT is transmitted to the transient power supply current tester 102 almost simultaneously. Next, in step 1402, the transient power supply current tester 102 measures the transient power supply current flowing into the power supply pin of the circuit under test CUT from the power supply, and tests the circuit CUT. The transient power supply current tester 102 analyzes the result of the transient power supply current testing in step 1403, if the transient power supply current is abnormal, the transient power supply current tester 102 saves the test pattern sequence used in the test in the abnormal pattern sequence memory unit 103 in step 1404, and if the transient power supply current is normal, the transient power supply current tester 102 saves the test pattern sequence used in the test in the normal pattern sequence memory unit 104 in step 1405. Next, the fault analysis apparatus 100, in step 1406, determines whether there is a test pattern sequence which is not processed in said set of test pattern sequence. If there is a test pattern sequence which is not processed, the steps 1401, 1402, 1403, 1404 and 1405 are repeated, and if there is no test pattern sequence which is not processed, the method proceeds to step 1407.

Next, in step 1407, the fault location list generator 105 conducts a fault simulation for the test pattern sequence stored in the abnormal pattern sequence memory unit 103 and the normal pattern sequence memory unit 104 and generates a list of the points where faults are detectable (fault location list). That is, logic simulation determining where the logic value of the signal changes when the test pattern sequence is inputted to the circuit under test without fault is performed, and the points where faults are detectable are obtained by the point where the logic value changes. In step 1408, the fault location presuming unit 106 presumes fault location(s) based on the fault location list generated by the fault location list generator 105 according to the method explained with reference to FIGS. 14 to 19. Then, it is determined whether the result of presuming fault locations is sufficient or not in step 1409. If the circuit under test is very complicated, it is difficult to confine the fault locations to a single point. In this case, the number of presumed fault locations is, for example, 10, it can be determined that the result is sufficient because the presumed fault locations can be examined using an electron beam tester in a relatively short time period. That is, in step 1409, it is determined that the number of presumed fault locations are decreased to the predetermined number or not. If the result of the presuming fault locations is not sufficient, the process proceeds to step 1410, and if the result of the presuming fault locations is sufficient, the process is finished. When the result of the presuming fault locations is not sufficient, the fault analysis apparatus 100 determines whether there is a test pattern sequence which is not processed in the abnormal pattern sequence memory unit 103 and the normal pattern sequence memory unit 104 in step 1410. If there is a test pattern sequence which is not processed, the steps 1407 and 1408 are repeated, and if there is no test pattern sequence which is not processed, the process is finished. Here, any one of the methods shown in FIGS. 24, 28 and 32 may be used for the transient power supply current testing of step 1402.

Figure 34:
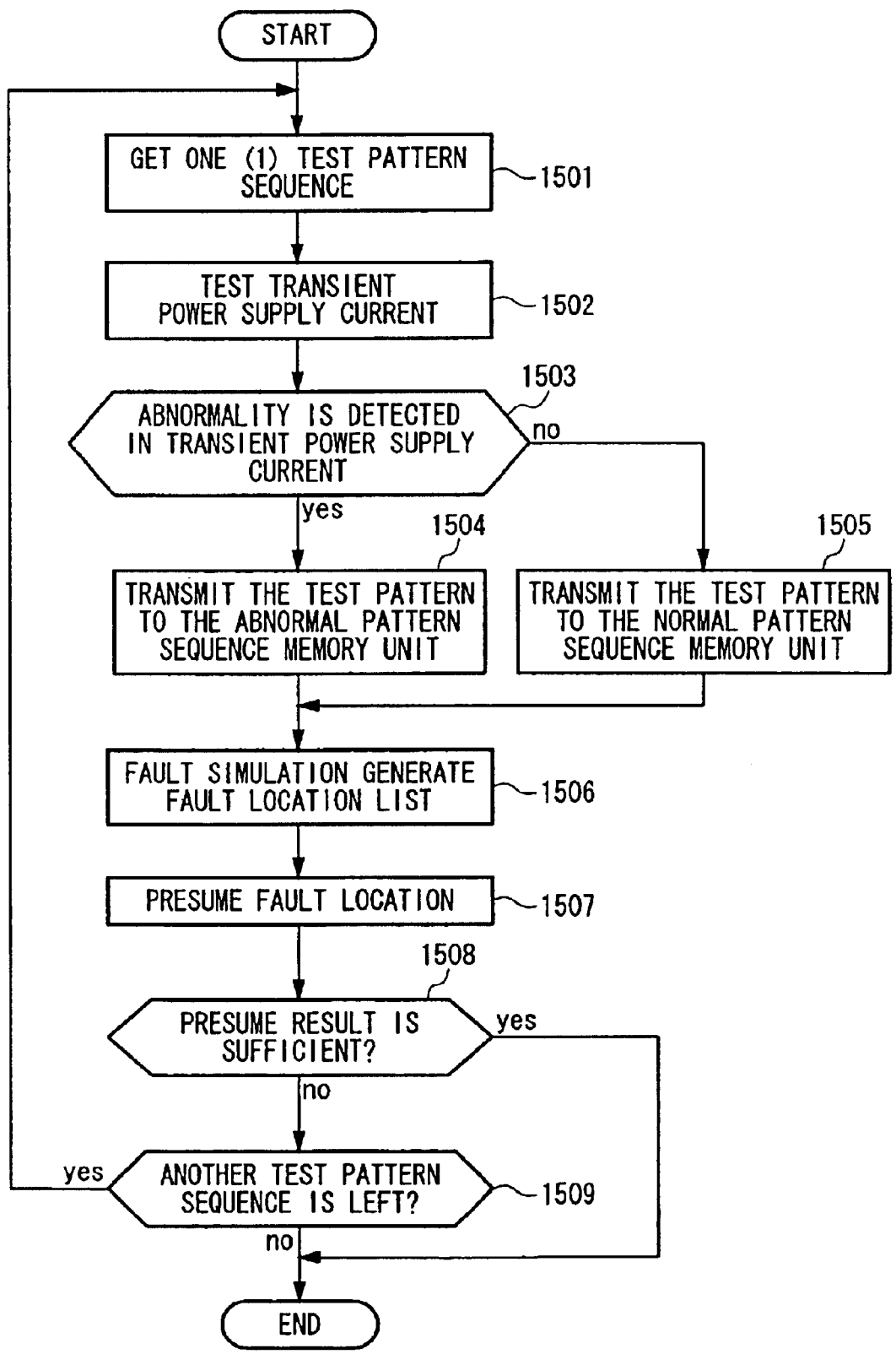
FIG. 34 is a flowchart illustrating another example process sequence of the fault analysis method of the present invention.

FIG. 34 illustrates another procedure of fault analysis method of the present invention. The test pattern sequence input unit 101 inputs a test pattern sequence selected from a prepared set of test pattern sequence to the circuit under test CUT in step 1501. The test pattern sequence inputted to the circuit under test CUT is transmitted to the transient power supply current tester 102 almost simultaneously. Next, instep 1502, the transient power supply current tester 102 measures the transient power supply current flowing into the power supply pin of the circuit under test CUT from the power supply, and tests the circuit CUT. The transient power supply current tester 102 analyzes the result of the transient power supply current testing in step 1503. If the transient power supply current is abnormal, the transient power supply current tester 102 saves the test pattern sequence used in the test in the abnormal pattern sequence memory unit 103 in step 1504, and if the transient power supply current is normal, the transient power supply current tester 102 saves the test pattern sequence used in the test in the normal pattern sequence memory unit 104 in step 1505.

Next, in step 1506, the fault location list generator 105 generates a fault location list for the test pattern sequence stored in the abnormal pattern sequence memory unit 103 and the normal pattern sequence memory unit 104 obtained by the transient power supply current test. In step 1507, the fault location presuming unit 106 presumes fault location(s) based on the fault location list generated by the fault location list generator 105. Then, it is determined whether the result of presuming fault locations is sufficient or not in step 1508. If the result of the presuming fault locations is not sufficient, the process proceeds to step 1509, and if the result of the presuming fault locations is sufficient, the process is finished. When the result of the presuming fault locations is not sufficient, the fault analysis apparatus 100 determines whether there is a test pattern sequence which is not processed in the set of test pattern sequence in step 1509. If there is a test pattern sequence which is not processed, the steps 1501, 1502, 1503, 1504, 1505, 1506, 1507 and 1508 are repeated, and if there is no test pattern sequence which is not processed, the process is finished. Here, any one of the methods shown in FIGS. 24, 28 and 32 may be used for transient power supply current testing of step 1502.

For presuming a fault location in step 1507 according to the method shown in FIG. 34, the method of excluding, from the standard fault location list based on the first detected abnormality, the elements which are not included in the fault location lists based on abnormality detected later.

Presuming a Fault Location

Figure 35:
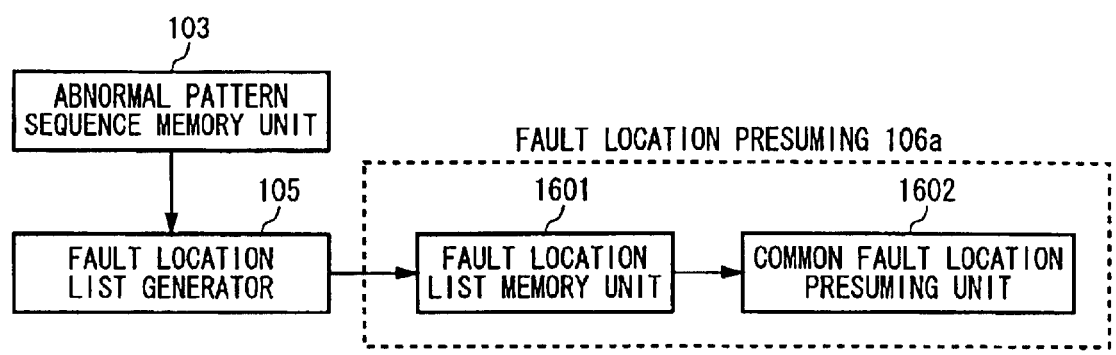
FIG. 35 is a block diagram showing an example constitution of the fault location presuming unit 106 of FIG. 20.

FIG. 35 shows an example constitution of the fault location presuming unit 106 according to the embodiment of the present invention. This fault location presuming unit 106a comprises a fault location list memory unit 1601 for storing a plurality of fault location lists generated by the fault location list generator 105 for a plurality of abnormal test pattern sequence, where the transient power supply current is abnormal, stored in the abnormal pattern sequence memory unit 103 and a common fault location presuming unit 1602 for presuming a fault location which is included in the plurality of fault location lists stored in the fault location list memory unit 1601 in common. The fault location list memory unit 1601 may be a physical recording medium like a hard disk or a memory, or a virtual memory established on the memory. The common fault location presuming unit 1602 may be formed as hardware or software. In the example of FIG. 35, the normal pattern sequence memory unit 104 may be omitted.

Figure 36:
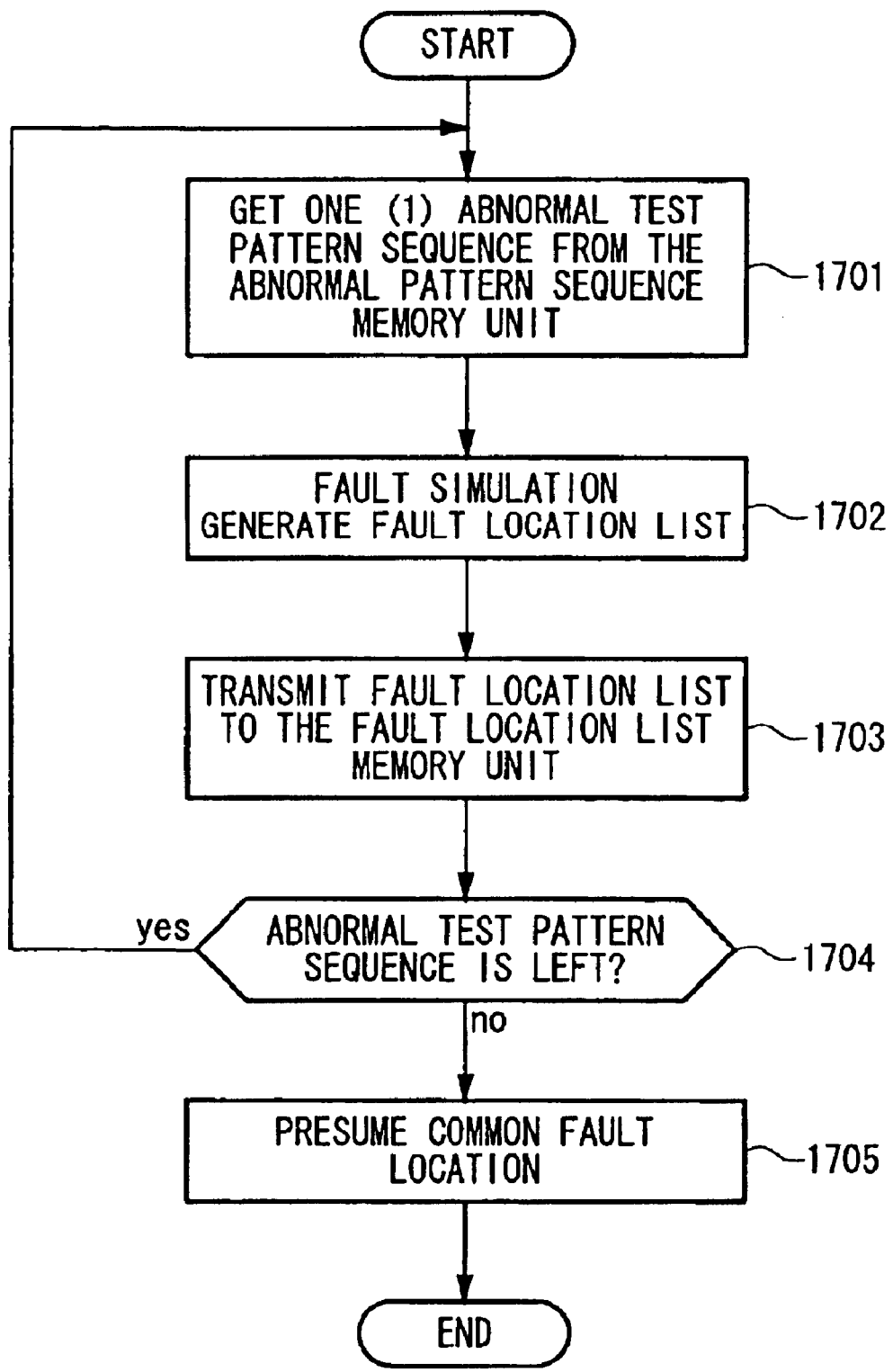
FIG. 36 is a flowchart illustrating an example of process sequence of a method for presuming a fault location which can be used as the fault analysis method of the present invention.

Next, the operation of presuming a fault location using the fault location presuming unit 106a is described in detail. FIG. 36 illustrates the procedure of fault location presuming method of the present invention. First, the fault location list generator 105 gets an abnormal test pattern sequence stored in the abnormal pattern sequence memory unit 103 in step 1701. Next, in step 1702, the fault location list generator 105 generates a fault location list by performing a fault simulation for the abnormal test pattern sequence obtained in step 1701. In step 1703, the fault location list generated by the fault location list generator 105 is transmitted to and stored in the fault location list memory unit 1601. Next, it is determined whether or not there is an unprocessed abnormal test pattern sequence which exists in the abnormal pattern sequence memory unit 103. If there is an abnormal test pattern sequence which is not processed, the steps 1701, 1702 and 1703 are repeated, and if there is no abnormal test pattern sequence which is not processed, the method proceeds to step 1705. Finally, in step 1705, the common fault locations presuming unit 1602 presumes the fault locations which are included in all of the fault location lists stored in the fault location list memory unit 1601 in common, and the process is finished. For the presuming fault locations, step 1407 and 1408 of FIG. 33 or step 1506 and 1507 of FIG. 34 may be used.

Figure 37:
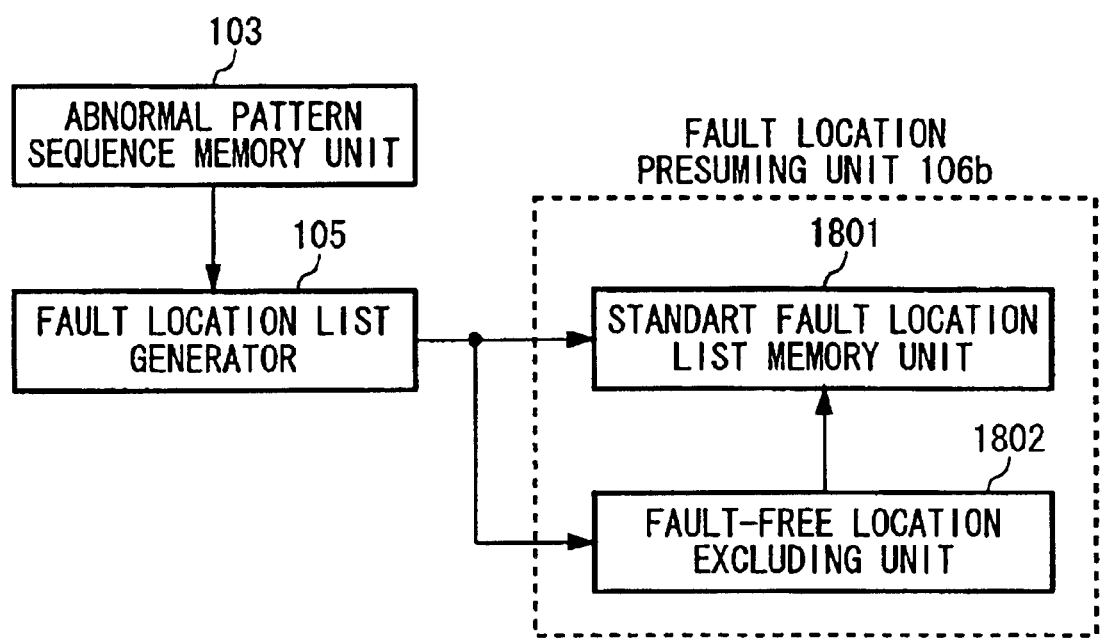
FIG. 37 is a block diagram showing another example constitution of the fault location presuming unit 106 of FIG. 20.

FIG. 37 shows another example constitution of the fault location presuming unit 106 according to the embodiment of the present invention. This fault location presuming unit 106b comprises a standard fault location list memory unit 1801 for storing a fault location lists generated by the fault location list generator 105 for the abnormal test pattern sequence, where the abnormality of the transient power supply current is detected first, stored in the abnormal pattern sequence memory unit 103 and a fault-free location excluding unit 1802 for storing fault location lists generated by the fault location list generator 105 for the rest of the abnormal test pattern sequence stored in the abnormal pattern sequence memory unit 103 except the test pattern sequence used to generate the standard fault location list and excluding, from the standard fault location list stored in the standard fault location list memory unit 1801, the fault locations except the points which are included in said fault location lists (fault-free locations). The standard fault location list memory unit 1801 may be a physical recording medium like a hard disk or a memory, or a virtual memory established on the memory. The fault-free location excluding unit 1802 may be formed as hardware or software. In the example of FIG. 37, the normal pattern sequence memory unit 104 may be omitted.

Figure 38:
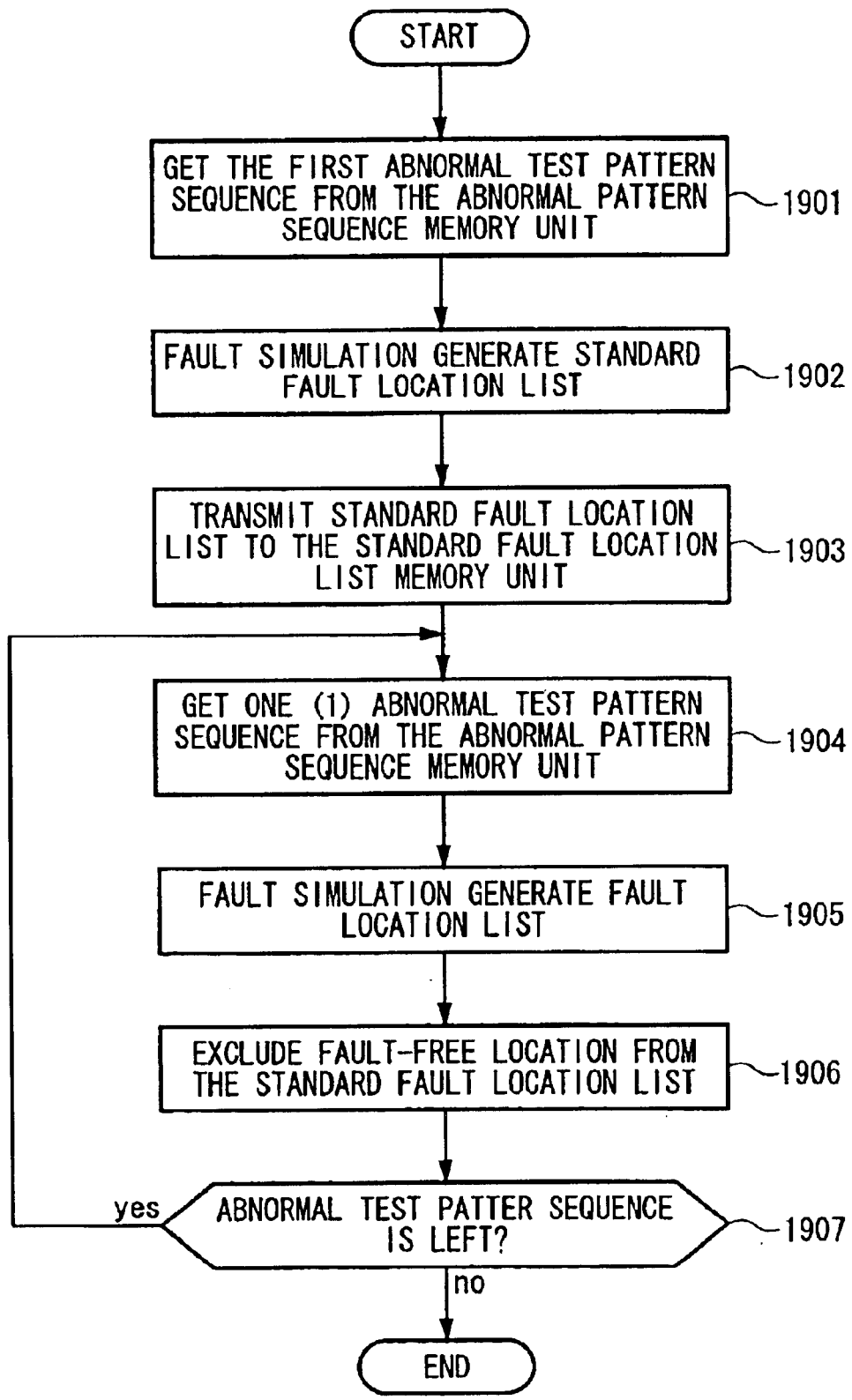
FIG. 38 is a flowchart illustrating another example of process sequence of a method for presuming a fault location which can be used as the fault analysis method of the present invention.

Next, the operation of presuming a fault location using the fault location presuming unit 106b is described in detail. FIG. 38 illustrates the procedure of a fault location presuming method of the present invention. First, the fault location list generator 105 gets an abnormal test pattern sequence, where the transient power supply current shows abnormality first, stored in the abnormal pattern sequence memory unit 103 in step 1901. Next, instep 1902, the fault location list generator 105 generates a standard fault location list by performing a fault simulation for the abnormal test pattern sequence obtained in step 1901. In step 1903, the standard fault location list generated by the fault location list generator 105 is transmitted to and stored in the standard fault location list memory unit 1801. Then, in step 1904, the fault location list generator 105 gets another abnormal test pattern sequence from the rest of the abnormal test pattern sequence in the abnormal test pattern sequence memory unit 103.

Next, in step 1905, the fault location list generator 105 generates another standard fault location list by performing a fault simulation for the abnormal test pattern sequence obtained in step 1904. In step 1906, the fault-free location excluding unit 1802 excludes, from the standard fault location list, the fault locations except the points which are included in said fault location lists generated in step 1905 (fault-free locations) based on the fault location lists generated by the fault location lists generator 105. Finally, it is determined whether or not there is an unprocessed abnormal test pattern sequence which exists in the abnormal pattern sequence memory unit 103. If there is an abnormal test pattern sequence which is not processed, the steps 1904, 1905 and 1906 are repeated, and if there is no abnormal test pattern sequence which is not processed, the process is finished. For the presuming fault locations, step 1407 and 1408 of FIG. 33 or step 1506 and 1507 of FIG. 34 may be used. However, if there is no abnormal test pattern sequence to get in step 1904, the method for presuming fault locations is finished immediately.

Figure 39:
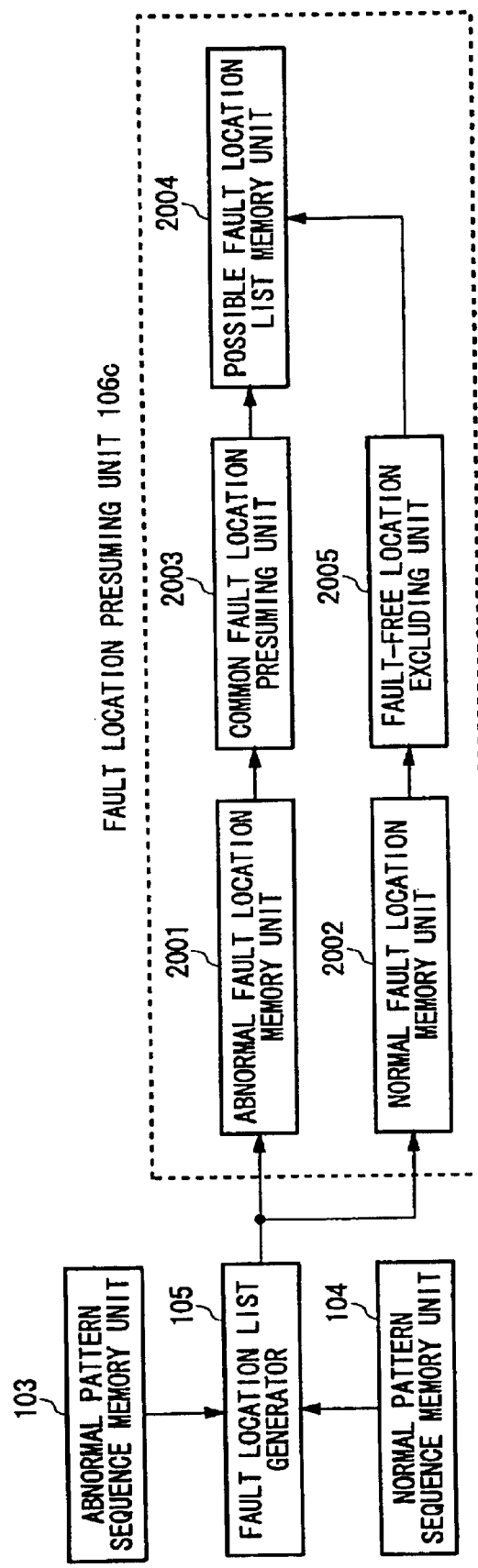
FIG. 39 is a block diagram showing more another example constitution of the fault location presuming unit 106 of FIG. 20.

FIG. 39 shows another example constitution of the fault location presuming unit 106 according to the embodiment of the present invention. This fault location presuming unit 106c comprises an abnormal fault location list memory unit 2001 for storing a plurality of fault location lists generated by the fault location lists generator 105 for a plurality of test pattern sequence, where the transient power supply current is abnormal, stored in the abnormal pattern sequence memory unit 103, a normal fault location list memory unit 2002 for storing a plurality of fault location lists generated by the fault location lists generator 105 for a plurality of test pattern sequence, where the transient power supply current is normal, stored in the normal pattern sequence memory unit 104, a common fault location presuming unit 2003 for presuming the possible fault locations by extracting the fault locations which are included in all of the fault location list stored in said abnormal fault location list memory device 2001 in common, a possible fault location list memory unit 2004 for storing the possible fault location list generated by the common fault location presuming unit 2003, and a fault-free locations excluding unit 2005 for excluding the fault location which is included in the plurality of fault location lists stored in the normal fault location list memory unit 2002 from the possible fault location list one by one. The abnormal fault location list memory unit 2001, normal fault location list memory unit 2002 and the possible fault location list memory unit 2004 may be formed of physical recording media like hard disks or memories, or virtual memories established on the memory. The common fault location presuming unit 2003 and the fault-free location excluding unit 2005 may be formed as hardware or software.

Figure 40:
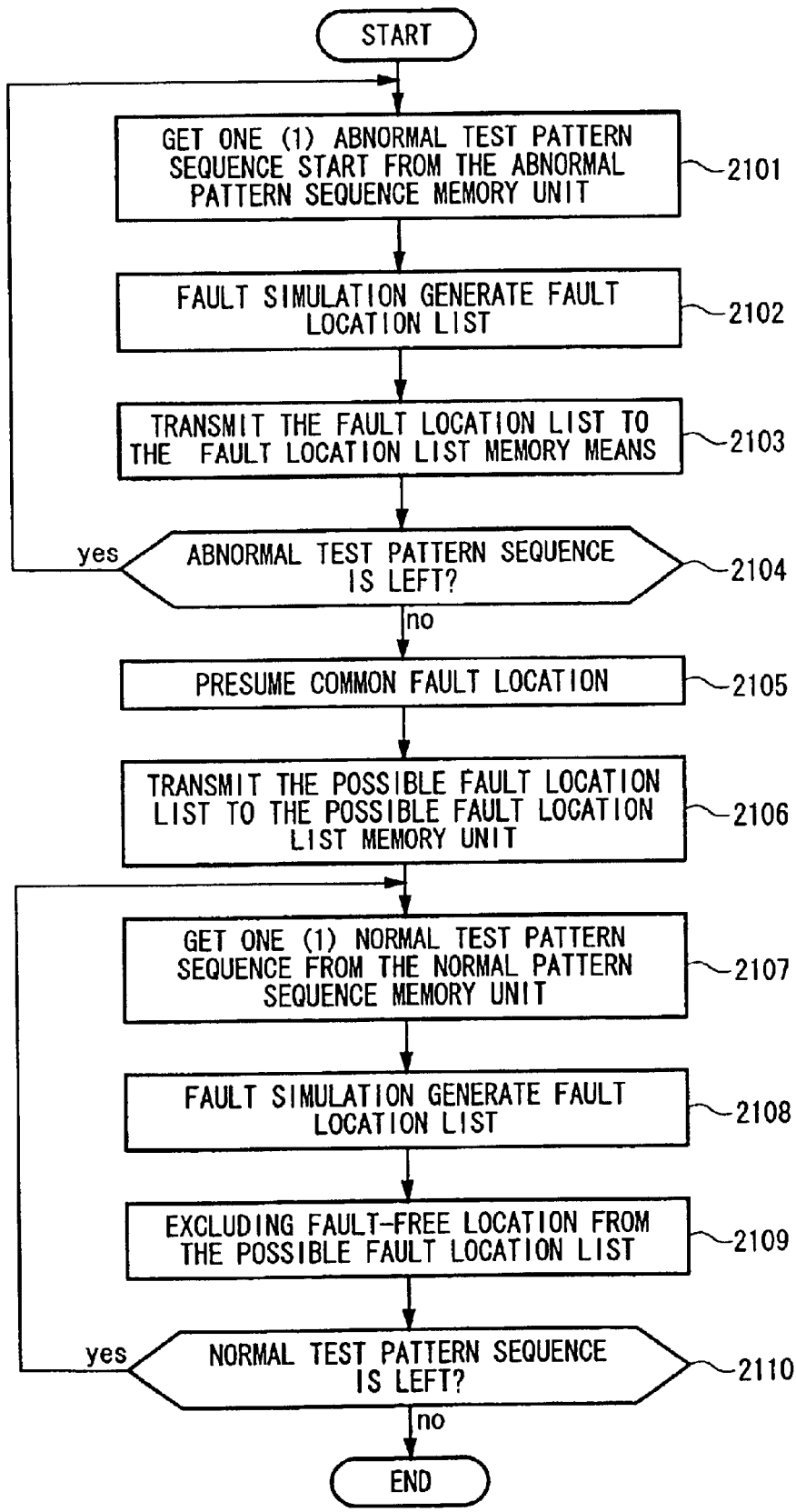
FIG. 40 is a flowchart illustrating yet another example process sequence of method for presuming fault location which can be used as the fault analysis method of the present invention.

Next, the operation of presuming a fault location using the fault location presuming unit 106c is described in detail. FIG. 40 illustrates the procedure of the fault location presuming method of the present invention. First, the fault location list generator 105 gets an abnormal test pattern sequence stored in the abnormal pattern sequence memory unit 103 in step 1901. Next, in step 2102, the fault location list generator 105 generates a fault location list by performing a fault simulation for the abnormal test pattern sequence obtained in step 2101. In step 2103, the fault location list generated by the fault location list generator 105 is transmitted to and stored in the abnormal fault location list memory unit 2001. Then, in step 2104, it is determined whether there is an abnormal test pattern sequence which is not processed for the abnormal pattern sequence memory unit 103. If there is an abnormal test pattern sequence which is not processed, the steps 2101, 2102 and 2103 are repeated, and if there is no abnormal test pattern sequence which is not processed, the process proceeds to step 2105. Next, in step 2105, the common fault location presuming unit 2003 presumes the possible fault locations by extracting the fault locations which are included in all of the fault location list stored in said abnormal fault location list memory device 2001 in common and generates a possible fault location list. Then, the common fault location presuming unit 2003 transmits and stores possible fault location list to the possible fault location list memory unit 2004.

Next, in step 2107, the fault location list generator 105 gets a normal test pattern sequence from the normal test pattern sequence memory unit 104. Then, the fault location list generator 105 generates a fault location list by performing a fault simulation for the normal test pattern sequence obtained in step 2107. In step 2109, the fault-free locations excluding unit 2005 excludes the fault location which is included in the fault location lists generated by the fault location list generator 105 in step 2108 (fault-free location) from the possible fault location list. Last, in step 2110, it is determined whether there is a normal test pattern sequence which is not processed. If there is a normal test pattern sequence which is not processed, the steps 2107, 2108 and 2109 are repeated, and if there is no normal test pattern sequence which is not processed, the process is finished. For the presuming fault locations, steps 1407 and 1408 of FIG. 32 or steps 1506 and 1507 of FIG. 34 may be used. However, if there is no abnormal test pattern sequence instep 2101, or if there is no normal test pattern sequence in step 2107, the method for presuming fault location is finished immediately.

In the above description, a fault location list is obtained upon request by a fault simulation, however, it is possible to obtain a fault location list by referring to the reference table storing the test pattern sequence and corresponding fault location list while the fault simulations are conducted for various test pattern sequence in advance.

According to the method and apparatus for fault analysis of the present invention, a fault location may be presumed in terms of logic gate by appointing a fault location in terms of logic gate for the fault simulation. Moreover, a fault location may be presumed in terms of signal line by appointing a fault location in terms of signal line for the fault simulation. Or, a fault location may be presumed in terms of a signal transmission path by appointing a fault location in terms of a signal transmission path for the fault simulation. In addition, the method and apparatus for fault analysis of the present embodiment presumes the fault such as a logic fault (stuck-at fault), short defect or defect of parameter delinquency of MOS transistors as well as the delay fault or open defect.

As described above, the reliability of the fault analysis is improved largely because a delay fault or a open defect accompanying a delay fault can be presumed using a method of testing the transient power supply current which is easily observed and having switching information of logic gates.

As apparent from the above description, the reliability of the fault analysis is improved largely according to the present invention.

The preferred embodiments of the present invention have been described, however the scope of the present invention is not limited to the above embodiments. Various modifications can be added to the embodiments to carry out the invention described in the claims. It is apparent that such modifications belong to the technical scope of the invention related to the present application from the description of the claims.

What is claimed is:

1. A fault analysis method for presuming a fault location of a semiconductor IC comprising:

applying a power supply voltage to said semiconductor IC;

supplying a test pattern sequence having a plurality of test patterns to said semiconductor IC;

storing an analysis point included in said IC, the electric potential of which changes in accordance with change of said supplied test pattern, to be corresponding to said test pattern sequence;

measuring a transient power supply current generated on said semiconductor IC in accordance with the change of said test pattern and determining whether said transient current shows abnormality or not; and presuming a fault location out of said analysis points based on said test pattern sequence, where the transient power supply current shows abnormality, and said analysis point stored to be corresponding to said test pattern sequence, wherein said transient power supply current is determined to be abnormal when instant value of said transient power supply current at a predetermined time point is over a predetermined value in said step of determining.

2. A fault analysis apparatus for presuming a fault location of a semiconductor IC comprising:

a means for applying a power supply voltage to said semiconductor IC;

a means for supplying a test pattern sequence having a plurality of test patterns to said semiconductor IC;

a means for storing an analysis point included in said IC, the electric potential of which changes in accordance with change of said supplied test pattern, to be corresponding to said test pattern sequence;

a transient power supply current tester for measuring a transient power supply current generated on said semiconductor IC in accordance with the change of said test pattern and determining whether said transient current shows abnormality or not; and a fault location presuming unit for presuming a fault location out of said analysis point based on said test pattern sequence, where the transient power supply current shows abnormality, and said analysis point stored to be corresponding to said test pattern sequence, wherein said transient power supply current tester determines that said transient power supply current is abnormal when instant value of said transient power supply current at a predetermined time point is over a predetermined value.

3. A fault analysis apparatus for presuming a fault location of semiconductor IC comprising:

a means for applying a power supply voltage to said semiconductor IC;

a means for supplying a test pattern sequence comprising a plurality of test patterns to said semiconductor IC;

a means for storing an analysis point included in said IC, the electric potential of which changes in accordance with change of said supplied test pattern, to be corresponding to said test pattern sequence;

a means for measuring a transient power supply current generated on said semiconductor IC in accordance with the change of said test pattern;

a means for determining that said transient current is abnormal in case instant value of said transient power supply current at a predetermined time point is over a predetermined value; and a means for presuming a fault location out of said analysis point based on said test pattern sequence, where the transient power supply current shows abnormality, and said analysis point stored to be corresponding to said test pattern sequence.

* * * * *